US011901316B2

(12) United States Patent
Chikamatsu et al.

(10) Patent No.: US 11,901,316 B2
(45) Date of Patent: Feb. 13, 2024

(54) SEMICONDUCTOR DEVICE

(71) Applicant: ROHM CO., LTD., Kyoto (JP)

(72) Inventors: Kentaro Chikamatsu, Kyoto (JP); Koshun Saito, Kyoto (JP); Kenichi Yoshimochi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/725,111

(22) Filed: Apr. 20, 2022

(65) Prior Publication Data

US 2022/0246551 A1    Aug. 4, 2022

Related U.S. Application Data

(63) Continuation of application No. 16/780,514, filed on Feb. 3, 2020, now Pat. No. 11,342,290, which is a continuation of application No. 15/801,999, filed on Nov. 2, 2017, now Pat. No. 10,600,744.

(Continued)

(30) Foreign Application Priority Data

Nov. 15, 2016 (JP) ................. 2016-222555

(51) Int. Cl.
*H01L 23/64* (2006.01)
*H01L 23/495* (2006.01)
(Continued)

(52) U.S. Cl.
CPC ........ *H01L 23/645* (2013.01); *H01L 21/4825* (2013.01); *H01L 21/4842* (2013.01);
(Continued)

(58) Field of Classification Search
None
See application file for complete search history.

(56) References Cited

U.S. PATENT DOCUMENTS 7,683,464 B2    3/2010 Sun et al.
9,190,393 B1 *  11/2015 Lin ..................... H01L 29/7786
(Continued)

FOREIGN PATENT DOCUMENTS

JP    2008533722    8/2008
JP    2012178416    9/2012
WO   2007081806    7/2007

OTHER PUBLICATIONS

Extended European Search Report issued for European Patent Application No. 17201426.8, dated Mar. 23, 2018, 8 pages.
(Continued)

*Primary Examiner* — Nishath Yasmeen
(74) *Attorney, Agent, or Firm* — Hamre, Schumann, Mueller & Larson, P.C.

(57) ABSTRACT

A semiconductor device includes a lead frame, a transistor, and an encapsulation resin. The lead frame includes a drain frame, a source frame, and a gate frame. The drain frame includes drain frame fingers. The source frame includes source frame fingers. The drain frame fingers and the source frame fingers are alternately arranged in a first direction and include overlapping portions as viewed from a first direction. In a region where each drain frame finger overlaps the source frame fingers as viewed in the first direction, at least either one of the drain frame fingers and the source frame fingers are not exposed from the back surface of the encapsulation resin.

12 Claims, 29 Drawing Sheets

(51) Int. Cl.
*H01L 23/31* (2006.01)
*H01L 21/48* (2006.01)
*H01L 21/56* (2006.01)
*H02M 3/155* (2006.01)
*H01L 29/20* (2006.01)
*H01L 29/778* (2006.01)

(52) U.S. Cl.
CPC ........ *H01L 21/565* (2013.01); *H01L 23/3114* (2013.01); *H01L 23/4951* (2013.01); *H01L 23/49562* (2013.01); *H01L 23/49568* (2013.01); *H01L 23/3107* (2013.01); *H01L 29/2003* (2013.01); *H01L 29/7787* (2013.01); *H02M 3/155* (2013.01)

(56) References Cited

U.S. PATENT DOCUMENTS

| | | |
|---|---|---|
| 2006/0202320 A1 | 9/2006 | Schaffer |
| 2007/0138606 A1 | 6/2007 | Brailey |
| 2007/0181934 A1 | 8/2007 | Hu et al. |
| 2008/0048218 A1 | 2/2008 | Jiang |
| 2012/0126406 A1* | 5/2012 | Dix .................... H01L 23/4824 257/E23.033 |
| 2013/0299878 A1* | 11/2013 | Briere .................. H01L 29/778 257/288 |
| 2014/0264796 A1 | 9/2014 | Dix et al. |
| 2015/0084135 A1 | 3/2015 | Miura et al. |
| 2016/0043189 A1 | 2/2016 | St. Germain et al. |
| 2016/0086881 A1* | 3/2016 | Standing ............... H01L 23/367 438/618 |
| 2016/0240471 A1 | 8/2016 | Klowak et al. |
| 2016/0247748 A1 | 8/2016 | Kinzer |
| 2016/0268190 A1 | 9/2016 | McKnight-MacNeil et al. |
| 2016/0276250 A1* | 9/2016 | St. Germain ....... H01L 29/2003 |
| 2016/0307826 A1* | 10/2016 | McKnight-MacNeil .................... H01L 24/17 |

OTHER PUBLICATIONS

Office Action issued for Japanese Patent Application No. 2016-222555, Dispatch Date: Oct. 6, 2020, 6 pages Including English translation.

* cited by examiner

SEMICONDUCTOR DEVICE

BACKGROUND ART

The present invention relates to a semiconductor device.

A semiconductor device includes a transistor, a die pad on which transistor is arranged, a lead frame, a bonding wire that connects each electrode of a transistor to a lead frame, and an encapsulation resin that encapsulates the transistor and the bonding wire (refer to, for example, Japanese Laid-Open Patent Publication No. 2012-178416).

The bonding wire connecting each electrode of the transistor to the lead frame may increase the inductance.

SUMMARY OF THE INVENTION

It is an object of the present invention to limit increases in the inductance.

To achieve the above object, a semiconductor device includes a lead frame, a transistor, and an encapsulation resin. The transistor includes a plurality of drain electrode pads, a plurality of source electrode pads, and a gate electrode pad on one surface. Each of the electrode pads faces a front surface of the lead frame and is connected to the lead frame. The encapsulation resin is rectangular and encapsulates the transistor and the lead frame so that part of the lead frame is exposed from a back surface. The lead frame includes a drain frame electrically connected to the drain electrode pads, a source frame electrically connected to the source electrode pads, and a gate frame electrically connected to the gate electrode pads. The drain frame includes a plurality of drain frame fingers. The drain frame fingers are spaced apart from each other in a first direction, extended in a second direction that is orthogonal to the first direction in a plan view, and connected to the drain electrode pad. The source frame includes a plurality of source frame fingers. The source frame fingers are spaced apart from each other in the first direction, extended in the second direction, and connected to the source electrode pad. The drain frame fingers and the source frame fingers are alternately arranged in the first direction and include a portion that overlaps each other as viewed in the first direction. In a region where the drain frame fingers and the source frame fingers overlap one another as viewed in the first direction, at least either one of the drain frame fingers and the source frame fingers are not exposed from the back surface of the encapsulation resin.

BRIEF DESCRIPTION OF DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

An embodiment of a semiconductor device will be hereinafter described with reference to the drawings. The embodiment described below illustrates a configuration and a method for embodying a technical idea, and is not provided to limit the material, shape, structure, arrangement, dimension, and the like of each configuring component to the following. Various modifications can be made with the embodiments described hereafter within the scope of the claims.

First Embodiment

Semiconductor Device

Figure 1:
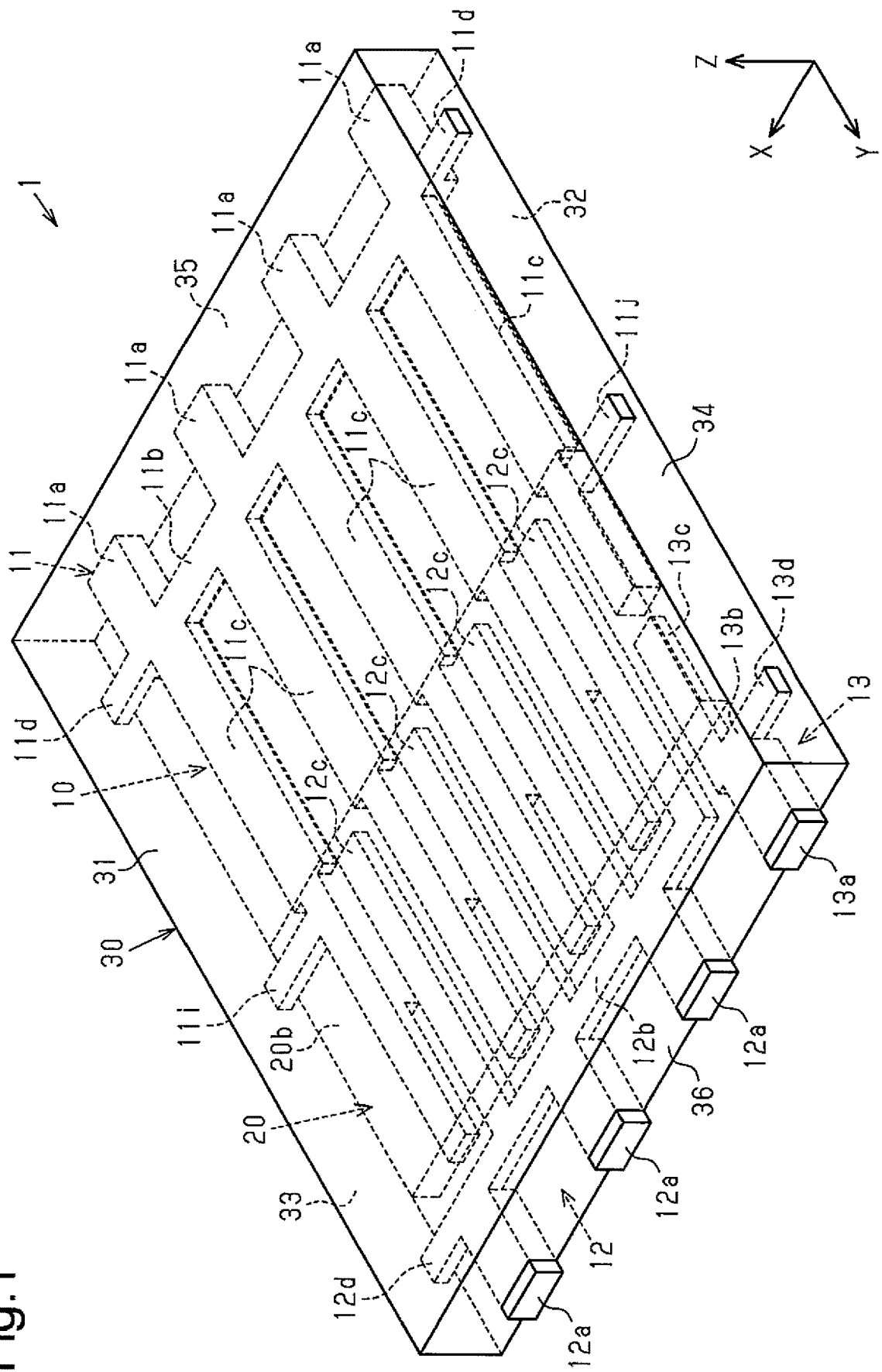
FIG. 1 is a perspective view of a first embodiment of a semiconductor device.

As shown in FIG. 1, a semiconductor device 1 includes a lead frame 10 for electrically connecting to a circuit substrate 300 (not illustrated in FIG. 1, see FIG. 11), a transistor 20 mounted on the lead frame 10, and an encapsulation resin 30 that encapsulates the transistor 20. The transistor 20 is a High Electron Mobility Transistor (HEMT) that uses a nitride semiconductor. The semiconductor device 1 includes a package (encapsulation resin 30) in which a dimension in a first direction X, which becomes a lateral direction of the semiconductor device 1, is about 5 mm, a dimension in a second direction Y, which becomes a longitudinal direction of the semiconductor device 1, is about 6 mm, and a height direction Z of the semiconductor device 1 is about 0.6 mm. The semiconductor device 1 is a surface mounting type, and is a so-called Small Outline Package (SOP) in which the lead frame is taken out from two directions of the encapsulation resin 30.

The usage frequency range of the semiconductor device 1 is greater than or equal to 1 MHz and less than or equal to 100 MHz, and is preferably greater than or equal to 1 MHz and less than or equal to 30 MHz. The semiconductor device 1 of the present embodiment is used at 30 MHz. Furthermore, the semiconductor device 1 can be applied to a circuit in which a range of a drain current is a range of greater than or equal to 1 A and less than or equal to 200 A, and is preferably applied to a circuit in which a range of the drain current is a range of greater than or equal to 10 A and less than or equal to 100 A.

The encapsulation resin 30, for example, is made of an epoxy resin and has the form of a quadrangular plate. The encapsulation resin 30 includes a front surface 31 that becomes a top surface, and a back surface 32 that becomes a bottom surface opposing the front surface 31 in the height direction Z. The back surface 32 becomes a surface mounted on the circuit substrate 300. The encapsulation resin 30 also includes a first lateral side surface 33 that becomes a side surface on one side in the first direction X, a second lateral side surface 34 that becomes a side surface on the other side in the first direction X, a first longitudinal side surface 35 that becomes a side surface on one side in the second direction Y, and a second longitudinal side surface 36 that becomes a side surface on the other side in the second direction Y.

Figure 2:
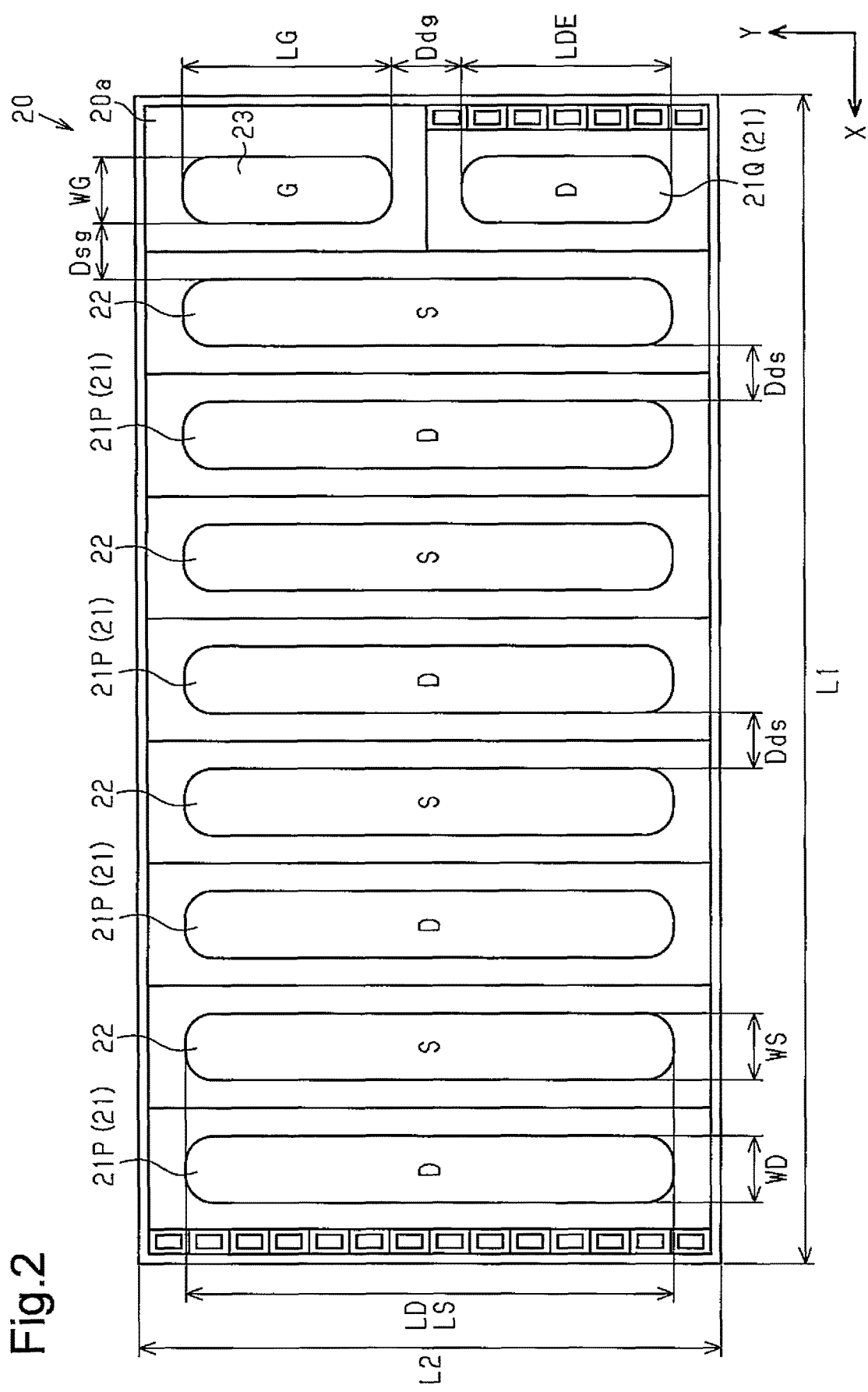
FIG. 2 is a plan view of a transistor in the semiconductor device of FIG. 1.

The transistor 20 has the form of a quadrangular plate. The transistor 20 has a rectangle shape in a plan view. The transistor 20 is mounted on the lead frame 10 so that the first direction X becomes the longitudinal direction. As shown in FIG. 2, one example of an outer shape size of the transistor 20 is a rectangle having a longitudinal to lateral ratio of 2:1 in which a length L1 of one side in the longitudinal direction is about 4200 μm, and a length L2 of another side is about 2100 μm in a plan view. In the following description of the transistor 20, the frame of reference for directions will be a state in which the transistor 20 is mounted on the lead frame 10.

The transistor 20 includes a front surface 20a, which is the surface located at the side of the lead frame 10 (see FIG. 1), and a back surface 20b (see FIG. 1), which is the other surface opposing the front surface 20a. Five drain electrode pads 21, four source electrode pads 22, and one gate electrode pad 23 electrically connected with the lead frame 10 are arranged on the front surface 20a. The drain electrode pads 21 include four drain electrode pads 21P in which a length LD in the longitudinal direction is long, and one drain electrode pad 21Q in which a length LDE in the longitudinal direction is short. There may be any number of the drain electrode pads 21, source electrode pads 22, and gate electrode pads 23. Thus, for example, the number of drain electrode pads 21 may differ from the number of source electrode pads 22. The transistor 20 may include a plurality of gate electrode pads 23. In the following description, when referring to all of the five drain electrode pads, they will be referred to as the drain electrode pads 21.

As shown in FIG. 2, the drain electrode pads 21 and the source electrode pads 22 are alternately arranged in the longitudinal direction (first direction X) of the transistor 20 in a plan view. The drain electrode pads 21 and the source electrode pads 22 are each formed to be substantially rectangular elongated in a longitudinal direction that is the direction (second direction Y) orthogonal to the longitudinal direction of the transistor 20. The drain electrode pads 21 and the source electrode pads 22 are parallel to one another. A drain electrode pad 21 is arranged at each of the two ends of the transistor 20 in the first direction X.

The gate electrode 23 is arranged at one end of the transistor 20 in the first direction X. The gate electrode 23 faces the drain electrode pad 21Q arranged at one end of the transistor 20 in the first direction X spaced apart by a gap in the second direction Y. The gate electrode pad 23 is arranged closer to one end of the transistor 20 in the second direction Y, and the drain electrode pad 21Q is arranged closer to the other end of the transistor 20 in the second direction Y.

The length LD of the four drain electrode pads 21P and the length LS of the four source electrode pads 22 are equal to each other. The length LDE of the drain electrode pad 21Q is less than or equal to one-half of the length LD. The length LG of the gate electrode pad 23 is equal to the length LDE. A width WD of the drain electrode pads 21, a width WS of the source electrode pads 22, and a width WG of the gate electrode pad 23 are equal to one another. The drain electrode pads 21, the source electrode pads 22, and the gate electrode pads 23 each have two ends in the second direction Y that are arcuate and bulged outward in the second direction Y.

The drain electrode pads 21 are arranged at equal intervals in the first direction X, and the source electrode pads 22 are arranged at equal intervals in the first direction X. The four drain electrode pads 21P and the four source electrode pads 22 are arranged at corresponding positions in the second direction Y. The distance Dds from each drain electrode pad 21 to the adjacent source electrode pad 22 in the first direction X is the same. The distance Dsg from the gate electrode pad 23 to the adjacent source electrode pad 22 in the first direction X is equal to the distance Dds.

The dimensions of the transistor 20 of FIG. 2 are as follows.

The length LD of each of the four drain electrode pads 21P and the length LS of each the four source electrode pads 22 are about 1760 μm, and the length LDE of the drain electrode pad 21Q is about 755 μm. The length LG of the gate electrode pad 23 is about 755 μm. The width WD of each of the drain electrode pads 21, the width WS of each of the source electrode pads 22, and the width WG of the gate electrode pad 23 is about 240 μm.

The distance Ddg between the gate electrode pad 23 and the drain electrode pad 21Q in the second direction Y is about 250 μm. The distance Dds between each drain electrode pad 21 and the adjacent source electrode pad 22 in the first direction X is about 200 μm. The distance Dsg between the gate electrode pad 23 and the adjacent source electrode pad 22 in the first direction X is about 200 μm.

Figure 3:
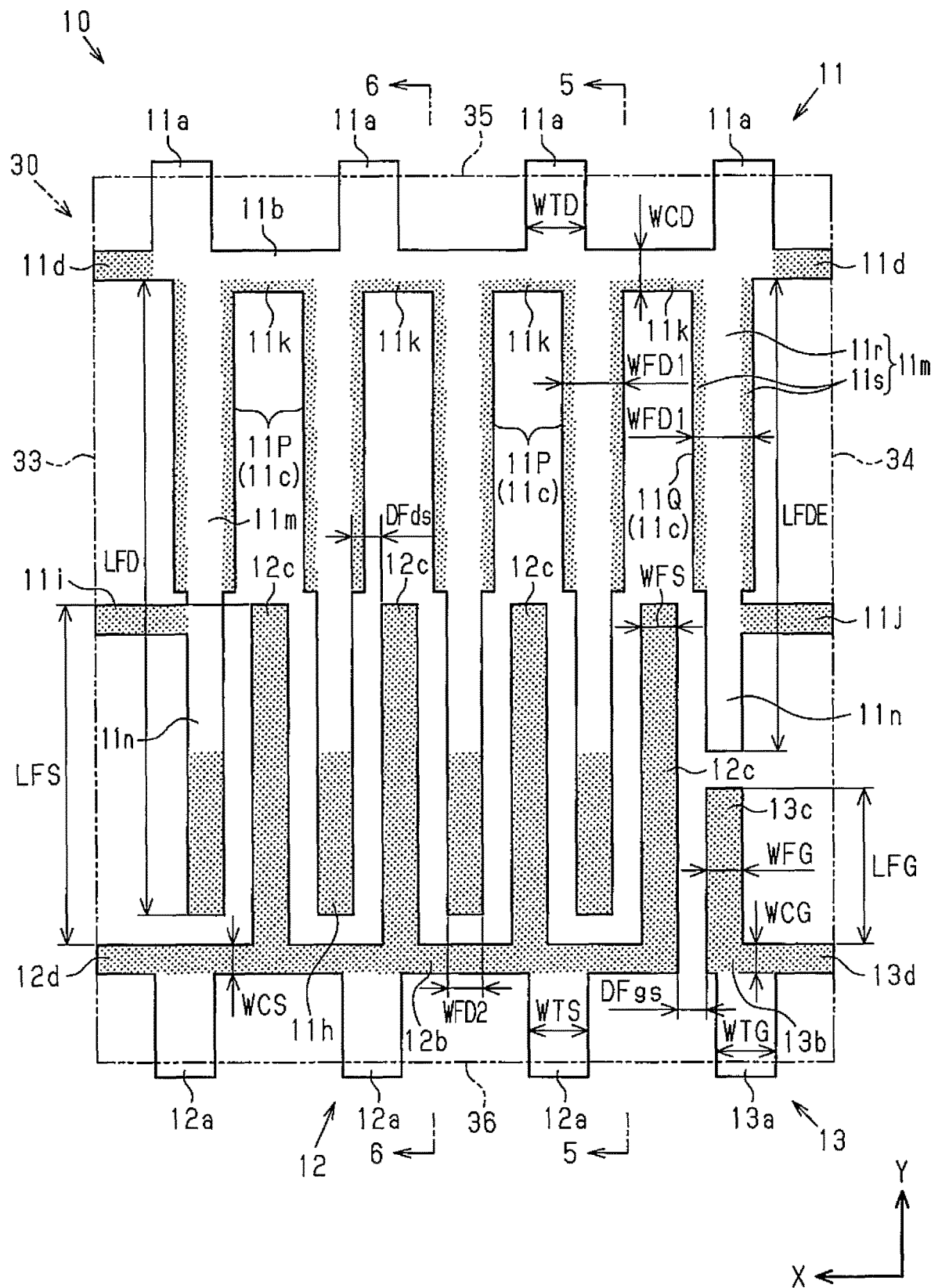
FIG. 3 is a plan view of a lead frame in the semiconductor device of FIG. 1.

As shown in FIG. 3, the lead frame 10 includes a drain frame 11 electrically connected to the drain electrode pads 21 (see FIG. 2), a source frame 12 electrically connected to the source electrode pad 22 (see FIG. 2), and a gate frame 13 electrically connected to the gate electrode pad 23 (see FIG. 2). The drain frame 11, the source frame 12, and the gate frame 13 are each formed by, for example, etching a copper plate. The drain frame 11, the source frame 12, and the gate frame 13 are electrically insulated from each other by gaps extending in between.

The drain frame 11 is arranged closer to the first longitudinal side surface 35 of the encapsulation resin 30 (shown by double-dashed line of FIG. 3) in a plan view. The drain frame 11 includes four drain terminals 11a, a drain coupling portion 11b that couples the drain terminals 11a, and five drain frame fingers 11c extending from the drain coupling portion 11b toward the second longitudinal side surface 36 in the second direction Y. The drain frame fingers 11c extended in the second direction Y. Thus, the drain frame 11 is comb-shaped. The four drain terminals 11a, the drain coupling portion 11b, and the five drain frame fingers 11c are, for example, formed from the same member. There may be any number of the drain terminals 11a and any number of the drain frame fingers 11c. For example, the number of drain terminals 11a may be the same as or differ from the number of drain frame fingers 11c. Furthermore, the number of drain frame fingers 11c is preferably set according to the number of drain electrode pads 21 of the transistor 20 of FIG. 2.

The drain terminals 11a are each rectangular and elongated in a longitudinal direction that is the second direction Y in a plan view. The drain terminals 11a are arranged at equal intervals in the first direction X. The drain terminals 11a are arranged at positions adjacent to the first longitudinal side surface 35 of the encapsulation resin 30. One end of each drain terminal 11a projects out of the encapsulation resin 30 from the first longitudinal side surface 35 in the second direction Y. The other end of the drain terminal 11a is coupled to the drain coupling portion 11b in the second direction Y.

The drain coupling portion 11b couples the four drain terminals 11a and the five drain frame fingers 11c. The drain coupling portion 11b extends in the first direction X. The width WCD of the drain coupling portion 11b (dimension of the drain coupling portion 11b in the second direction Y) is smaller than the width WTD of the drain terminal 11a (dimension of the drain terminal 11a in the first direction X). First tie bar portion 11d that couple a steel plate (not illustrated) and the drain frame 11 when forming the drain frame 11 from the steel plate, which serves as a base material, are integrated with the drain coupling portion 11b at the two ends of the drain coupling portion 11b in the first direction X. The first tie bar portions 11d extended in the first direction X from both ends of the drain coupling portion 11b. One first tie bar portion 11d extends from the drain coupling portion 11b to the first lateral side surface 33. The other first tie bar portion 11d extends from the drain coupling portion 11b to the second lateral side surface 34.

The drain frame fingers 11c and the drain terminals 11a are arranged at opposite sides of the drain coupling portion 11b. The drain frame fingers 11c include four drain frame fingers 11P in which the length LFD in the second direction Y is long, and one drain frame finger 11Q in which the length LFDE in the second direction Y is short. In the following description, when referring to all of the five drain frame fingers, they will be referred to as the drain frame fingers 11c.

The drain frame fingers 11c are arranged at equal intervals in the first direction X. The distance between adjacent drain frame fingers 11c in the first direction X is shorter than the distance between the adjacent drain terminals 11a in the first direction X. In the first direction X, the center of each of the drain frame fingers 11c at the two ends is located inward from the center of each of the drain terminals 11a at the two ends. As viewed in the second direction Y, the drain frame fingers 11c located at the two ends in the first direction X are partially overlapped with the drain terminals 11a located at the two ends in the first direction X. The middle one of the drain frame fingers 11c in the first direction X is located at the middle of the encapsulation resin 30 in the first direction X.

Each drain frame finger 11c includes two regions having different widths. The drain frame finger 11c includes a first section 11m and a second section 11n. The first section 11m has a larger width and is located closer to the drain coupling portion 11b. Further, the first section 11m extends from the drain coupling portion 11b to a position located slightly closer to the drain coupling portion 11b from the middle of the encapsulation resin 30 in the second direction Y. The second section 11n has a smaller width. The second section 11n and the drain coupling portion 11b are located at opposite sides of the first section 11m. The width WFD1 of the first section 11m is equal in each drain frame finger 11c. A width WFD2 of the second section 11n of each drain frame finger 11c is equal to each other. The width WFD1 of the first section 11m is greater than the width WCD of the drain coupling portion 11b. The width WFD2 of the second section 11n is smaller than the width WCD of the drain coupling portion 11b. The length of the first section 11m in the second direction Y is equal in each drain frame finger 11c. The first section 11m may have any width WFD1, and the drain coupling portion 11b may have any width WCD. For example, the width WFD1 of the first section 11m may be equal to the width WCD of the drain coupling portion 11b. Furthermore, the width WCD of the drain coupling portion 11b may be equal to the width WFD2 of the second section 11n.

As shown in FIG. 3, a distal portion 11h of each drain frame finger 11P is proximate to a source coupling portion 12b, which will be described later, of the source frame 12 in the second direction Y. Each drain frame finger 11P faces the source coupling portion 12b in the second direction Y.

The drain frame finger 11P located closest to the first lateral side surface 33 and the drain frame finger 11Q include second tie bar portions 11i and 11j, respectively. The second tie bar portion 11i provided on the drain frame finger 11P extends in the second direction Y from the middle of the encapsulation resin 30 in the second direction Y toward the first lateral side surface 33. The second tie bar portion 11i is exposed from the first lateral side surface 33. The second tie bar portion 11j of the drain frame finger 11Q extends in the second direction Y from the middle of the encapsulation resin 30 in the second direction Y toward the second lateral side surface 34. The second tie bar portion 11j is exposed from the second lateral side surface 34.

The source frame 12 is arranged closer to the second longitudinal side surface 36 of the encapsulation resin 30 in a plan view. The source frame 12 is also arranged closer to the first lateral side surface 33 of the encapsulation resin 30 in a plan view. The source frame 12 includes three source terminals 12a, the source coupling portion 12b that couples the source terminals 12a, and four source frame fingers 12c extending from the source coupling portion 12b toward the first longitudinal side surface 35 in the second direction Y. The source frame fingers 12c extend in the second direction Y. Thus, the source frame 12 is comb-shaped. The plurality of source terminals 12a, the source coupling portion 12b, and the plurality of source frame fingers 12c are, for example, formed from the same member. There may be any number of source terminals 12a and any number of source frame fingers 12c. For example, the number of source terminals 12a may be the same as or differ from the number of source frame fingers 12c. Furthermore, the number of source frame fingers 12c is preferably set according to the number of source electrode pads 22 of the transistor 20 of FIG. 2.

The source terminal 12a is rectangular and elongated in a longitudinal direction that is the second direction Y in a plan view. The source terminals 12a are arranged at equal intervals in the first direction X. The source terminals 12a are arranged at positions adjacent to the second longitudinal side surface 36 of the encapsulation resin 30. One end of each source terminal 12a projects out of the encapsulation resin 30 from the second longitudinal side surface 36 in the second direction Y. The other end of the source terminal 12a is coupled to the source coupling portion 12b in the second direction Y. The positions of the source terminals 12a in the first direction X corresponds to the positions of the drain terminal 11a in the first direction X. The width WTS of the source terminals 12a (dimension of the source terminals 12a in the first direction X) is equal to the width WTD of the drain terminals 11a.

The source coupling portion 12b couples the three source terminals 12a and the four source frame fingers 12c. The source coupling portion 12b extends in the first direction X. The width WCS of the source coupling portion 12b (dimension of the source coupling portion 12b in the second direction Y) is smaller than the width WTS of the source terminals 12a and the width WCD of the drain coupling portion 11b. Further, the width WCS is equal to the width WFD2 of the second section 11n of each drain frame finger 11c. A tie bar portion 12d that couples a steel plate (not illustrated) and the source frame 12 when forming the source frame 12 from a steel plate (not illustrated), which serves as a base material, is arranged on the source coupling portion 12b at the end closer to the first lateral side surface 33. The tie bar portion 12d extends in the first direction X from the end of the source coupling portion 12b to the first lateral side surface 33.

The source frame fingers 12c and the source terminals 12a are arranged at opposite sides of the source coupling portion 12b. The source frame fingers 12c are arranged at equal intervals in the first direction X. The distance between adjacent frame fingers 12c in the first direction X is shorter than the distance between adjacent source terminals 12a in the first direction X. The distance between the adjacent source frame fingers 12c in the first direction X is also equal to the distance between the adjacent drain frame fingers 11c in the first direction X. The length LFS of the source frame finger 12c is shorter than the length LFD of the drain frame fingers 11P and the length LFDE of the drain frame finger 11Q. Each source frame finger 12c is arranged between the drain frame fingers 11c that are adjacent to each other in the first direction X. A distal end of the source frame finger 12c is located closer to the second longitudinal side surface 36 of the encapsulation resin 30 than the first section 11m of each drain frame finger 11c. In other words, as viewed in the first direction X, each source frame finger 12c is overlapped with the second section 11n of each drain frame finger 11c but not with the first section 11m. The source frame fingers 12c are parallel to the drain frame fingers 11c. The distance DFds between each source frame finger 12c and the adjacent drain frame finger 11c is equal. The width WFS of the source frame fingers 12c is equal. The width WFS is equal to the width WCS of the source coupling portion 12b. The width WFS is also equal to the width WFD2 of the second section 11n of each drain frame finger 11c.

The gate frame 13 is arranged closer to the second longitudinal side surface 36 of the encapsulation resin 30 in a plan view. The gate frame 13 is also arranged closer to the second lateral side surface 34 of the encapsulation resin 30 in a plan view. The gate frame 13 includes a gate terminal 13a, a gate coupling portion 13b, and a gate frame finger 13c. The gate frame 13 is adjacent to the source frame 12 in the first direction X.

The gate terminal 13a is rectangular and elongated in shape in a longitudinal direction that is the second direction Y in a plan view. The gate terminal 13a is arranged at a position adjacent to the second longitudinal side surface 36 of the encapsulation resin 30. One end of the gate terminal 13a projects out of the encapsulation resin 30 from the second longitudinal side surface 36 in the second direction Y. The other end of the gate terminal 13a is coupled to the gate coupling portion 13b in the second direction Y. The position of the gate terminal 13a in the first direction X corresponds to the position of the drain terminal 11a located closest to the second lateral side surface 34. The width WTG of the gate terminal 13a (dimension of the gate terminal 13a in the first direction X) is equal to the width WTD of the drain terminals 11a.

The gate coupling portion 13b couples the gate terminal 13a and the gate frame finger 13c. The position of the gate coupling portion 13b in the second direction Y corresponds to the position of the source coupling portion 12b in the second direction Y. The width WCG of the gate coupling portion 13b (dimension of the gate coupling portion 13b in the second direction Y) is smaller than the width WTG of the gate terminal 13a. The width WCG of the gate coupling portion 13b is equal to the width WCS of the source coupling portion 12b. A tie bar portion 13d that couples a steel plate (not illustrated) and the gate frame 13 when forming the gate frame 13 from a steel plate, which serves as a base material, is arranged on the gate coupling portion 13b at the end closer to the second lateral side surface 34. The tie bar portion 13d extends in the first direction X from the end of the gate coupling portion 13b to the second lateral side surface 34.

The gate frame finger 13c and the gate coupling portion 13b are located at opposite sides of the gate terminal 13a. The gate frame finger 13c extends in the second direction Y from the end of the gate coupling portion 13b located closer to the first lateral side surface 33. The length LFG of the gate frame finger 13c is shorter than the length LFS of the source frame finger 12c.

The position of the gate frame finger 13c in the first direction X corresponds to the position of the drain frame finger 11Q in the first direction X. The gate frame finger 13c is parallel to the source frame fingers 12c. The gate frame finger 13c is arranged closer to the second longitudinal side surface 36 than the drain frame finger 11Q. In other words, in the second direction Y, a distal end of the gate frame finger 13c faces the distal end of the drain frame finger 11Q. Thus, the distance DFgs between the gate frame finger 13c and the adjacent source frame finger 12c in the first direction X is equal to the distance DFds. The width WFG of the gate frame finger 13c is equal to the width WCG of the gate coupling portion 13b. The width WFG is also equal to the width WFD2 of the second section 11n of the drain frame finger 11c.

Figure 4:
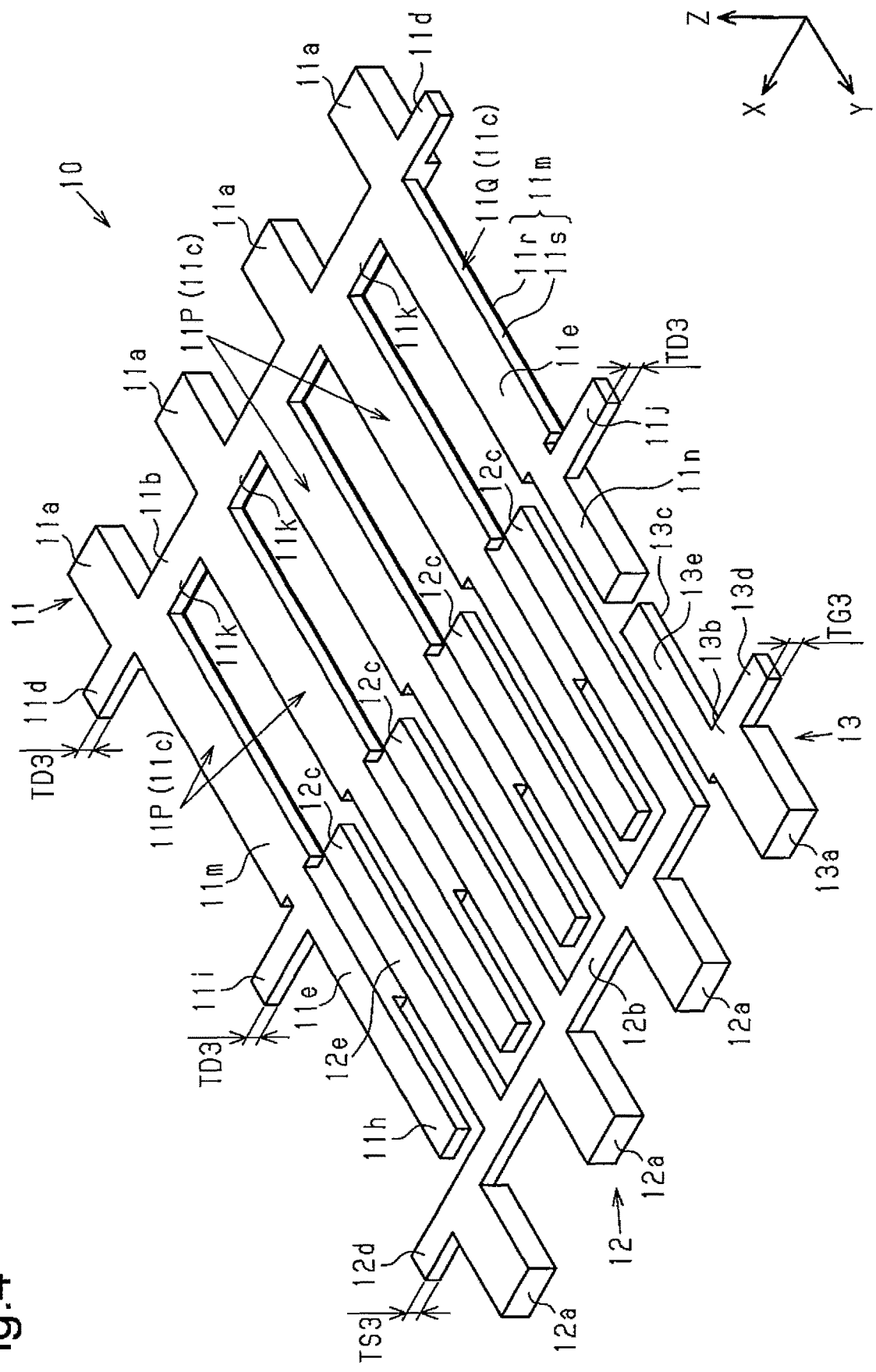
FIG. 4 is a perspective view of the lead frame of FIG. 3.

As can be understood from FIG. 4, the drain frame 11, the source frame 12, and the gate frame 13 each include a thin portion. The shading in FIG. 3 indicates the thin portion in each of the drain frame 11, the source frame 12, and the gate frame 13. The thin portion in each of the drain frame 11, the source frame 12, and the gate frame 13 is formed through, for example, a half-etching process.

Figure 5:
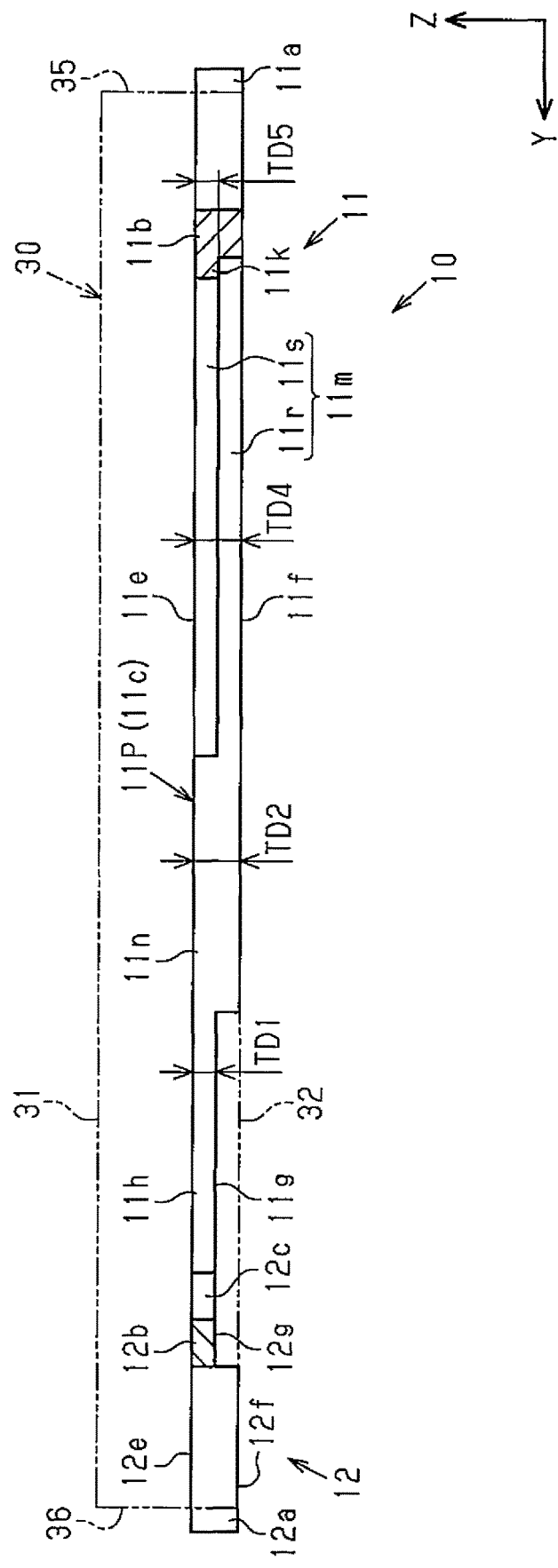
FIG. 5 is a cross-sectional view taken along line 5-5 in FIG. 3

As shown in FIG. 5, the thickness TD1 of the distal portion 11h of each drain frame finger 11P in the drain frame 11 is less than the thickness TD2 of portions other than the distal portion 11h in the second section 11n of each drain frame finger 11P. In the present embodiment, the thickness TD1 is one-half the thickness TD2. The thickness TD2 is the maximum thickness of the drain frame finger 11c. The first section 11m of each drain frame 11 includes a thick base 11r and thin flanges 11s arranged on opposite sides of the base 11r in the first direction X. The width of the base 11r is equal to the width WFD2 of the second section 11n. The thickness TD4 of the base 11r is equal to the thickness TD2, and the thickness TD5 of the flanges 11s is equal to the thickness TD1. The thickness of each drain terminal 11a is equal to the thickness TD2.

The thickness TD5 of an end 11k of the drain coupling portion 11b at the side closer to the second longitudinal side surface 36 of the encapsulation resin 30 and the thickness TD3 (see FIG. 4) of each of the tie bar portions 11d, 11i, and 11j in the drain frame 11 are less than the thickness TD2 and equal to the thickness TD1. Thus, in the drain frame 11, the thicknesses TD1 and TD3 of the distal portion 11h of each drain frame finger 11P and each of the tie bar portions 11d, 11i, and 11j are less than the thickness TD2 of the other portions of the drain frame 11. As shown in FIG. 3, in the present embodiment, the distal portion 11h of each drain frame finger 11P projects further toward the second longitudinal side surface 36 from the drain frame finger 11Q in the second direction Y.

Figure 6:
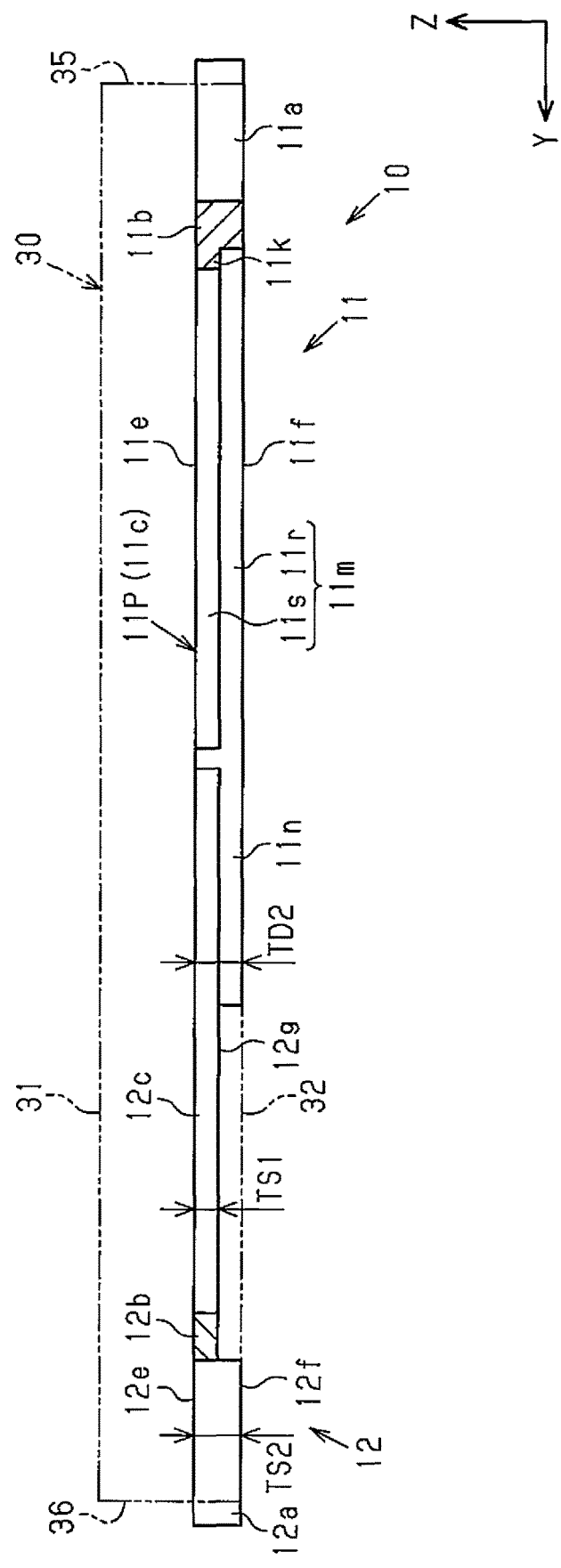
FIG. 6 is a cross-sectional view taken along line 6-6 in FIG. 3.

As shown in FIG. 6, in the source frame 12, each source frame finger 12c entirely has a thickness TS1 that is is less than the thickness TS2 of the source terminals 12a. In the present embodiment, the thickness TS1 is one-half of the thickness TS2. The thickness of the source coupling portion 12b is less than the thickness TS2 and equal to the thickness TS1 of each source frame finger 12c. The thickness TS3 (see FIG. 4) of the tie bar portion 12d is equal to the thickness TS1. Thus, in the source frame 12, the thickness TS1 of each source frame finger 12c and the source coupling portion 12b and the thickness TS3 of the tie bar portion 12d are less than the thickness TS2 of the source terminal 12a. The thickness TS1 of each source frame finger 12c and the source coupling portion 12b and the thickness TS3 of the tie bar portion 12d are equal to the thicknesses TD1 and TD3 (see FIG. 5) of the drain frame 11. The thickness TS2 of the source terminal 12a is equal to the thickness TD2 (see FIG. 5) of the drain frame 11.

Figure 7:
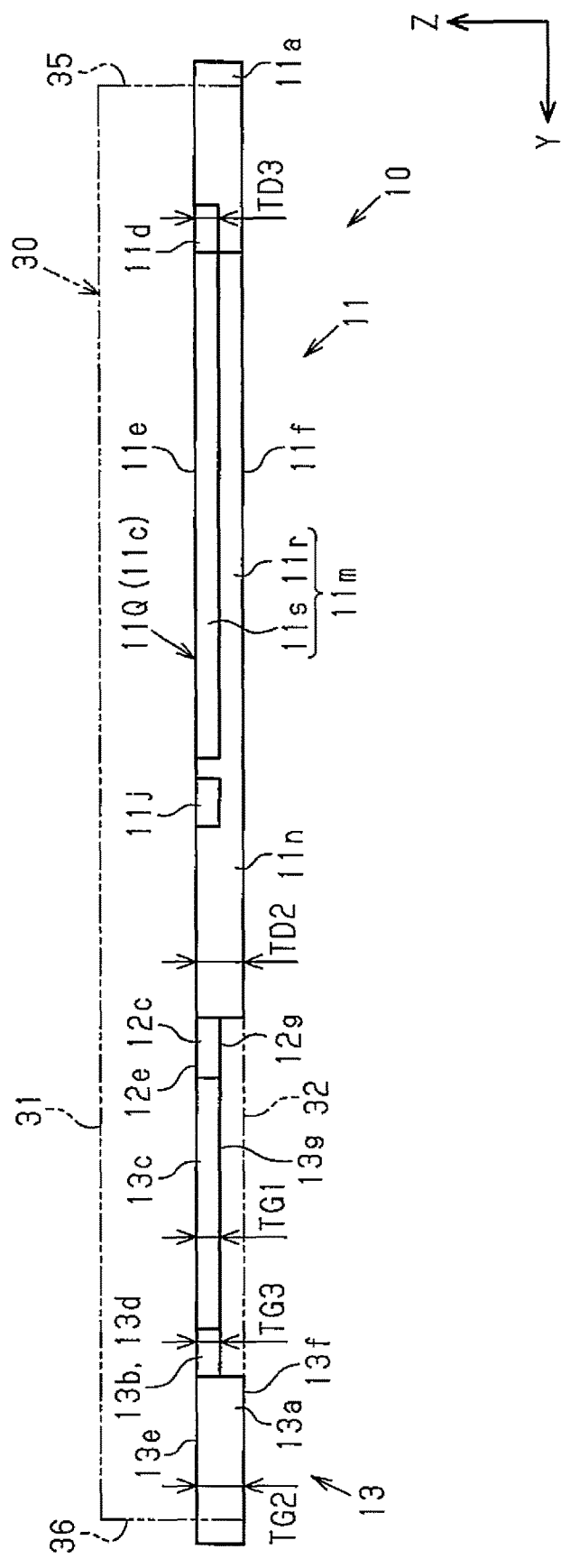
FIG. 7 is a side view of FIG. 3.

As shown in FIG. 7, in the gate frame 13, the entire gate frame finger 13c has a thickness TG1 that is less than the thickness TG2 of the gate terminal 13a. In the present embodiment, the thickness TG1 is one-half of the thickness TG2. The thickness of the gate coupling portion 13b is less than the thickness TG2 and equal to the thickness TG1 of the gate frame finger 13c. In the same manner as the source frame 12, the thickness TG3 of the tie bar portion 13d is equal to the thickness TG2. Thus, in the gate frame 13, the thickness TG1 of the gate frame finger 13c and the gate coupling portion 13b and the thickness TG3 of the tie bar portion 13d are less than the thickness TG2 of the gate terminal 13a. The thickness TG1 of the gate frame finger 13c and the gate coupling portion 13b and the thickness TG3 of the tie bar portion 13d are equal to the thicknesses TD1 and TD3 (see FIG. 5) of the drain frame 11. The thickness TG2 of the gate terminal 13a is equal to the thickness TD2 of the drain frame 11.

Thus, as viewed in the first direction X, at the portion where the drain frame fingers 11c overlap the source frame fingers 12c, at least either one of the drain frame fingers 11c and the source frame fingers 12c are thin. As viewed in the first direction X, the source frame fingers 12c and the gate frame fingers 13c are both thin at portions where thy overlap each other.

Figure 8:
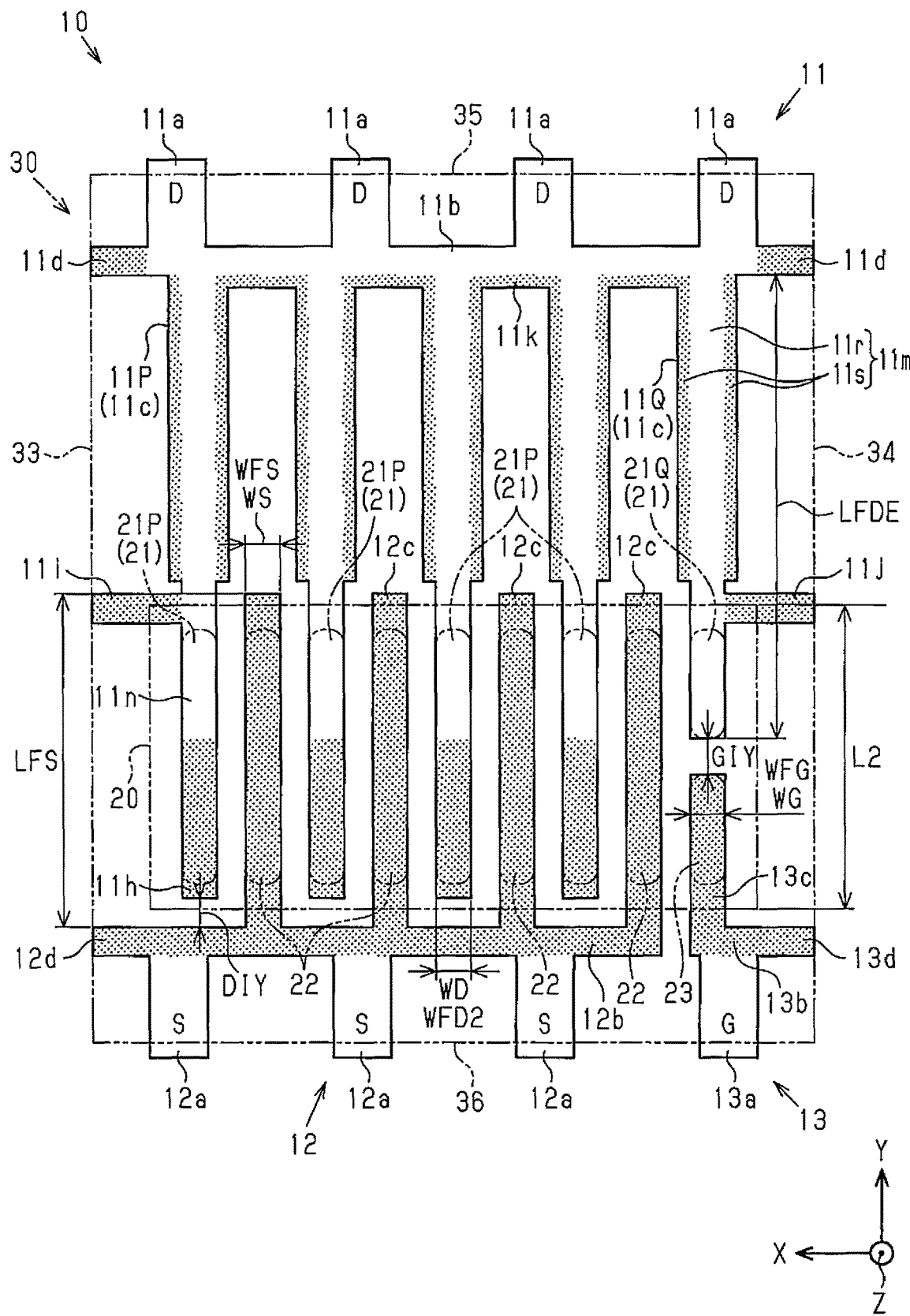
FIG. 8 is a plan view of a state in which the transistor is mounted on the lead frame.

As shown in FIG. 8, the transistor 20 is arranged closer to the second longitudinal side surface 36 of the encapsulation resin 30. Further, the transistor 20 is arranged closer to the first longitudinal side surface 35 side than the source coupling portion 12b and the gate coupling portion 13b. Specifically, a side surface of the transistor 20 closer to the first longitudinal side surface 35 lies at the middle of the encapsulation resin 30 in the second direction Y, and a side surface closer to the second longitudinal side surface 36 of the transistor 20 is located proximate to the source coupling portion 12b and the gate coupling portion 13b. The transistor 20 is located closer to the second longitudinal side surface 36 than the first section 11m of each drain frame finger 11c. Portions of the transistor 20 closer to the second longitudinal side surface 36 are supported by the second tie bar portions 11i and 11j.

As can be understood from FIG. 8, the length LFD of the drain frame fingers 11P and the length LFDE of the drain frame fingers 11Q are greater than the length L2 of the transistor 20. The length LFS of the source frame fingers 12c is slightly greater than the length L2.

The drain electrode pads 21P and 21Q face front surfaces 11e of the drain frame fingers 11P and 11Q in the height direction Z, the source electrode pads 22 face front surfaces 12e of the source frame fingers 12c in the height direction Z, and the gate electrode pad 23 faces a front surface 13e of the gate frame finger 13c in the height direction Z. Each drain electrode pad 21P is electrically connected to the corresponding drain frame finger 11P. The drain electrode pad 21Q is electrically connected to the drain frame finger 11Q. Each source electrode pad 22 is electrically connected to the corresponding source frame finger 12c. The gate electrode pad 23 is electrically connected to the gate frame finger 13c.

The distance between the adjacent drain frame fingers 11P in the first direction X is equal to the distance between the adjacent drain electrode pads 21P in the first direction X. The width WFD2 of the second section 11n in each drain frame finger 11P is equal to the width WD of each drain electrode pad 21P. Thus, when the transistor 20 is mounted on the drain frame 11, the drain frame finger 11P entirely covers the drain electrode pad 21P, and the drain frame finger 11Q entirely covers the drain electrode pad 21Q. Specifically, the edge of the distal portion 11h of the drain frame finger 11P is arranged closer to the second longitudinal side surface 36 than the end of the drain electrode pad 21P closer to the second longitudinal side surface 36, and the edge of the drain frame finger 11Q closer to the second longitudinal side surface 36 is arranged at the same position as the end of the drain electrode pad 21Q closer to the second longitudinal side surface 36. Thus, the drain frame finger 11P is electrically connected to the entire drain electrode pad 21P, and the drain frame finger 11Q is electrically connected to the entire drain electrode pad 21Q. The part of the drain frame finger 11P facing the drain electrode pad 21P in the height direction Z includes the distal portion 11h of the drain frame finger 11P and the part of the distal portion 11h closer to the first longitudinal side surface 35. Thus, the drain electrode pad 21P is electrically connected to the portion of the drain frame finger 11P exposed from the back surface 32 of the encapsulation resin 30.

The distance between the adjacent source frame fingers 12c in the first direction X is equal to the distance between the adjacent source electrode pads 22 in the first direction X. The width WFS of the source frame fingers 12c is equal to the width WS of the source electrode pads 22. Thus, when the transistor 20 is mounted on the source frame 12, each source frame finger 12c entirely covers the corresponding source electrode pad 22. Specifically, the distal portion of each source frame finger 12c is located closer to the first longitudinal side surface 35 than the end of the source electrode pad 22 closer to the first longitudinal side surface 35. Thus, the source frame finger 12c is electrically connected to the entire source electrode pad 22.

The gate frame finger 13c covers the entire gate electrode pad 23. Specifically, the distal portion of the gate frame finger 13c is located closer to the first longitudinal side surface 35 than the end of the gate electrode pad 23 closer to the first longitudinal side surface 35. The width WFG of the gate frame finger 13c is equal to the width WG of the gate electrode pad 23. Thus, the gate frame finger 13c is electrically connected to the entire gate electrode pad 23.

As shown in FIGS. 4 to 7, the front surface 11e of each drain frame 11, the front surface 12e of each source frame 12, and the front surface 13e of each gate frame 13 are flush with one another. Back surfaces 11f, 12f, 13f of the thin portions in the drain frame 11, the source frame 12, and the gate frame 13 are located closer to the front surfaces 11e to 13e side of the frames 11 to 13 than the back surfaces 11g, 12g, and 13g of the thick portions. Furthermore, as shown in FIGS. 5 to 7, each frame 11 to 13 is arranged closer to the back surface 32 of the encapsulation resin 30 in the height direction Z.

Figure 9:
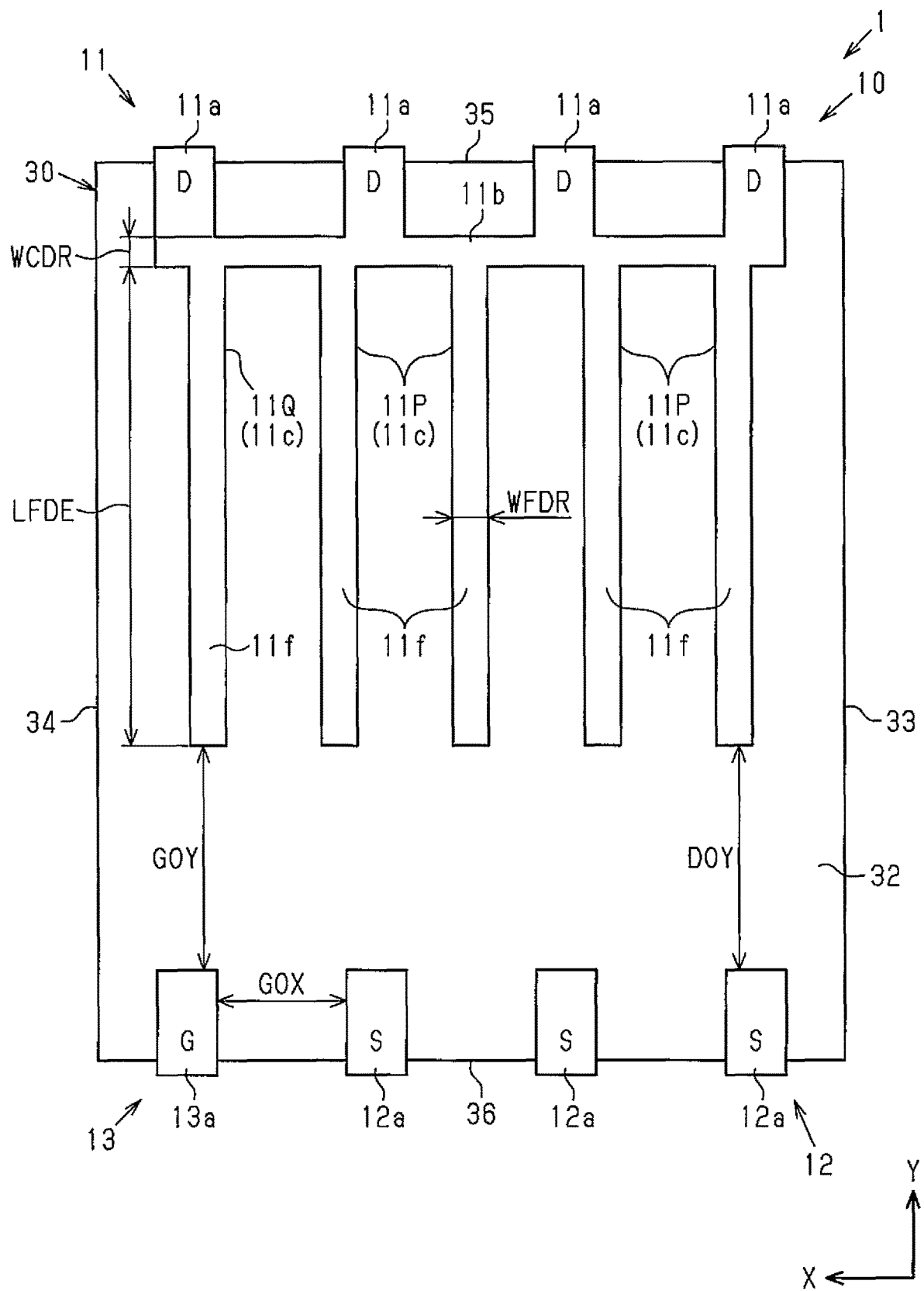
FIG. 9 is a bottom view of the semiconductor device of FIG. 1.

Thus, as shown in FIG. 9, the back surface 11f of the drain frame 11, the back surface 12f of the source frame 12, and the back surface 13f of the gate frame 13 are exposed from the back surface 32 of the encapsulation resin 30. The back surface 11g of the drain frame 11, the back surface 12g of the source frame 12, and the back surface 13g of the gate frame 13 shown in FIGS. 5 and 6 are not exposed from the back surface 32 of the encapsulation resin 30. Specifically, in the source frame 12, the three source terminals 12a are exposed from the back surface 32 of the encapsulation resin 30. However, the source coupling portion 12b, the four source frame fingers 12c, and the tie bar portion 12d are not exposed from the back surface 32. In the gate frame 13, the gate terminal 13a is exposed from the back surface 32 of the encapsulation resin 30. However, the gate coupling portion 13b, the gate frame finger 13c, and the tie bar portion 13d are not exposed from the back surface 32. In the drain frame 11, the four drain terminals 11a, the parts in the drain coupling portion 11b other than the end 11k, and the base 11r in the first section 11m of each of the five drain frame fingers 11c and parts other than the distal portion 11h are exposed from the back surface 32 of the encapsulation resin 30. In the drain frame 11, the distal portion 11h and the flanges 11s of the first section 11m in each of the five drain frame fingers 11c, and the tie bar portions 11d, 11i, and 11j are not exposed from the back surface 32. Thus, the width WCDR of the drain coupling portion 11b exposed from the back surface 32 is smaller than the width WCD of the drain coupling portion 11b (see FIG. 3). The width WFDR of the drain frame finger 11c exposed from the back surface 32 is equal to the width WFD2 of the second section 11n (see FIG. 3). The width WCDR is equal to the width WFD2. The length in the second direction Y of the back surface 11f exposed from the back surface 32 of the encapsulation resin 30 in the drain frame finger 11c is equal to the length LFDE of the drain frame finger 11Q.

As shown in FIG. 8, in a region where the drain frame fingers 11c overlap the source frame fingers 12c as viewed in the first direction X, the drain frame fingers 11c are exposed from the back surface 32 (see FIG. 9) of the encapsulation resin 30 but the source frame fingers 12c are not exposed from the back surface 32. Thus, the shortest distance DOY in the second direction Y between each drain frame 11 and the corresponding source frame 12 where they are exposed from the back surface 32 of the encapsulation resin 30 is longer than the shortest distance DIY (see FIG. 8) in the second direction Y between the drain frame 11 and the source frame 12 where they are not exposed from the back surface 32 of the encapsulation resin 30. The shortest distance DOY is the distance in the second direction Y between each drain frame finger 11c and the corresponding source terminal 12a. The shortest distance DIY is the distance in the second direction Y between the distal end of each drain frame finger 11P and the source coupling portion 12b.

Furthermore, the shortest distance GOY in the second direction Y between the drain frame 11 and the gate frame 13 exposed from the back surface 32 of the encapsulation resin 30 is longer than the shortest distance GIY (see FIG. 8) in the second direction Y between the drain frame 11 and the gate frame 13 where they are not exposed from the back surface 32 of the encapsulation resin 30. The shortest distance GOX in the first direction X between the gate frame 13 and the source frame 12 exposed from the back surface 32 of the encapsulation resin 30 is longer than the shortest distance (distance DFgs (see FIG. 3)) in the first direction X between the gate frame 13 and the source frame 12 where it is not exposed from the back surface 32 of the encapsulation resin 30. The shortest distance GOY is a distance in the second direction Y of the drain frame finger 11Q and the gate terminal 13a. The shortest distance GOY is equal to the shortest distance DOY. The shortest distance GIY is a distance in the second direction Y of the drain frame finger 11Q and the gate frame finger 13c. The shortest distance GOX is the distance between the gate terminal 13a and the adjacent source terminal 12a.

A method for manufacturing the semiconductor device 1 will now be described.

Figure 10:
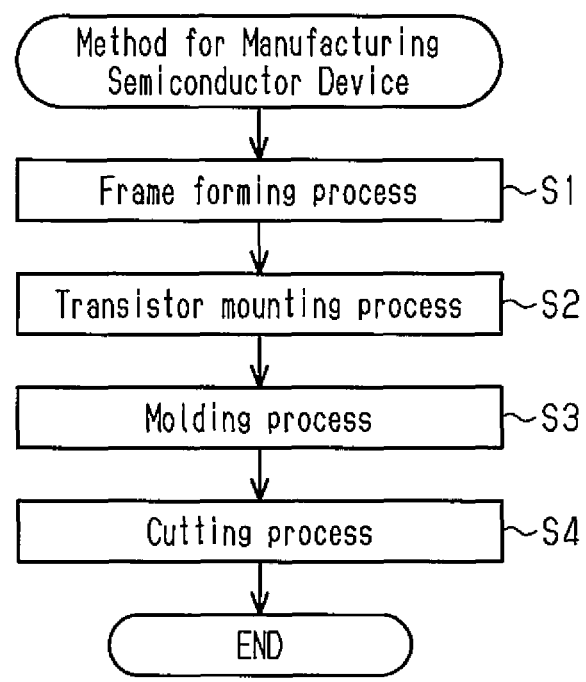
FIG. 10 is a flowchart showing a method for manufacturing the semiconductor device.

As shown in FIG. 10, the method for manufacturing the semiconductor device 1 includes a frame forming process (step S1), a transistor mounting process (step S2), a molding process (step S3), and a cutting process (step S4). The manufacturing of the semiconductor device 1 is, for example, performed in the order of the frame forming process, the transistor mounting process, the molding process, and the cutting process.

In the frame forming process, multiple lead frames 10 are formed from the same copper plate that serves as a base material. Each lead frame 10 in the frame forming process is connected to the copper plate (base material) by the tie bar portions 11d, 11i, 11j, 12d, and 13d (see FIG. 3).

In the transistor mounting process, the transistor 20 is flip-chip mounted on each lead frame 10 (see FIG. 8). Specifically, a solder paste is applied to the five drain frame fingers 11c, the four source frame fingers 12c, and the single gate frame finger 13c of each lead frame 10. Bumps made of gold, copper, or the like is formed on the drain electrode pads 21, the source electrode pads 22, and the gate electrode pad 23 of the transistor 20. The transistor 20 is heated and pressurized by the lead frame 10 so that the five drain electrode pads 21 face the five drain frame fingers 11c, the four source electrode pads 22 face the four source frame fingers 12c, and the gate electrode pad 23 faces the gate frame finger 13c in the height direction Z. In this manner, the transistor 20 is mounted on the lead frame 10. Thus, each lead frame 10 and the transistor 20 are connected without wires such as bonding wires.

In the molding process, the encapsulation resin 30 is molded by, for example, a mold shaping device. Specifically, the copper plate including each lead frame 10, on which the transistor 20 is mounted, is arranged in a cavity of a mold of the mold shaping device, and the cavity of the mold is filled with a molten mold resin (epoxy resin in the present embodiment).

In the cutting process, each semiconductor device 1 is cut out from the copper plate. In this case, the tie bar portions 11d, 11i, 11j, 12d, and 13d are cut from the copper plate. Thus, the first tie bar portions 11d are exposed from the first lateral side surface 33 and the second lateral side surface 34 of the encapsulation resin 30. The second tie bar portion 11i is exposed from the first lateral side surface 33, and the second tie bar portion 11j is exposed from the second lateral side surface 34. Furthermore, the tie bar portion 12d is exposed from the first lateral side surface 33 of the encapsulation resin 30, and the tie bar portion 13d is exposed from the second lateral side surface 34. The semiconductor device 1 shown in FIG. 1 can be obtained through the processes described above.

Figure 11:
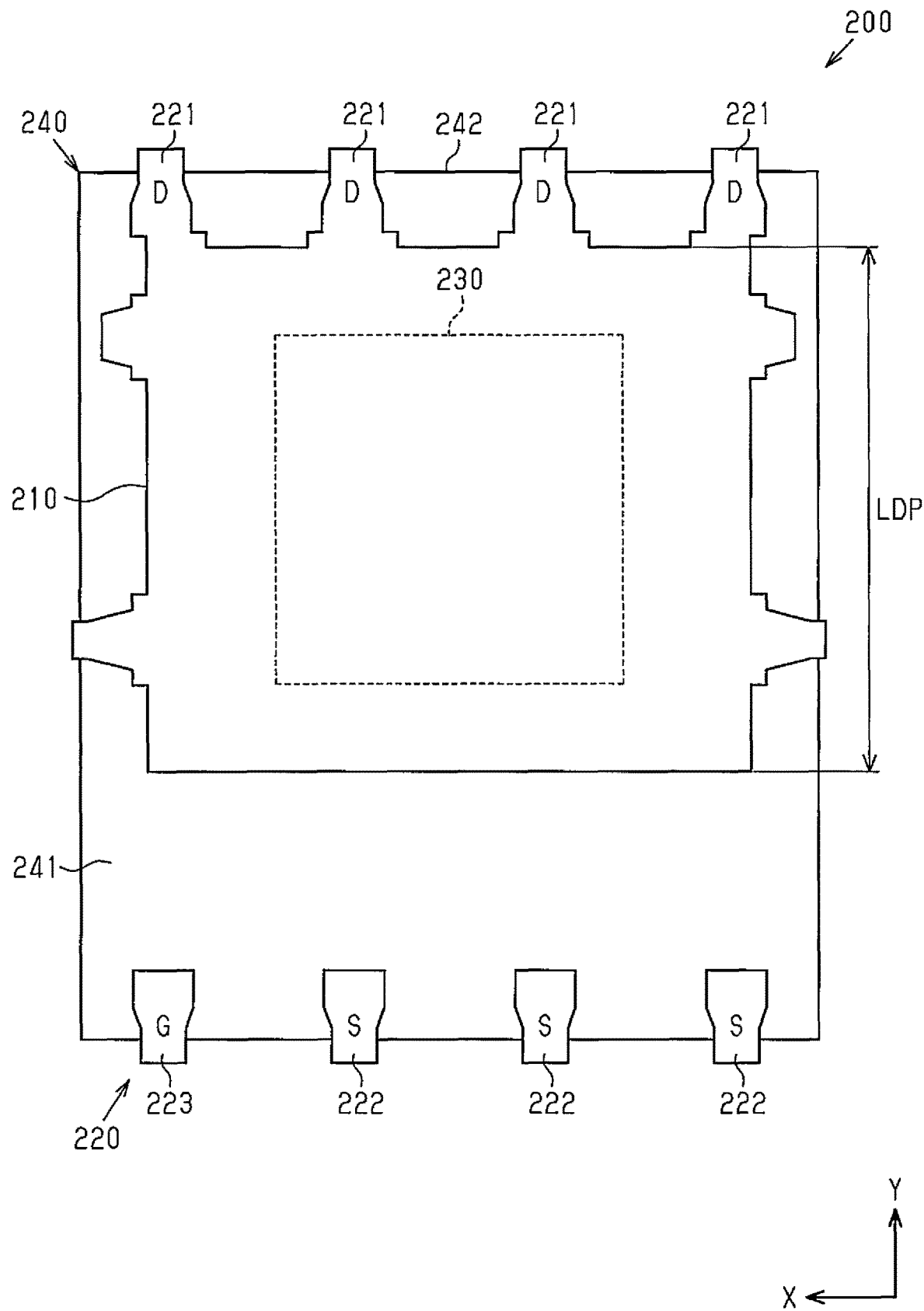
FIG. 11 is a bottom view of an existing semiconductor device.

The semiconductor device 1, which is formed in this manner, can be mounted on the circuit substrate 300 (see FIG. 12) in place of a conventional semiconductor device 200 shown in FIG. 11. In other words, the semiconductor device 1 and the semiconductor device 200 are pin-compatible. In FIG. 11, the back surface of the semiconductor device 200 is shown. The circuit substrate 300 is a circuit substrate on which the semiconductor device 200 is mounted.

As shown in FIG. 11, the semiconductor device 200 includes a die pad 210, a lead frame 220, a transistor 230 mounted on the die pad 210, and an encapsulation resin 240 that encapsulates the transistor 230. The semiconductor device 200 has the same package contour as the semiconductor device 1.

The lead frame 220 includes four drain terminals 221, three source terminals 222, and one gate terminal 223 that are connected to the die pad 210. The arrangement of the drain terminals 221, the source terminals 222, and the gate terminal 223 is similar to the arrangement of the drain terminals 11a, the source terminals 12a, and the gate terminal 13a (see FIG. 9) of the semiconductor device 1. The source terminals 222 and the gate terminal 223 are spaced apart from the die pad 210 in the second direction Y. As shown in FIG. 11, the die pad 210, the four drain terminals 221, the three source terminals 222, and the single gate terminal 223 are exposed from a back surface 241 of the encapsulation resin 240.

The transistor 230 is, for example, a vertical Metal Oxide Semiconductor Field Effect Transistor (MOSFET) in which the drain electrodes are formed on the back surface (surface faced toward die pad 210) of the transistor 230, and the source electrodes and the gate electrode are formed on the front surface (surface faced away from die pad 210) of the transistor 230. The transistor 230 is arranged so that the drain electrodes are electrically connected to the die pad 210 and so that the source electrodes and the gate electrode are electrically connected to the source terminal 222 and the gate terminal 223 by bonding wires (not illustrated) such as aluminum wires.

The die pad 210 is arranged closer to the drain terminals 221 in the semiconductor device 200, that is, closer to a first longitudinal side surface 242 of the encapsulation resin 240. Thus, the transistor 230 is arranged closer to the first longitudinal side surface 242 of the encapsulation resin 240. As shown in FIG. 11, the die pad 210 is substantially rectangular and exposed from the back surface 241 of the encapsulation resin 240. The length LDP of the die pad 210 in the second direction Y is basically equal to the sum of the length LFDE of the drain frame fingers 11c exposed from the back surface 32 of the encapsulation resin 30 in the semiconductor device 1 and the width WCDR of the drain coupling portion 11b (both shown in FIG. 9).

Figure 12:
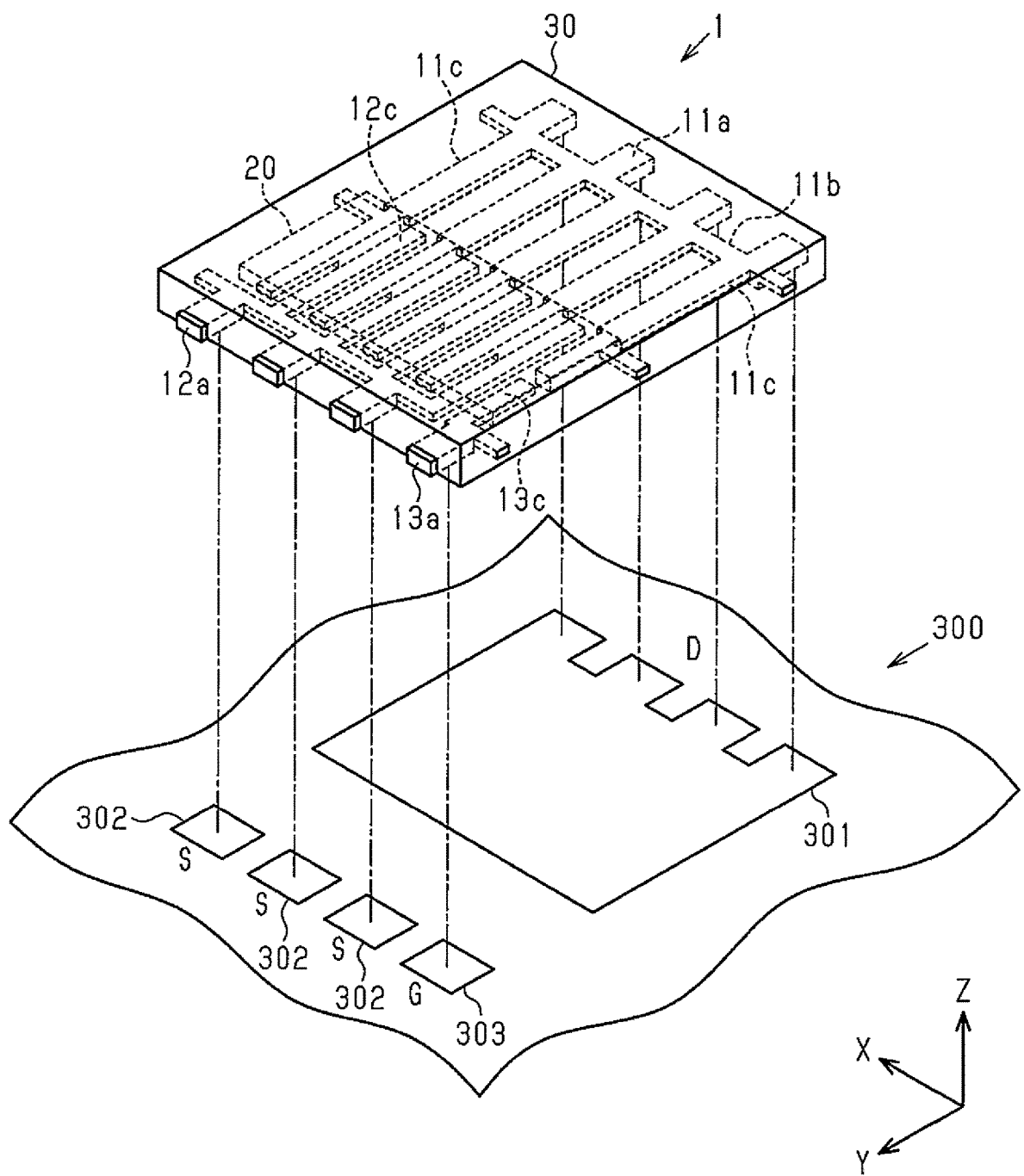
FIG. 12 is a perspective view showing a state in which the semiconductor device is mounted on land patterns of a circuit substrate.

Furthermore, as shown in FIG. 12, a land pattern 301 electrically connected to the drain, land patterns 302 electrically connected to the source, and a land pattern 303 electrically connected to the gate are arranged on the circuit substrate 300. The land pattern 301 is shaped in correspondence with the die pad 210 of the semiconductor device 200 shown in FIG. 11. The land patterns 302 are spaced apart from the land pattern 301 in the second direction Y, and laid out in correspondence with the source terminals 222. The land pattern 303 and the land patterns 302 are arranged at corresponding positions in the second direction Y. Further, the land pattern 303 is spaced apart from the land patterns 302 in the first direction X. The land pattern 303 is arranged at a position corresponding to the gate terminal 223.

As shown in FIG. 12, when applying solder to the land patterns 301 to 303 in order to mount the semiconductor device 1 on the circuit substrate 300, the land pattern 301 corresponding to the die pad 210 is connected to the four drain terminals 11a, the drain coupling portion 11b, and the five drain frame fingers 11c of the semiconductor device 1. The source frame fingers 12c are not exposed at positions facing the land pattern 301 and thus not electrically connected to the land pattern 301. Thus, short-circuiting of the drain and the source can be avoided. The three land patterns 302 are connected to the three source terminals 12a, respectively. The land pattern 303 is connected to the gate terminal 13a. Thus, the semiconductor device 1 can be mounted on the land patterns 301 to 303 designed in accordance with the semiconductor device 200, and there is no need to design a new land patterns and manufacture a new circuit substrate to mount the semiconductor device 1. This avoids cost increases that would occur when manufacturing a new circuit substrate.

The semiconductor device 1 has the following advantages.

(1) As shown in FIG. 8, the drain frame fingers 11c of the drain frame 11 face the drain electrode pads 21 of the transistor 20 in the height direction Z, and the source frame fingers 12c of the source frame 12 face the source electrode pads 22 in the height direction Z. The gate frame finger 13c of the gate frame 13 faces the gate electrode pads 23 of the transistor 20 in the height direction Z. This layout shortens the connecting distance of between the electrode pads 21 to 23 of the transistor 20 and the frame fingers 11c to 13c. In particular, in the present embodiment, the electrode pads 21 of the transistor 20 directly contact the drain frame fingers 11c, and the electrode pads 22 directly contact the source frame fingers 12c. Thus, the connecting distance between the transistor 20 and the lead frame 10 is null.

The connection of the drain frame fingers 11c and the drain electrode pads 21, the connection of the source frame fingers 12c and the source electrode pads 22, and the connection of the gate frame finger 13c and the gate electrode pad 23 are performed through flip-chip mounting. Thus, bonding wires are not used for the electrical connection of the transistor 20 and the lead frame 10. This eliminates inductance that would be caused by bonding wires. As a result, increases in the inductance of the semiconductor device 1 are limited since bonding wires are not used.

(2) In the region where the source frame fingers 12c overlap the drain frame fingers 11c as viewed in the first direction X, the source frame fingers 12c are not exposed from the back surface 32 of the encapsulation resin 30. In such a configuration, the distance between the drain frame fingers 11c and the source frame 12 that are exposed from the back surface 32 of the encapsulation resin 30 can be increased. Thus, when the semiconductor device 1 is mounted on the circuit substrate 300 by the solder paste, for example, connection of the drain frame 11 and the source frame 12 with the solder paste is limited. This limits short-circuiting of the drain and the source in the transistor 20.

(3) In the region where the drain frame fingers 11c overlap the source frame fingers 12c as viewed in the first direction X, parts of each drain frame finger 11c other than the distal portion 11h are exposed from the back surface 32 of the encapsulation resin 30. Thus, the heat of the transistor 20 is dissipated to the outside of the semiconductor device 1 through the drain frame finger 11c. This improves the heat dissipation performance of the semiconductor device 1.

(4) In the second direction Y, the transistor 20 is arranged closer to the second longitudinal side surface 36 of the encapsulation resin 30. The length LFS of the source frame fingers 12c is shorter than the length LFD of the drain frame fingers 11c. This limits deformation of the source frame fingers 12c toward the back surface 32 of the encapsulation resin 30 when the transistor 20 is mounted on the source frame fingers 12c. This limits exposure of the source frame fingers 12c from the back surface 32 of the encapsulation resin 30.

In this manner, the source frame fingers 12c, which are shorter in length than the drain frame fingers 11c, are reduced in thickness. The deformation amount of each source frame finger 12c when the transistor 20 is mounted on the lead frame 10 would be less than the deformation amount of each drain frame finger when each drain frame finger 11c is entirely reduced in thickness. This limits exposure of the source frame fingers 12c from the back surface 32 of the encapsulation resin 30 at the portion where the drain frame fingers 11c overlap the source frame fingers 12c as viewed in the first direction X.

(5) The source frame fingers 12c are coupled by the source coupling portion 12b. This increases the rigidity of each source frame finger 12c. In addition, the distance between the drain frame 11 and the source frame 12 can be increased because the source coupling portion 12b is not exposed from the back surface 32 of the encapsulation resin 30. Therefore, when the semiconductor device 1 is mounted on the circuit substrate 300 using, for example, solder paste, connection of the drain frame 11 and the source frame 12 with the solder paste is limited.

(6) The thickness TD1 of each drain frame finger 11c is greater than the thickness TS1 of each source frame finger 12c. Thus, when the transistor 20 is mounted on the drain frame fingers 11c, deformation is limited in the height direction Z.

In addition, the drain frame fingers 11c are exposed from the back surface 32 of the encapsulation resin 30. This easily dissipates the heat of the drain frame 11 and the heat of the transistor 20 to the outside of the semiconductor device 1 through each drain frame finger 11c. Therefore, the temperature of the semiconductor device 1 does not become excessively high. In this manner, the drain frame fingers 11c, which are longer length than the source frame fingers 12c, are exposed from the back surface 32 of the encapsulation resin 30. This improves the heat dissipation performance of the semiconductor device 1 compared to a configuration in which the drain frame fingers 11c are not exposed from the back surface 32 and the source frame fingers 12c are exposed from the back surface 32.

(7) The drain frame fingers 11c are coupled to the drain coupling portion 11b. This increases the rigidity of each drain frame finger 11c. Therefore, when the transistor 20 is mounted on the drain frame fingers 11c, deformation can be further reduced in the height direction Z.

In addition, each drain coupling portion 11b is exposed from the back surface 32 of the encapsulation resin 30. Thus, the heat of the drain frame 11 and the heat of the transistor 20 are easily dissipated to the outside of the semiconductor device 1 through the drain coupling portion 11b. This further ensures that the temperature of the semiconductor device 1 does not become excessively high.

(8) Each drain frame finger 11P covers the entire surface of the corresponding drain electrode pad 21P. Thus, the drain frame finger 11P is electrically connected to the entire surface of the corresponding drain electrode pad 21P of the transistor 20. Thus, the current supplied from the drain frame 11 to the transistor 20 can be increased. In addition, the distal portion 11h of each drain frame finger 11P is not exposed from the back surface 32 of the encapsulation resin 30. Thus, the distance between each drain frame finger 11P and the source frame 12 that are exposed from the back surface 32 of the encapsulation resin 30 can be increased. Therefore, when the semiconductor device 1 is mounted on the circuit substrate 300 by, for example, solder paste, connection of the drain frame 11 and the source frame 12 by the solder paste is limited.

(9) In the portion of each drain frame finger 11c connected to the corresponding drain electrode pad 21 of the transistor 20, the part closer to the first longitudinal side surface 35 is exposed from the back surface 32 of the encapsulation resin 30. Thus, the heat of the transistor 20 is dissipated to the outside of the semiconductor device 1 through the drain electrode pad 21 and the drain frame finger 11c. The heat of the transistor 20 is dissipated to the outside of the semiconductor device 1 over a short path. Thus, the heat of the transistor 20 is easily dissipated to the outside of the semiconductor device 1.

(10) The portion of the gate frame finger 13c overlapping the corresponding drain frame finger 11c as viewed in the first direction X is not exposed from the back surface 32 of the encapsulation resin 30. This increases the distance between the gate frame 13 and the drain frame 11 that are exposed from the back surface 32 of the encapsulation resin 30. Therefore, when the semiconductor device 1 is mounted on the circuit substrate 300 by, for example, solder paste, connection of the drain frame 11 and the gate frame 13 by the solder paste is limited.

(11) The length LFG of the gate frame fingers 13c is less than the length LFS of the source frame fingers 12c. This limits deformation of the gate frame fingers 13c toward the back surface 32 of the encapsulation resin 30 when the transistor 20 is mounted on the gate frame finger 13c. Therefore, exposure of the gate frame fingers 13c from the back surface 32 of the encapsulation resin 30 is limited.

(12) The drain frame fingers 11Q face the gate frame fingers 13c in the second direction Y. Thus, compared to when the drain frame fingers 11Q do not face the gate frame fingers 13c in the second direction Y, that is, when the drain frame fingers 11Q are arranged at positions that differ from the gate frame finger 13c in the first direction X, the size of the semiconductor device 1 in the second direction Y can be reduced.

(13) The drain electrode pads 21 and the source electrode pads 22 of the transistor 20 are alternately arranged in the first direction X. Thus, the distance between each drain electrode pad 21 and the adjacent source electrode pad 22 is decreased in the first direction X. That is, the travel distance of electrons is decreased between the drain electrode pad 21 and the source electrode pad 22. This increases the switching speed of the transistor 20.

The distance between the drain electrode pads 21 adjacent to each other in the first direction X and the distance between the source electrode pads 22 adjacent to each other in the first direction X are equal. Thus, concentration of the current can be limited at the source electrode pads 22 where the distance between the drain electrode pads 21 and the source electrode pads 22 is small in the first direction X when the distance of the drain electrode pad 21 and the source electrode pad 22 varies in the first direction X.

(14) The drain electrode pad 21Q and the gate electrode pad 23 of the transistor 20 are aligned in the second direction Y. In other words, the drain electrode pad 21Q and the gate electrode pad 23 are arranged at corresponding positions in the first direction X. Thus, compared to when the drain electrode pad 21Q and the gate electrode pad 23 are arranged at different positions in the first direction X, the size of the transistor 20 in the first direction X can be reduced.

The length LDE of the drain electrode pad 21Q and the length LG of the gate electrode pad 23 are less than the length LD of the drain electrode pad 21P and the length LS of the source electrode pad 22. Thus, compared to when the length LDE of the drain electrode pad 21Q and the length LG of the gate electrode pad 23 are greater than or equal to the length LD of the drain electrode pad 21P and the length LS of the source electrode pad 22, the size of the transistor 20 in the second direction Y can be reduced.

(15) The thin portions (shaded portions in FIG. 3) of the drain frame 11, the source frame 12, and the gate frame 13 are formed through a half-etching processing. Thus, compared to other processing methods such as cutting, the thin portion can easily be formed in the drain frame 11, the source frame 12, and the gate frame 13.

(16) The second tie bar portions 11i and 11j are arranged on the drain frame fingers 11P that is closest to the first lateral side surface 33 of the drain frame finger 11P and on the drain frame finger 11Q, respectively. In such a configuration, when the transistor 20 is mounted on the lead frame 10, the drain frame fingers 11c support the transistor 20 with the second tie bar portions 11i, 11j. This limits deformation of the drain frame finger 11c toward the back surface 32 of the encapsulation resin 30. Furthermore, the drain frame fingers 11c are supported by of the tie bar portions 11i and 11j when the mold resin that molds the encapsulation resin 30 flowed onto the drain frame finger 11c. This limits curving of the drain frame fingers 11c.

Furthermore, the drain frame 11 is supported by the first tie bar portions 11d provided on the drain coupling portion 11b and the second tie bar portions 11i and 11j provided on the drain frame fingers 11c. This limits tilting of the drain frame 11 when the mold resin that molds the encapsulation resin 30 flows onto the drain frame 11.

(17) The width WFD1 of the first section 11m of each drain frame finger 11c is greater than the width WFD2 of the second section 11n. This increases the rigidity of the drain frame finger 11c and limits curving of the drain frame finger 11c.

(18) The base 11r of the first section 11m of each drain frame finger 11c is exposed from the back surface 32 of the encapsulation resin 30 but the flanges 11s are not exposed from the back surface 32. In such a configuration, the surface of each flange 11s at the side closer to the back surface 32 faces and contacts the encapsulation resin 30. Thus, the flanges 11s restrict movement of the drain frame finger 11c toward the back surface 32. This limits projection of the drain frame finger 11c out of the back surface 32.

(19) Parts of the drain coupling portion 11b other than the end 11k is exposed from the back surface 32 of the encapsulation resin 30. The end 11k is not exposed from the back surface 32. In such a configuration, the surface of the end 11k at the side closer to the back surface 32 faces and contacts the encapsulation resin 30. Thus, the end 11k restricts movement of the drain coupling portion 11b toward the back surface 32. This limits projection of the drain coupling portion 11b out of the back surface 32.

Transistor

The internal structure of the transistor 20 will now be described with reference to FIGS. 13 to 15. The shading in FIG. 14A indicates the region of a plate film 44, and the shading in FIG. 14B indicates the region of source electrodes 60.

Figure 13:
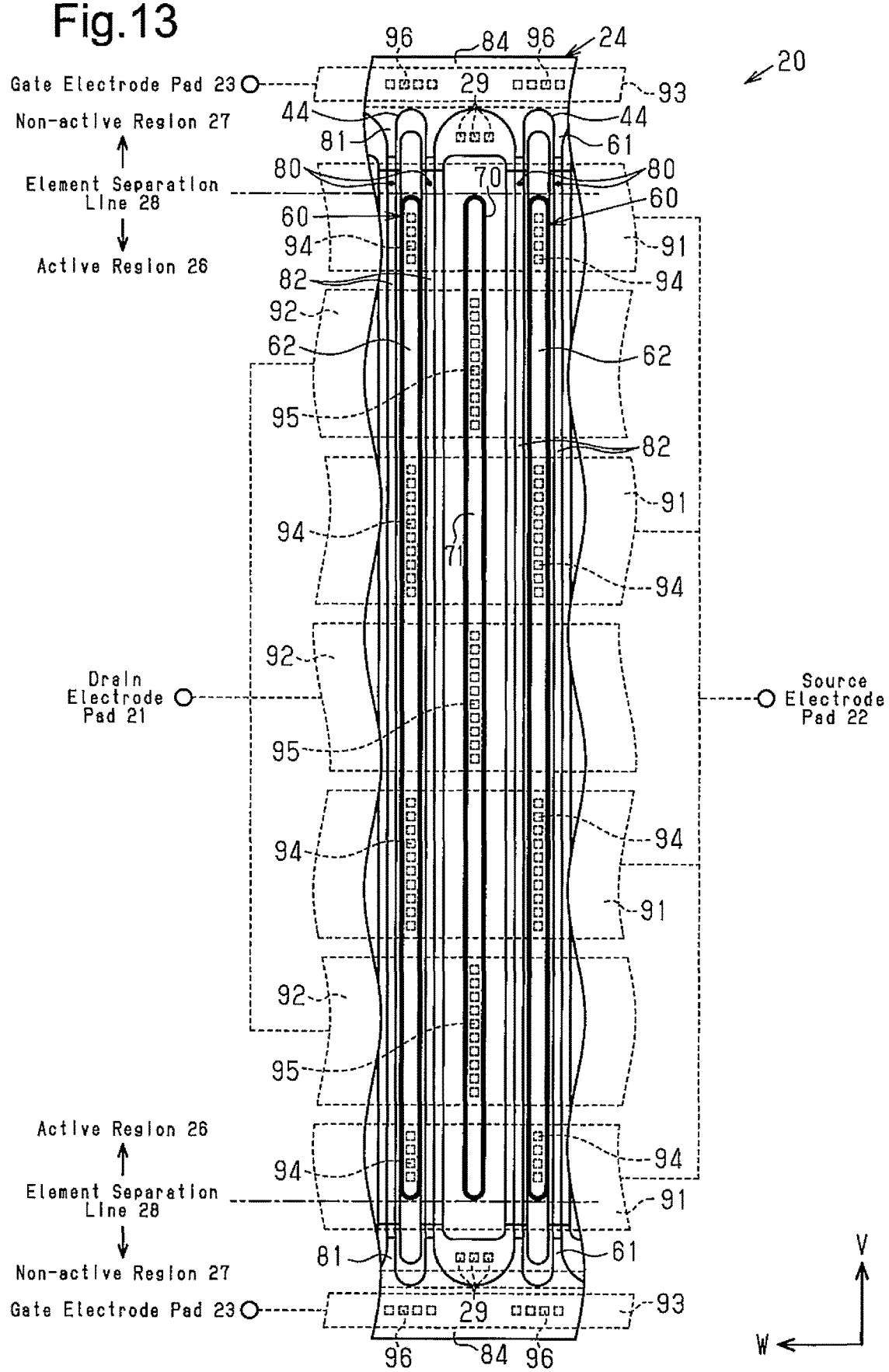
FIG. 13 is a plan view of one portion of the transistor.

As shown in FIG. 13, the transistor 20 includes the source electrode 60, a drain electrode 70, a gate electrode 80, and a plate film 44 that are arranged on a group-III nitride semiconductor stacked structure 24 serving as a base. As shown in FIG. 14A, the source electrode 60(S), the drain electrode 70(D), and the gate electrode 80(G) are cyclically arranged in the order of SGDGS. Thus, an element structure 25 is configured by sandwiching the gate electrode 80 with the source electrode 60 and the drain electrode 70. The plate film 44 is arranged between the gate and the source, and between the drain and the gate. In the following description, a plate film 44 arranged between a drain and a gate is referred to as a source field plate 45, and a plate film 44 arranged between a gate and a source is referred to as a floating plate 46.

The front surface of the group-III nitride semiconductor stacked structure 24 is divided into an active region 26 that includes the element structure 25 and a non-active region 27 that excludes the active region 26. The non-active region 27 may just be adjacent to the active region 26 as shown in FIG. 14A or surround the active region 26 (not shown).

Figure 14A:
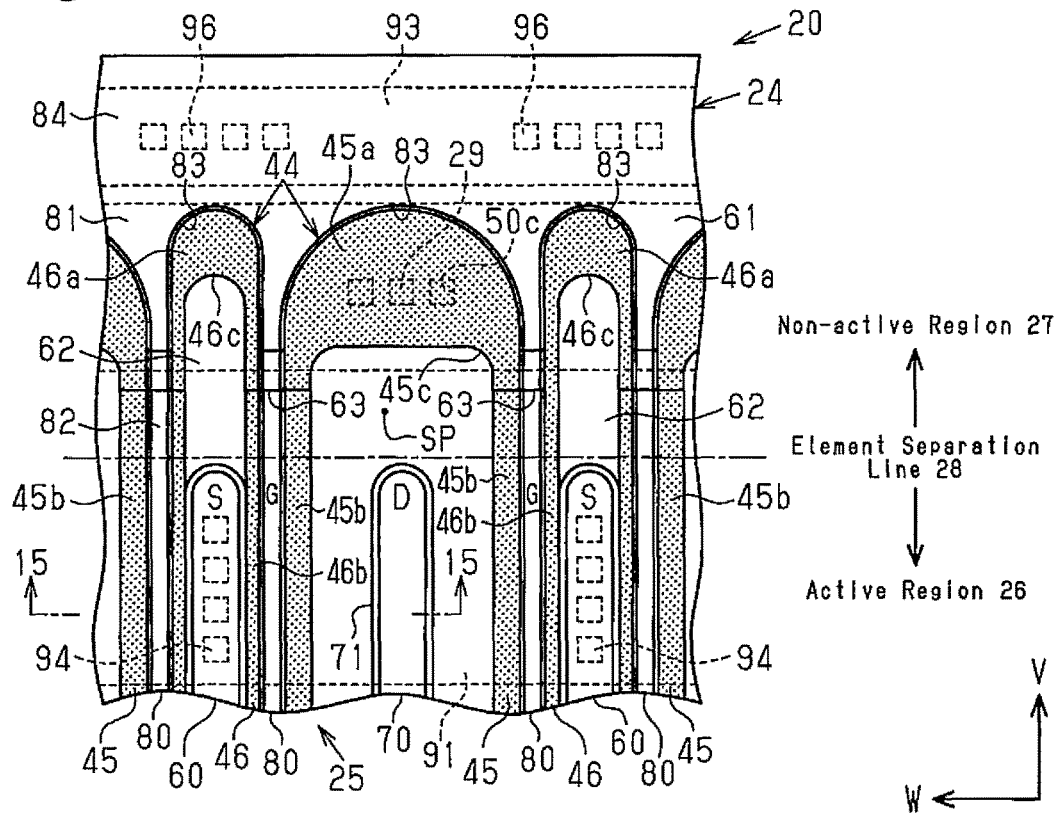
FIG. 14A is a partially enlarged plan view of FIG. 13.
Figure 14B:
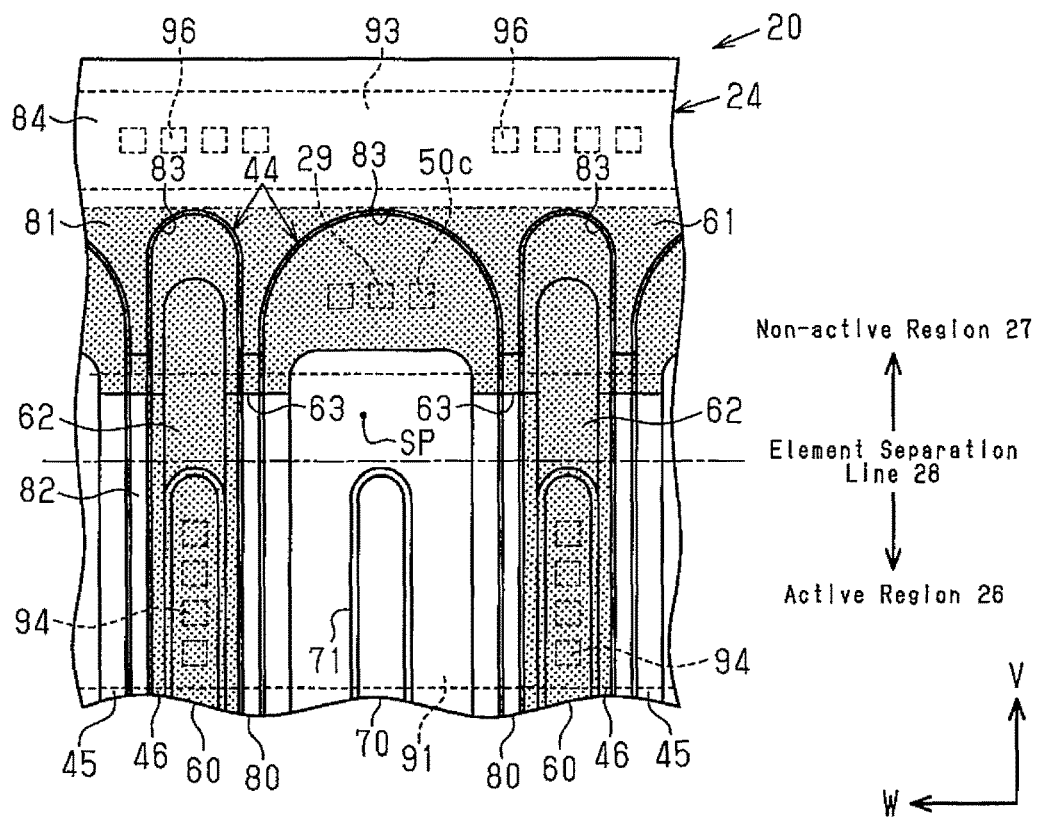
FIG. 14B is a partially enlarged plan view of FIG. 13.

As shown in FIG. 14B, the source electrodes 60 includes a base portion 61, which is arranged in the non-active region 27, and source electrode fingers 62, which are integrally connected to the base portion 61. The source electrode 60 of the present embodiment is comb-shaped in which source electrode fingers 62 extend in a striped manner parallel to one another (see FIG. 13). The base portion 61 includes a connection end 63 for the source electrode fingers 62 in the non-active region 27. The source electrode fingers 62 extend from the connection end 63 toward the active region 26. That is, the source electrode fingers 62 are arranged across the active region 26 and the non-active region 27. In the following description, the direction in which the source electrode fingers 62 extend is referred to as "the third direction V," and the direction orthogonal to the third direction V in a plan view of the group-III nitride semiconductor stacked structure 24 is referred to as "the fourth direction W."

A space SP extends between the adjacent source electrode fingers 62 is a region where the drain electrode 70 is arranged. The drain electrode 70 may include a base portion (not shown) in the non-active region 27 and a drain electrode fingers 71 (portion arranged in the space SP), which are integrally connected to the base portion in the same manner as the source electrode 60. The drain electrode 70 of the present embodiment is comb-shaped in which drain electrode fingers 71 extend in a striped manner parallel to one another (see FIG. 13). The drain electrode fingers 71 are parallel to the source electrode fingers 62. In the present embodiment, the drain electrode finger 71 are arranged in each space SP so that the comb-shaped electrode source electrode fingers 62 are engaged with the comb-shaped drain electrode fingers 71.

As shown in FIG. 13, the gate electrode 80 surrounds each source electrode finger 62. As shown in FIG. 14A, the gate electrode 80 includes a base portion 81 arranged in the non-active region 27 and gate electrode fingers 82, which are integrally connected to the base portion 81. The gate electrode 80 of the present embodiment is comb-shaped in which the gate electrode fingers 82 extend in a striped-manner parallel to one another. The base portion 81 includes a connection end 83 for the gate electrode fingers 82 in the non-active region 27. When using a boundary (element separation line 28) of the active region 26 and the non-active region 27 as a reference, the connection end 83 is located toward an outer side (relatively far side from active region 26) from the connection end 63 of the source electrode 60. The gate electrode fingers 82 extend from the connection end 83 toward the active region 26. That is, the gate electrode fingers 82 are arranged across the active region 26 and the non-active region 27. The base portion 81 of the gate electrode 80 also includes an extension 84 on the outer side than the base portion 61 of the source electrode 60. The extension 84 is, for example, a region for forming contact 96 for the gate electrode 80.

As shown in FIG. 14A, the source field plate 45 includes a base portion 45a arranged on the non-active region 27 and electrode portions 45b, which are integrally connected to the base portion 45a. The source field plate 45 of the present embodiment is arched so that two electrode portions 45b extend in the third direction V from the two ends of the base portion 45a in the fourth direction W. The source field plate 45, which is arranged closer to the drain electrode finger 71 than the gate electrode 80, surrounds the drain electrode finger 71 (see FIG. 13). The base portion 45a includes a connection end 45c for the electrode portion 45b in the non-active region 27. When using the element separation line 28 as a reference, the connection end 45c is located toward the outer side from the connection end 63 of the source electrode 60. The two electrode portions 45b extend from the connection end 45c toward the active region 26. That is, the two electrode portions 45b are arranged across the active region 26 and the non-active region 27. When using the element separation line 28 as a reference, the connection end 45c may be arranged at a position substantially corresponding to the position of the connection end 63 of the source electrode 60.

The base portion 61 of each source electrode 60 and the base portion 45a of each source field plate 45 are partially overlapped in the non-active region 27. In the overlapping portion, the source electrode 60 and the source field plate 45 are connected by source contacts 29. The source contact 29 is, for example, arranged at positions facing the space SP (positions avoiding source electrode finger 62 of source electrode 60).

The floating plate 46 includes a base portion 46a, which is arranged in the non-active region 27, and electrode portions 46b, which are integrally connected to the base portion 46a. The floating plate 46 of the present embodiment is arched so that two electrode portions 46b extend in the third direction V from the ends of the base portion 46a in the fourth direction W. The floating plate 46 is arranged closer to the source electrode finger 62 than the gate electrode 80, surrounds the source electrode finger 62 (see FIG. 13). The base portion 46a includes a connection end 46c for the electrode portion 46b in the non-active region 27. When using the element separation line 28 as a reference, the connection end 46c is located toward the outer side from the connection end 63 of the source electrode 60 and the connection end 45c of the source field plate 45. The two electrode portions 46b extended from the connection end 46c toward the active region 26. That is, the two electrode portions 46b extend across the active region 26 and the non-active region 27. When using the element separation line 28 as a reference, the connection end 46c may be arranged at a position substantially corresponding to the connection end 63 of the source electrode 60 or the connection end 45c of the source field plate 45.

As shown in FIG. 13, source wires 91, drain wires 92, and gate wires 93 are electrically connected to the source electrodes 60, the drain electrodes 70, and the gate electrodes 80, respectively. Specifically, contacts 94, 95, 96 are formed so as to reach each of the source electrode 60, the drain electrode 70, and the gate electrode 80 in an insulating layer 90 applied to an insulating layer 50 (both shown in FIG. 15) where the source electrode 60, the drain electrode 70, and the gate electrode 80 are formed. The source wires 91, the drain wires 92, and the gate wires 93 are connected to the source electrodes 60, the drain electrodes 70, and the gate electrodes 80 by the contacts 94, 95, 96. The source wires 91, the drain wires 92, and the gate wires 93 are electrically connected to the source electrode pads 22, the drain electrode pads 21, and the gate electrode pads 23, respectively.

Plural groups of the contact 94 (hereinafter referred to as "the groups of contacts 94") that connect the source electrode 60 and the source wire 91 are arranged on each source electrode finger 62 in the third direction V. The plural (four in the present embodiment) groups of contacts 94 are spaced apart from one another at a certain interval in the third direction V. The groups of contacts 94 at the two ends in the third direction V have fewer contacts 94 than the other group of contacts 94. Plural groups of contacts 95 (hereinafter referred to as "the groups of contacts 95") that connect the drain electrode 70 and the drain wire 92 are arranged on each drain electrode finger 71 in the third direction V. The plural (three in the present embodiment) groups of contacts 95 are spaced apart from one another at a certain interval in the third direction V. Plural groups of the contacts 96 (hereinafter referred to as "the groups of contacts 96") that connect the gate electrode 80 and the gate wire 93 are arranged in the fourth direction W on the extensions 84 at the two ends of the group-III nitride semiconductor stacked structure 24. The plural groups of contacts 96 are spaced apart from one another at a certain interval in the fourth direction W. The groups of contacts 96 are arranged at positions corresponding to the positions of the source electrode finger 62 and the gate electrode finger 82 in the fourth direction W.

The source wires 91, the drain wires 92, and the gate wires 93 each extend in the fourth direction W. The source wires 91 and the drain wires 92 extend across the source electrode fingers 62 and the drain electrode fingers 71 in the fourth direction W. The source wires 91 and the drain wires 92 are alternately arranged in the third direction V. The gate wires 93 are located outward (toward non-active region 27) from the source electrode fingers 62 of the source electrodes 60 and the drain electrode fingers 71 of the drain electrodes 70 in the third direction V. The source wires 91 located at the outermost side (side of non-active region 27) in the third direction V of the plurality of source wire 91 (hereinafter may also be referred to as "the source wires 91 at the outer sides") are adjacent to the gate wires 93 in the third direction V. The source wires 91 at the outer sides cover each source electrode finger 62 of the source electrodes 60 in the third direction V and also cover part of the non-active region 27.

The number of source wires 91 is greater than the number of drain wires 92. The source wires 91 at the outer sides each have a width (width dimension in the third direction V) that is smaller than the width of the other source wires 91. The width of the other source wires 91 is equal to the width of the drain wires 92 (width dimension in the third direction V). The gate wires 93 each have a width (width dimension in the third direction V) that is smaller than the widths of the source wires 91 and the drain wires 92.

The width, shape, and number of the source wires 91, the drain wires 92, and the gate wires 93 may be set in any manner. For example, the number of the source wires may be equal 91 to the number of the drain wires 92.

Figure 15:
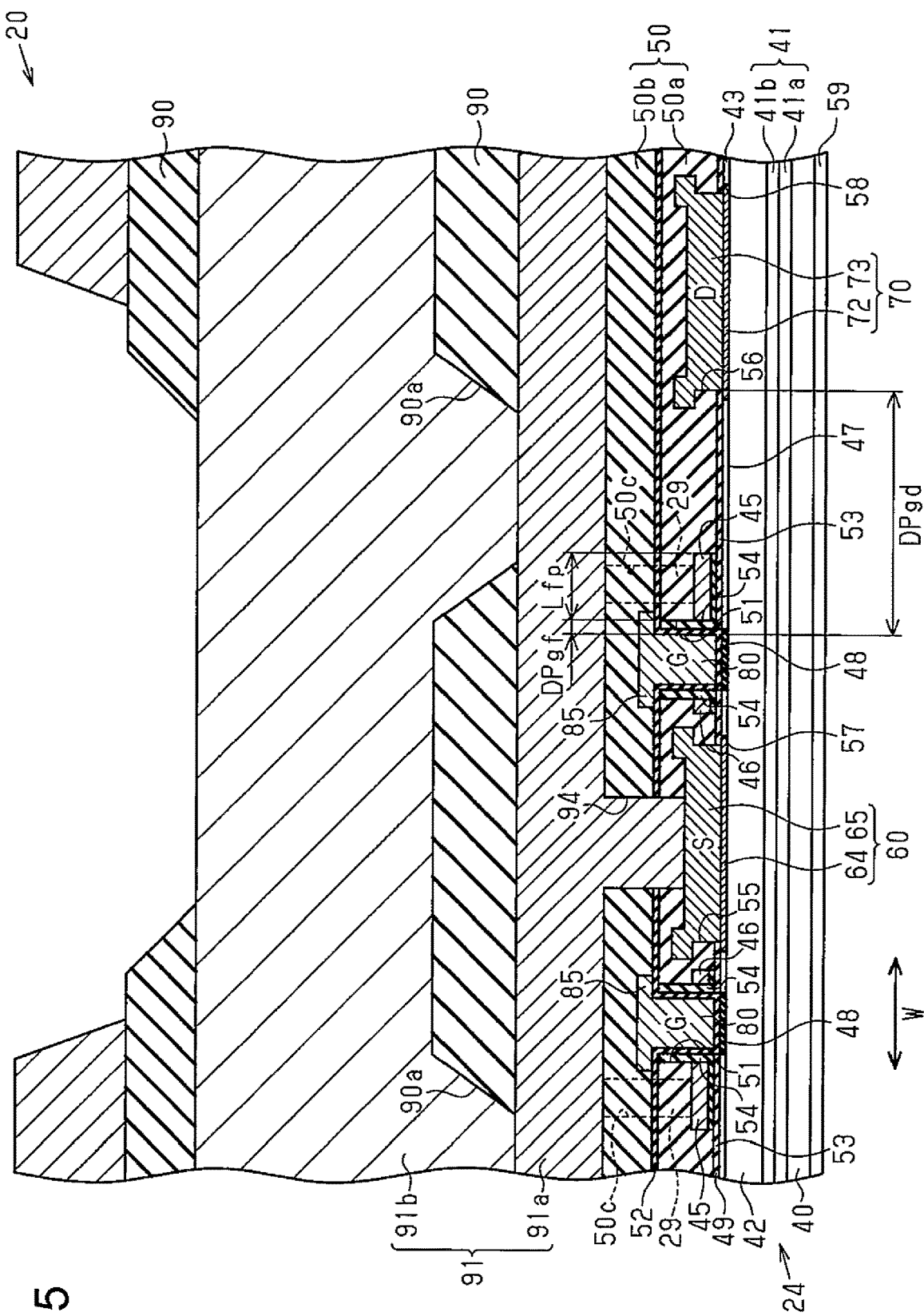
FIG. 15 is a cross-sectional view taken along line 15-15 in FIG. 14A.

As shown in FIG. 15, the group-III nitride semiconductor stacked structure 24 includes a substrate 40, a buffer layer 41 formed on the front surface of the substrate 40, an electron travel layer 42 epitaxially grown on the buffer layer 41, and an electron supply layer 43 epitaxially grown on the electron travel layer 42. A back electrode 59 is formed on a back surface of the substrate 40. The back electrode 59 is electrically connected to the source electrode 60 to function as a source potential.

The substrate 40 is, for example, a conductive silicon substrate that has, for example, an impurity concentration of $1 \times 10^{12}$ cm$^{-3}$ to $1 \times 10^{20}$ cm$^{-3}$ (more specifically, about $1 \times 10^{18}$ cm$^{-3}$).

The buffer layer 41 is, for example, a multi-layered buffer layer in which a first buffer layer 41a and a second buffer layer 41b are stacked one after another. The first buffer layer 41a is in contact with the front surface of the substrate 40. The second buffer layer 41b is applied to a front surface of the first buffer layer 41a (surface on opposite side of substrate 40). The first buffer layer 41a is, for example, configured by an AlN film and has a film thickness of, for example, about 0.2 μm. The second buffer layer 41b is, for example, configured by an AlGaN film and has a film thickness of, for example, about 0.2 μm.

The electron travel layer 42 and the electron supply layer 43 include a group-III nitride compound semiconductor (hereinafter simply referred to as "nitride semiconductor") having different Al compositions. The electron travel layer 42 includes, for example, a GaN layer and has a thickness of, for example, about 0.5 μm. The electron supply layer 43 includes, for example, a $Al_xGa_{1-x}N$ layer (0<x<1) and has a thickness of, for example, greater than or equal to 5 nm and less than or equal to 30 nm (more specifically, about 20 nm).

In this manner, the electron travel layer 42 and the electron supply layer 43 include nitride semiconductors having different Al compositions and form a hetero junction, in which a lattice mismatch occurs in between. Due to the polarization caused by the hetero junction and the lattice mismatch, a two-dimensional electron gas 47 spreads at a position close to the interface of the electron travel layer 42 and the electron supply layer 43 (e.g., position located at a distance of about a few Å from the interface).

In the electron travel layer 42, for example, a shallow donor level $E_D$, a deep donor level $E_{DD}$, a shallow acceptor level $E_A$, and a deep acceptor level $E_{DA}$ are formed in terms of an energy band structure.

The shallow donor level $E_D$ is, for example, an energy level at a position spaced apart by 0.025 eV or less from an energy level $E_C$ of a lower end (bottom) of a conduction band of the electron travel layer 42 and may simply be referred to as "the donor level $E_D$" if it can be distinguished from the deep donor level $E_{DD}$. Normally, the electron of the donor doped at this position is excited by the conduction band even at a room temperature (about heat energy kT=0.025 eV) and becomes a free electron. The impurities doped to the electron travel layer 42 including the GaN layer to form the shallow donor level $E_D$ include, for example, at least one type of Si or O. The deep donor level $E_{DD}$ is, for example, an energy level at a position spaced apart by 0.025 eV or greater from the energy level $E_C$ of the lower end (bottom) of the conduction band of the electron travel layer 42. That is, the deep donor level $E_{BB}$ is formed by doping a donor in which an ionization energy necessary for excitation is greater than the heat energy of the room temperature. Therefore, normally, the electron of the donor doped at this position is not excited by the conduction band at room temperature and is in a state captured by the donor.

The shallow acceptor level $E_A$ is, for example, an energy level at a position spaced apart by 0.025 eV or less from the energy level $E_V$ of an upper end (top) of a valence electron of the electron travel layer 42 and may simply be referred to as "the acceptor level $E_A$" if it can be distinguished from the deep acceptor level $E_{DA}$. Normally, a hole of the acceptor doped to the relevant position is excited by a valence band even at room temperature (about heat energy kT=0.025 eV) and becomes a free hole. The deep acceptor level $E_{DA}$ is, for example, an energy level at a position spaced apart by greater than or equal to 0.025 eV from the energy level $E_V$ of the upper end (top) of the valence electron of the electron travel layer 42. That is, the deep acceptor level $E_{DA}$ is formed by doping an acceptor in which the ionization energy necessary for excitation is greater than the heat energy of the room temperature. Therefore, normally, the hole of the acceptor doped at this position is not excited by the valence band at room temperature and is in a state captured by the acceptor. The impurities doped in the electron travel layer 42 including the GaN layer for forming the deep acceptor level $E_{DA}$ includes, for example, at least one type selected from a group consisting of C, Be, Cd, Ca, Cu, Ag, Sr, Ba, Li, Na, K, Sc, Zr, Fe, Co, Ni, Ar, and He.

In the present embodiment, the concentrations of the impurities (dopant) that form the shallow donor level $E_D$, the deep donor level $E_{DD}$, the shallow acceptor level $E_A$, and the deep acceptor level $E_{DA}$ described above is referred to as the shallow donor concentration $N_D$, the deep donor concentration $N_{DD}$, the shallow acceptor concentration $N_A$, and the deep acceptor concentration $N_{DA}$. For example, if only C (carbon) is doped to the electron travel layer 42 at a concentration of $0.5 \times 10^{16}$ cm$^3$ as the impurity for forming the deep acceptor level $E_{DA}$, the carbon concentration is defined as the deep acceptor concentration $N_{DA}$. Such concentrations $N_D$, $N_{DD}$, $N_A$, and $N_{DA}$ can be measured through, for example, Secondary Ion Mass Spectrometry (SIMS).

The impurity concentration for the entire electron travel layer 42 is preferably $N_A\ N_{BA}-N_D-N_{DD}>0$. This inequality equation means that the sum $(N_A+N_{BA})$ of the impurity concentrations of an acceptor atom that can capture the released electron is greater than the sum ($N_D+N_{DD}$) of the impurity concentrations of a donor atom that can release the electron. That is, in the electron travel layer 42, substantially all of the electrons released from the shallow donor atom and the deep donor atom are captured by the shallow acceptor atom or the deep acceptor atom without being excited by the conduction band. Thus, the electron travel layer 42 is a semi-insulating i-type GaN.

In the present embodiment, for example, the shallow donor concentration $N_D$ is greater than or equal to $1\times10^{16}$ cm$^{-3}$ and less than or equal to $1\times10^{17}$ cm$^{-3}$, and the deep donor concentration $N_{DD}$ is greater than or equal to $1\times10^{16}$ cm$^{-3}$ and less than or equal to $1\times10^{17}$ cm$^{-3}$. The shallow acceptor concentration $N_A$ is greater than or equal to $1\times10^{16}$ cm$^{-3}$ and less than or equal to $5\times10^{16}$ cm$^{-3}$, and the deep acceptor concentration $N_{BA}$ is greater than or equal to $1\times10^{16}$ cm$^3$ and less than or equal to $1\times10^{18}$ cm$^{-3}$.

The electron supply layer 43 includes, for example, an AlN layer having a thickness of about a few atomic thickness (less than or equal to 5 nm, preferably greater than or equal to 1 nm and less than or equal to 5 nm, more preferably greater than or equal to 1 nm and less than or equal to 3 nm) at the interface of the electron supply layer 43 and the electron travel layer 42. Such an AlN layer limits the scattering of electrons and contributes to improving the electron mobility.

An oxide film 48 is selectively formed on the front surface of the electron supply layer 43 extending to the electron travel layer 42. The oxide film 48 has a film thickness substantially equal to the electron supply layer 43. The oxide film 48 is, for example, a thermal oxide film, and formed without damaging the interface of the oxide film 48 and the electron travel layer 42. When the electron supply layer 43 is the AlN layer, the oxide film 48 may include an AlON film.

Furthermore, the transistor 20 further includes a ground layer 49 and an insulating layer 50 formed on the group-III nitride semiconductor stacked structure 24.

The ground layer 49 is formed on the entire front surface of the group-III nitride semiconductor stacked structure 24 including forming regions of the drain electrode 70 and the source electrode 60. The ground layer 49 includes, for example, a SiN film, and has a thickness of, for example, greater than or equal to 5 nm and less than or equal to 200 nm.

The insulating layer 50 covers the ground layer 49 and includes a first layer 50a and a second layer 50b, which is formed on the first layer 50a. For example, the first layer 50a and the second layer 50b both include a SiO$_2$ film. The insulating layer 50 has a thickness of, for example, 1.5 µm or greater and 2 µm or less. Individually, the first layer 50a has a thickness of, for example, 500 nm or greater and 1000 nm or less, and the second layer 50b has a thickness of, for example, 500 nm or greater and 1000 nm or less.

The first layer 50a and the ground layer 49 include gate openings 51 that extend to the group-III nitride semiconductor stacked structure 24. The oxide film 48 is exposed at the bottom of each gate opening 51. A gate insulating film 52 is formed in each gate opening 51 so as to cover the bottom and side of the gate opening 51. The gate insulating film 52 is also formed between the first layer 50a and the second layer 50b in addition to the inside of the gate opening 51. The gate insulating film 52 includes a material film of at least one type selected from a group consisting of, for example, Si, Al, and Hf as a constituent element. Specifically, the gate insulating film 52 includes a material film of at least one type selected from a group consisting of SiN, SiO$_2$, SiON, Al$_2$O$_3$, AlN, AlON, HfSiO, HfO$_2$, and the like. Preferably, the gate insulating film 52 includes the Al$_2$O$_3$ film. The gate insulating film 52 has a thickness of, for example, 10 nm of greater and 100 nm or less.

The gate electrode 80 is buried in the gate opening 51. The gate electrode 80 includes, for example, an overlap portion 85 formed on the gate insulating film 52 at a peripheral edge of the gate opening 51. The gate electrode 80 may be filled in the gate opening 51 so as not to bulge project upward from the open end of the gate opening 51. The gate electrode 80 may be made from, for example, a metal electrode of Mo, Ni, and the like, or may be made from a semiconductor electrode of doped polysilicon, and the like. Since the metal electrode has burying properties that are inferior to polysilicon, the overlap portion 85 can be easily formed when the metal electrode is used.

The source field plate 45 and the floating plate 46 are arranged beside the gate electrode 80 so as to partially form the side of the gate opening 51. Specifically, the source field plate 45 and the floating plate 46 are formed by the insulating layer 53 on the ground layer 49 so as to be exposed toward the inside of the gate opening 51 at the lower part of the side of the gate opening 51. That is, the side of the gate opening 51 includes a stacked interface of a conductive layer/insulating layer in which the lower side is formed by the source field plate 45 and the floating plate 46 and the upper side is formed by the insulating layer 50 (first layer 50a).

An insulative side wall 54 is formed at the side of the gate opening 51 so as to contact the source field plate 45 and the floating plate 46. That is, the side wall 54 is arranged between the side of the gate opening 51 and the gate insulating film 52. The side wall 54 includes a material film of at least one type selected from a group consisting of, for example, SiO$_2$, SiN, and SiON. Preferably, the side wall 54 includes the SiO$_2$ film. The side wall 54 has a thickness of, for example, 10 nm or greater and 200 nm or less.

The source field plate 45 and the floating plate 46 are insulated from the gate electrode 80 by the side wall 54 and the gate insulating film 52. The distance DPgf from the gate electrode 80 to the source field plate 45 and the floating plate 46 in the fourth direction W is, for example, 1 µm, and preferably 50 nm or greater and 200 nm or less. The distance DPgf of the present embodiment is defined by the total of the thicknesses of the gate insulating film 52 and the side wall 54. If the side wall 54 is omitted, the distance DPgf is defined by the thickness of the gate insulating film 52. The relationship of the length Lfp of the source field plate 45 in the fourth direction W and the distance DPgd between the gate electrode 80 and the drain electrode 70 in the fourth direction W satisfies Lfp<⅓DPgd. When a withstanding pressure of the semiconductor device 1 is less than or equal to 200 V, the length Lfp is, for example, 0.25 µm or greater and 1.5 µm or less, and the distance DPgd is, for example, 1 µm or greater and 6 µm or less. The source field plate 45 and the floating plate 46 include, for example, an Mo film, and has a thickness of, for example, 10 nm or greater and 200 nm or less.

The insulating layer 50 and the ground layer 49 includes a source contact hole 55 and a drain contact hole 56 that extend to the group-III nitride semiconductor stacked structure 24. The source contact hole 55 and the drain contact hole 56 are formed at positions spaced apart in the lateral direction (fourth direction W) from the gate opening 51. The source electrode 60 and the drain electrode 70 are buried in the source contact hole 55 and the drain contact hole 56, respectively. The source electrode 60 and the drain electrode 70 are respectively electrically connected to the group-III nitride semiconductor stacked structure 24 in the source contact hole 55 and the drain contact hole 56.

The source contact hole 55 and the drain contact hole 56 each include ohmic contact openings 57 and 58 that are relatively larger than the insulating layer 50 in the ground layer 49. The source electrode 60 and the drain electrode 70 each include ohmic electrodes 64 and 72, which are located in the ohmic contact openings 57 and 58, and pad electrodes 65 and 73, which are located in the insulating layer 50. The ohmic electrodes 64 and 72 have ends in the third direction V of the space SP (see FIG. 14A) located at the corresponding positions but, for example, the end of the ohmic electrode 72 on the drain side may be selectively located toward the rear. The pad electrodes 65 and 73 are formed on the ohmic electrodes 64 and 72 with their tops exposed from the front surface of the insulating layers 50. The ohmic electrodes 64 and 72 and the pad electrodes 65 and 73 each include, for example, a Ti/Al film.

Although shown in a cross section that differs from the position shown in FIG. 15, the insulating layer 50 includes a contact hole 50c that extends to the source field plate 45. The source contact 29 is buried in the contact hole 50c. The source field plate 45 and the source contact 29 are thereby electrically connected.

As shown in FIG. 15, the source wire 91 includes a first wire 91a formed on the insulating layer 50 and a second wire 91b formed on the insulating layer 90. The first wire 91a is electrically connected to the source electrode 60 through a contact 94 extending to the source electrode 60 in the insulating layer 50. The second wire 91b is electrically connected to the source electrode pad 22 (see FIG. 2). The second wire 91b is electrically connected to the first wire 91a through a contact hole 90a extending to the first wire 91a in the insulating layer 90. Although not shown in FIG. 15, the drain wire 92 and the gate wire 93 (both shown in FIG. 13) are also formed on the insulating layer 50 and the insulating layer 90 in the same manner as the source wire 91.

According to the transistor 20, the electron supply layer 43 having a different Al composition is formed on the electron travel layer 42 to form the hetero junction, as described above. Thus, the two-dimensional electron gas 47 is thereby formed in the electron travel layer 42 near the interface of the electron travel layer 42 and the electron supply layer 43, and the HEMT using the two-dimensional electron gas 47 as a channel is formed. The gate electrode 80 faces the electron travel layer 42 with the stacked film of the oxide film 48 and the gate insulating film 52 in between, and the electron travel layer 42 does not exist immediately below the gate electrode 80. Therefore, the two-dimensional electron gas 47 resulting from the polarization caused by the lattice mismatch of the electron supply layer 43 and the electron travel layer 42 is not formed immediately below the gate electrode 80. Thus, when a bias is not applied (at time of zero bias) to the gate electrode 80, the channel formed by the two-dimensional electron gas 47 is shielded at immediately below the gate electrode 80. The normally OFF type HEMT is realized in such a manner. When an appropriate ON voltage (e.g., 5 V) is applied to the gate electrode 80, the channel is induced into the electron travel layer 42 immediately below the gate electrode 80, and the two-dimensional electron gas 47 on both sides of the gate electrode 80 is connected. This connects the source and the drain.

During use, a predetermined voltage (e.g., greater than or equal to 200 V and less than or equal to 400 V) at which the drain electrode 70 becomes positive, for example, is applied between the source electrode 60 and the drain electrode 70. In such a state, the OFF voltage (0 V) or the ON voltage (5 V) is applied to the gate electrode 80 using the source electrode 60 as a reference potential (0 V).

The interface of the oxide film 48 and the electron travel layer 42 is continuous with the interface of the electron supply layer 43 and the electron travel layer 42, and the state of the interface of the electron travel layer 42 immediately below the gate electrode 80 is the same as the state of the interface of the electron supply layer 43 and the electron travel layer 42. Thus, the electron mobility in the electron travel layer 42 immediately below the gate electrode 80 is held in a high state.

The transistor 20 of the present embodiment has the following advantages.

(20) The transistor 20 includes the source field plate 45 electrically connected to the source electrode 60 arranged between the gate and the drain. Thus, a gate field plate extending in the lateral direction (fourth direction W) on the gate insulating film 52 integrally from the gate electrode 80 is not needed. Thus, the capacitance between the gate and the drain can be reduced. As a result, the parasitic capacitance of the transistor 20 can be reduced. Thus, high speed switching operation, high frequency operation, and the like can be realized.

(21) The gate electrode 80 includes the side wall 54 that contacts the source field plate 45 and the floating plate 46. The gate insulating film 52 is formed so as to cover the side wall 54. Thus, the distance from the gate electrode 80 to the source field plate 45 and the floating plate 46 can be controlled mainly by the thickness of the side wall 54. Thus, the thickness of the gate insulating film 52 can be mainly designed in accordance with the intended gate threshold value voltage.

(22) The distance DPgf between the gate electrode 80, and the source field plate 45 and the floating plate 46 is less than or equal to 1 μm. According to such a configuration, the source field plate 45 and the floating plate 46 are arranged relatively close to the gate electrode 80, and thus the electric field concentration at each end of the source field plate 45 and the floating plate 46 can be lowered in a satisfactory manner.

(23) The relationship of the length Lfp of the source field plate 45 and the distance DPgd between the gate electrode 80 and the drain electrode 70 satisfies Lfp<⅓DPgd. According to such a configuration, the area of the source field plate 45 is relatively small so that the increase in capacitance between the drain and the source caused by the source field plate 45 can be limited.

(24) The conductive structure electrically connected to each of the source electrode 60 and the source field plate 45 across the upper side of the gate electrode 80 does not need to be arranged in the active region 26 as a structure for electrically connecting the source electrode 60 and the source field plate 45 by arranging the source contact 29 in the non-active region 27. When such a conductive structure is arranged in the active region 26, this may become a factor for increasing the parasitic capacitance of the semiconductor device 1. However, increases in the parasitic capacitance are limited by connecting the source electrode 60 and the source field plate 45 in the non-active region 27 as described above.

(25) The transistor 20 includes the electron travel layer 42 and the electron supply layer 43 that form the hetero junction. The electron supply layer 43 selectively includes the oxide film 48 at the bottom of the gate opening 51. According to such a configuration, the two-dimensional electron gas 47 immediately below the gate electrode 80 can be reduced, and thus a normally OFF type HMET can be realized.

(26) An asymmetric structure in which the distance between the gate electrode finger 82 and the drain electrode finger 71 is longer than the distance between the gate electrode finger 82 and the source electrode finger 62 is obtained. Thus, excessive increases are limited in the electric field generated between the gate electrode finger 82 and the drain electrode finger 71. This allows the withstanding pressure of the transistor 20 to be increased.

[DC/DC Converter]

The semiconductor device 1 described above can be applied to a DC/DC converter. The DC/DC converter can be applied to, for example, a power supply circuit for supplying power to a CPU, a primary side circuit in a contactless power supply, and the like.

Figure 16:
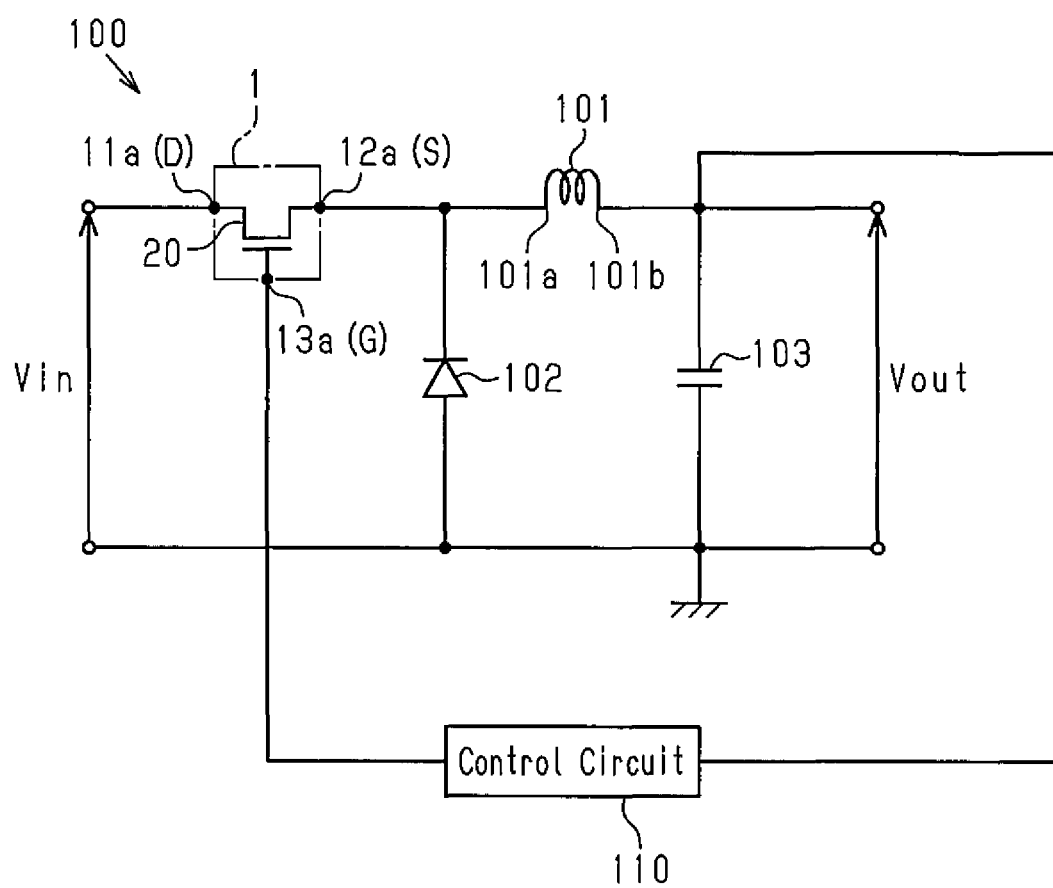
FIG. 16 is a circuit diagram of a DC/DC converter using the semiconductor device.

FIG. 16 is an example of the DC/DC converter, and shows a configuration of a chopper type DC/DC converter 100 that lowers and outputs an input voltage from an external power supply (not shown). The DC/DC converter 100 is driven at 30 MHz.

The DC/DC converter 100 includes the semiconductor device 1, a coil 101, a diode 102, a capacitor 103, and a control circuit 110. The drain (drain terminal 11a) of the semiconductor device 1 is electrically connected to the external power supply. A first end 101a of the coil 101 is electrically connected to the source (source terminal 12a) of the semiconductor device 1. A cathode of the diode 102 is electrically connected between the drain of the semiconductor device 1 and the first end 101a of the coil 101, and an anode of the diode 102 is grounded. One side of the capacitor 103 is electrically connected to a second end 101b of the coil 101, and the other side of the capacitor 103 is grounded.

The control circuit 110 is electrically connected to the gate of the semiconductor device 1 (gate terminal 13a). The control circuit 110 is electrically connected to a connection point of the second end 101b of the coil 101 and the capacitor 103. The control circuit 110 detects the voltage at the connection point of the second end 101b of the coil 101 and the capacitor 103 and outputs a gate signal of the semiconductor device 1 based on the detected voltage.

Second Embodiment

A configuration of the semiconductor device 1 of a second embodiment will be described with reference to FIGS. 17 and 18. The semiconductor device 1 of the present embodiment differs from the semiconductor device 1 of the first embodiment in the configuration of part of the source frame 12. In the following description, same reference numerals are denoted on the configuring elements same as the configuration of the semiconductor device 1 of the first embodiment, and the description thereof will be omitted.

Figure 17:
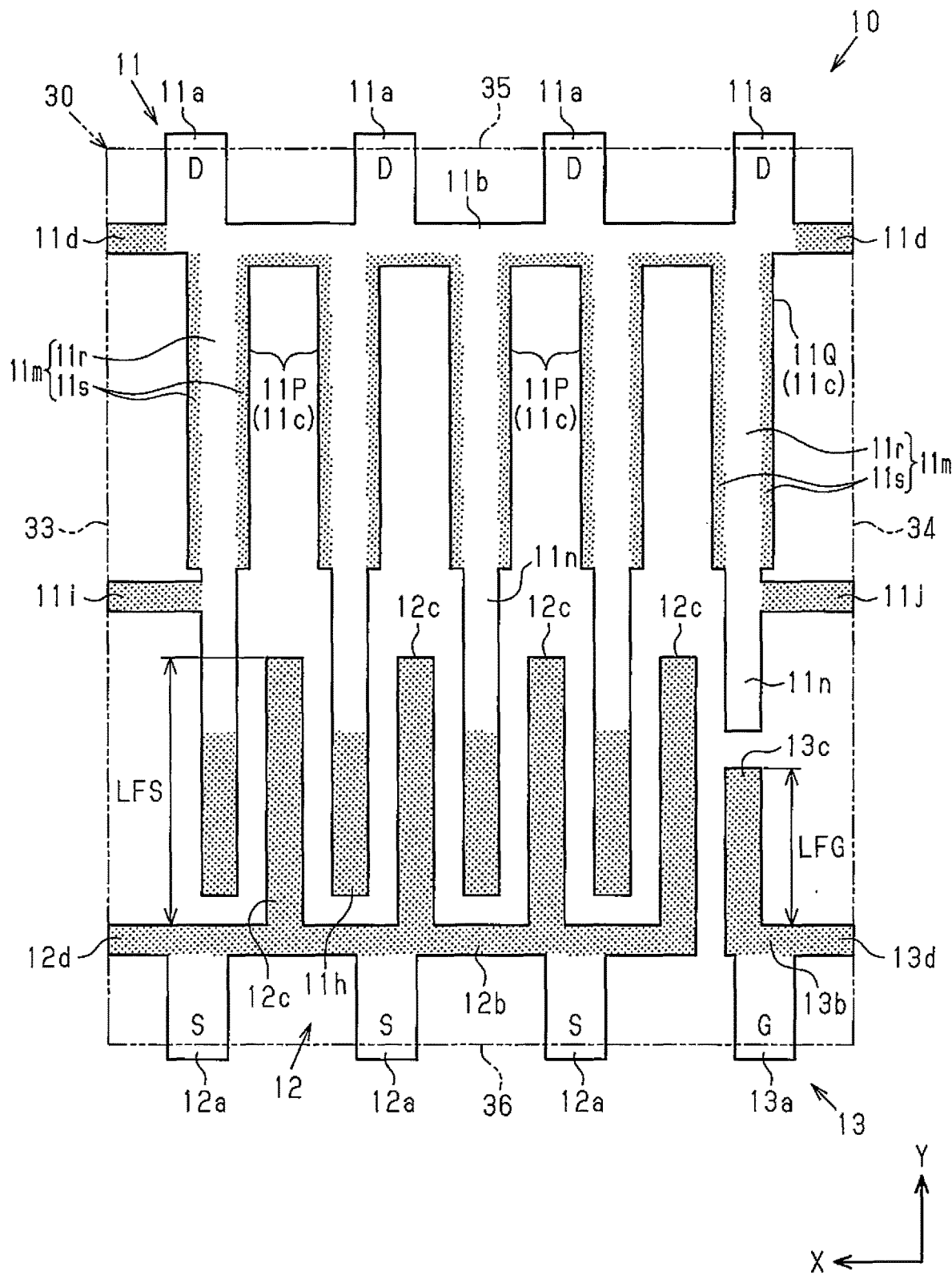
FIG. 17 is a plan view of a lead frame for a second embodiment of the semiconductor device.

As shown in FIG. 17, in the source frame 12, the length LFS of the source frame fingers 12c is shorter than the length LFS of the source frame fingers 12c of the first embodiment (see FIG. 3). The length LFS is greater than the length LFG of the gate frame finger 13c. In the second direction Y, the distal end of each source frame finger 12c is located closer to the second longitudinal side surface 36 of the encapsulation resin 30 than the second tie bar portions 11i and 11j of the drain frame finger 11c.

The length LFS can be set to any length within a range shorter than the length LFS (see FIG. 3) of the source frame finger 12c of the first embodiment and a length that allows for electrical connection to the source electrode pad 22. In one example, in the second direction Y, the distal end position of the source frame finger 12c may be the located at a position corresponding to the distal end position of the drain frame finger 11Q. In other words, as viewed in the first direction X, the source frame finger 12c may be overlapped with only the distal portion 11h (shaded portion of the drain frame finger 11P in FIG. 17) of the drain frame finger 11P. Thus, in the region where the drain frame fingers 11P are overlapped with the source frame fingers 12c in the first direction X, the drain frame fingers 11P and the source frame fingers 12c are both not exposed from the back surface 32 (see FIG. 9) of the encapsulation resin 30. In another example, the length LFS may be equal to the length LFG.

Figure 18:
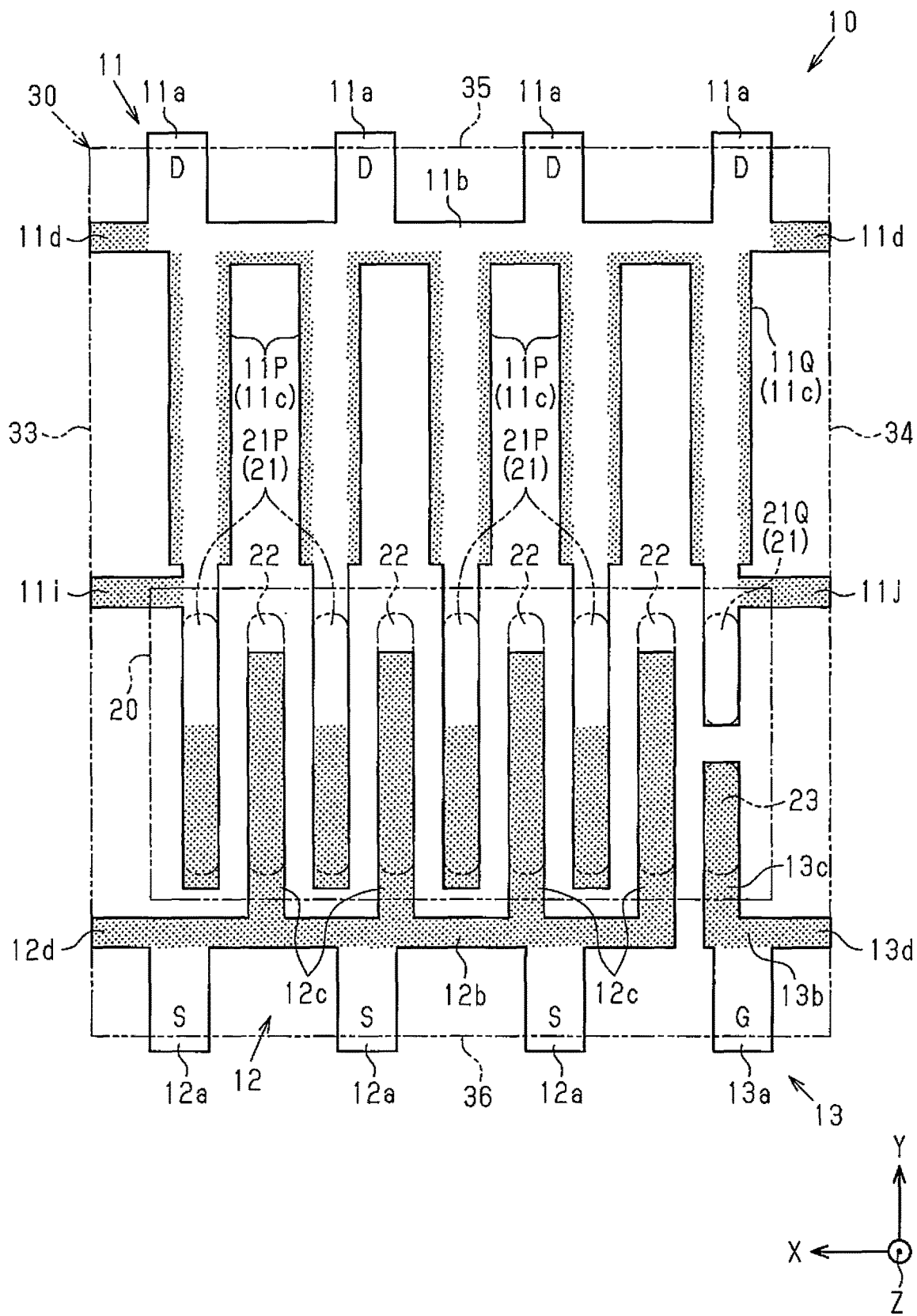
FIG. 18 is a plan view of a transistor mounted on the lead frame of FIG. 17.

As shown in FIG. 18, when the transistor 20 is mounted on the lead frame 10, the distal end of each source frame finger 12c is located slightly closer to the second longitudinal side surface 36 than the end of each source electrode pad 22 of the transistor 20 located closer to the first longitudinal side surface 35 of the encapsulation resin 30 in the second direction Y. In other words, the portion in the source electrode pad 22 that is closer to the second longitudinal side surface 36 faces the source frame finger 12c in the height direction Z, and the end closer to the first longitudinal side surface 35 in the source electrode pad 22 does not face the source frame finger 12c in the height direction Z. Thus, the portion closer to the second longitudinal side surface 36 of the source electrode pad 22 is electrically connected to the source frame finger 12c. In other words, the source frame finger 12c is partially connected to the source electrode pad 22.

The semiconductor device 1 of the present embodiment has the following effects.

(27) The distal end of each source frame finger 12c is located closer to the second longitudinal side surface 36 than the end of each source electrode pad 22 in the transistor 20 located closer to the first longitudinal side surface 35 of the encapsulation resin 30. Since the length LFS of the source frame finger 12c is short, the rigidity of the source frame finger 12c can be improved. Therefore, when the transistor 20 is mounted on the source frame finger 12c, deformation of the source frame finger 12c is limited while maintaining the electrical connection of the source frame finger 12c and the source electrode pad 22. Therefore, exposure of the source frame finger 12c is limited from the back surface 32 of the encapsulation resin 30.

Third Embodiment

A configuration of the semiconductor device 1 of a third embodiment will now be described with reference to FIGS. 19 to 21. The semiconductor device 1 of the present embodiment differs from the semiconductor device 1 of the first embodiment in that a heat dissipation plate 130 is added. In the following description, same reference numerals are denoted on the configuring elements same as the configuration of the semiconductor device 1 of the first embodiment, and the description thereof will be omitted.

Figure 19:
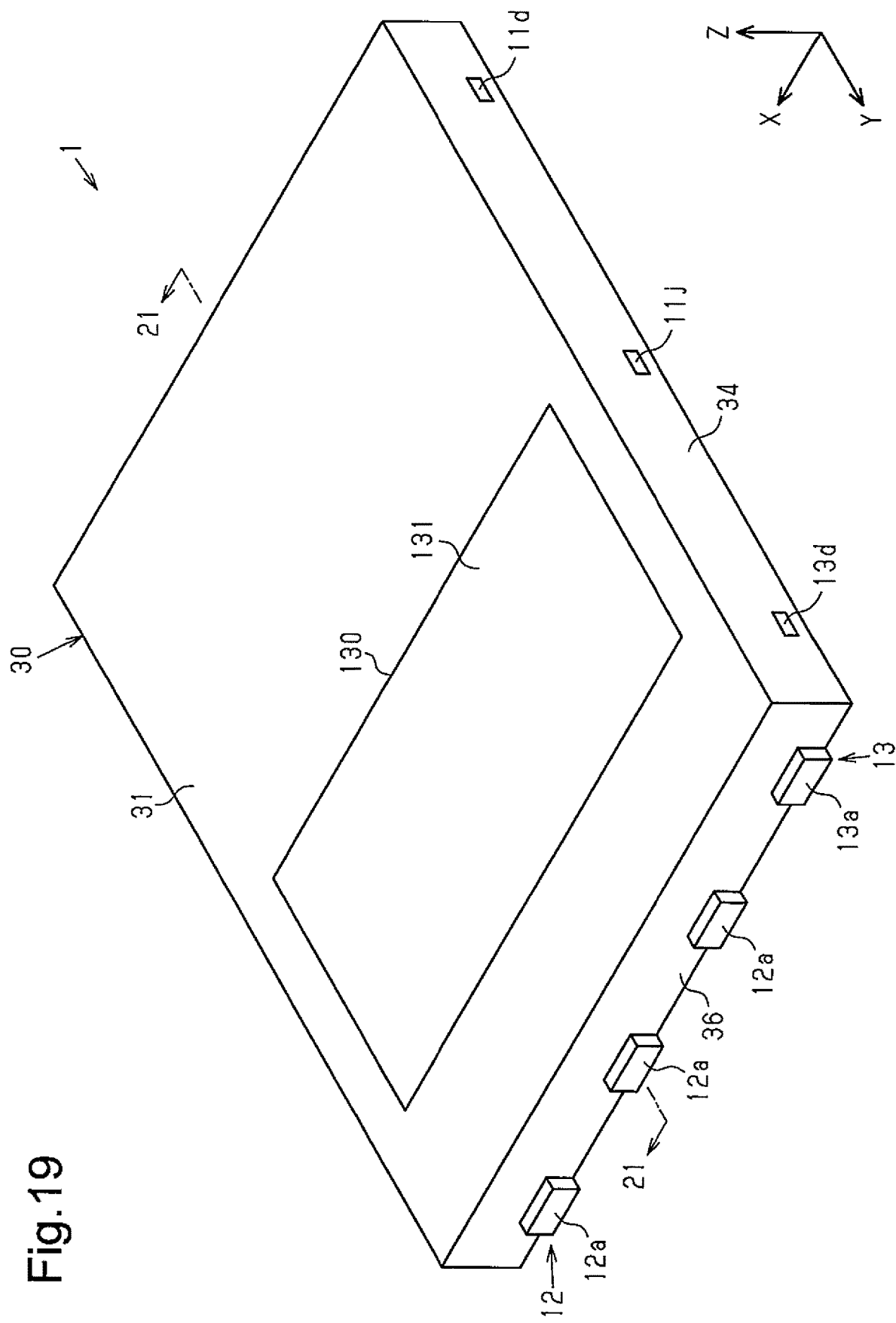
FIG. 19 is a perspective view of a third embodiment of the semiconductor device.

As shown in FIG. 19, the heat dissipation plate 130 is exposed from the front surface 31 of the encapsulation resin 30. The heat dissipation plate 130 exposed from the front surface 31 is rectangular and elongated so that the longitudinal direction is the first direction X. Preferably, the heat dissipation plate 130 is located toward the second longitudinal side surface 36 (toward source terminal 12a and gate terminal 13a) of the encapsulation resin 30. The heat dissipation plate 130 is made from a metal material having superior heat dissipation properties, such as, for example, copper and aluminum.

Figure 20:
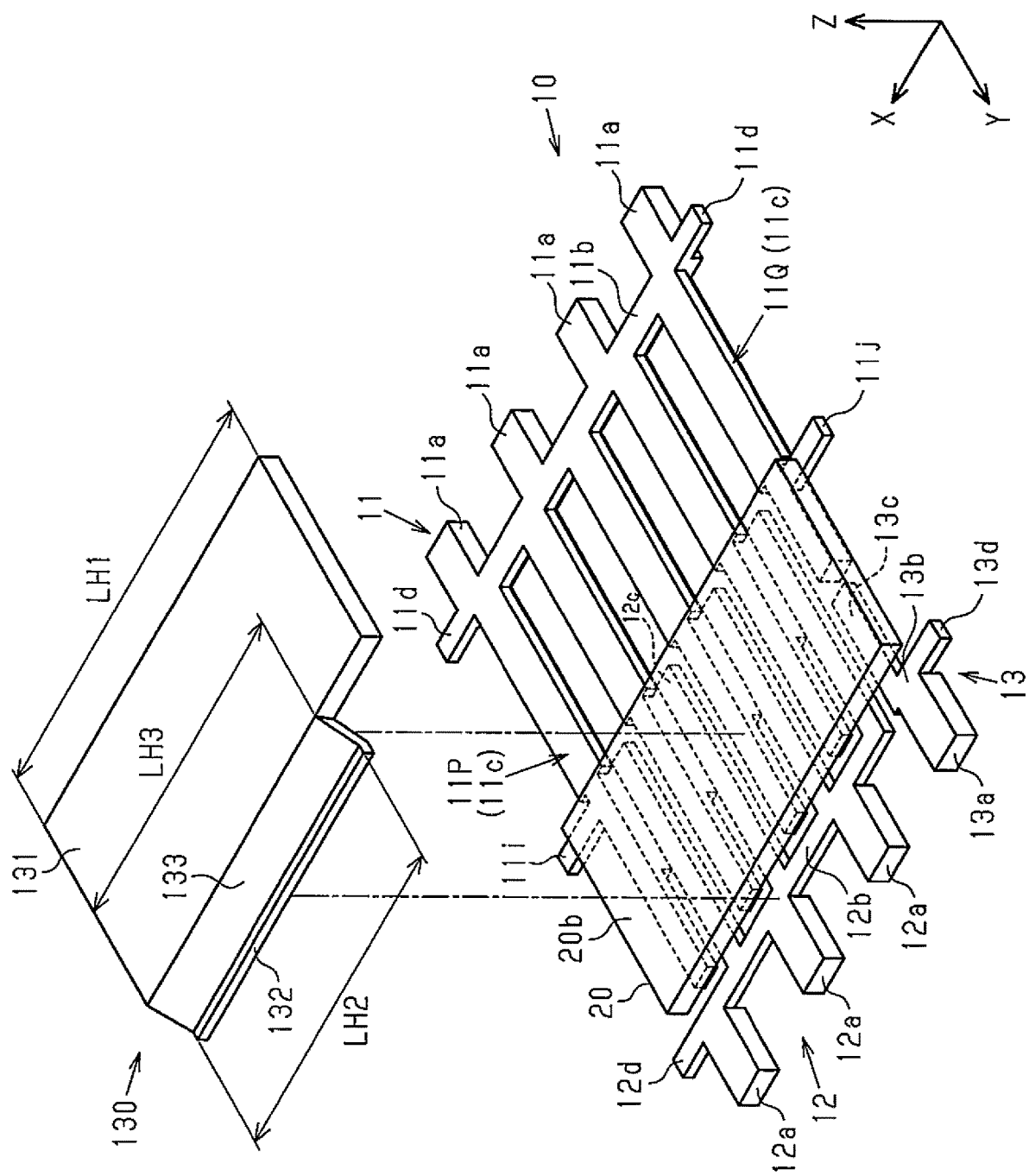
FIG. 20 is an exploded perspective view of the semiconductor device of FIG. 19.
Figure 21:
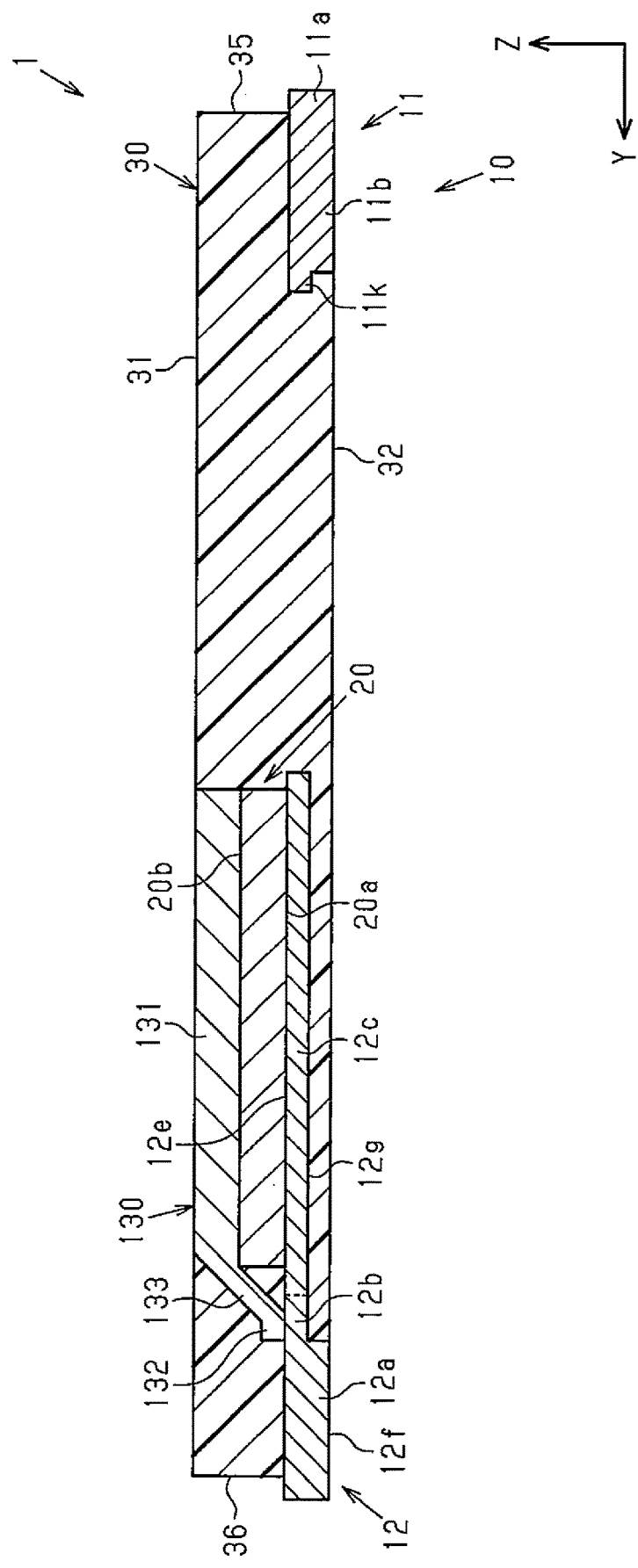
FIG. 21 is a cross-sectional view taken along line 21-21 in FIG. 19.

As shown in FIG. 20, the heat dissipation plate 130 includes a cover 131 that covers the back surface 20b of the transistor 20, a clip 132 that is connected to the source frame 12, and a coupling portion 133 that couples the cover 131 and the clip 132. The cover 131, the clip 132, and the coupling portion 133 are formed by, for example, the same member.

The cover 131 is rectangular in a plan view. The cover 131 covers the entire back surface 20b of the transistor 20. The cover 131 is electrically connected to the back electrode 59 (see FIG. 15) of the transistor 20. Thus, the cover 131 functions as a source potential. As shown in FIG. 19, the cover 131 includes a portion exposed from the front surface 31 of the encapsulation resin 30. As shown in FIG. 21, the cover 131 is in contact with the back surface 20b of the transistor 20.

The cover 131 may have any shape in a plan view. For example, the shape of the cover 131 may be substantially rectangular in which the four corners of the cover 131 are rounded. Alternatively, the cover 131 may be elliptical in which the long axis extends in the first direction X. Furthermore, the cover 131 may partially cover the back surface 20b of the transistor 20. The cover 131 need only partially cover the back surface 20b of the transistor 20.

As shown in FIG. 20, the clip 132 extends in the first direction X. The length LH2 of the clip 132 in the first direction X is shorter than the length LH1 of the cover 131 in the first direction X. As shown in FIG. 21, the clip 132 is located closer to the second longitudinal side surface 36 of the encapsulation resin 30 than the cover 131 in the second direction Y. Further, the clip 132 is located closer to the lead frame 10 than the cover 131 in the height direction Z. The clip 132 is in contact with the source coupling portion 12b of the source frame 12. In other words, the clip 132 is electrically connected to the source frame 12. The clip 132 is not in contact with the gate frame 13.

As shown in FIG. 20, the coupling portion 133 extends from the end face of the cover 131 located closer to the clip 132 toward the clip 132. The length LH3 of the coupling portion 133 in the first direction X is equal to the length LH2 of the clip 132. As shown in FIG. 21, the coupling portion 133 is inclined toward the lead frame 10 (back surface 32) from the cover 131 toward the second longitudinal side surface 36. The clip 132 may be omitted from the heat dissipation plate 130. Alternatively, the clip 132 and the coupling portion 133 may be omitted from the heat dissipation plate 130.

The semiconductor device 1 of the present embodiment has the following advantages.

(28) The semiconductor device 1 includes the heat dissipation plate 130. Thus, the heat of the transistor 20 is easily dissipated to the outside of the semiconductor device 1 through the heat dissipation plate 130. Therefore, the temperature of the transistor 20 does not become excessively high.

(29) The cover 131 of the heat dissipation plate 130 covers the entire back surface 20b of the transistor 20. Thus, compared to when the heat dissipation plate partially covers the back surface 20b of the transistor 20, the heat of the transistor 20 is easily dissipated to the outside of the semiconductor device 1. This further ensures that the temperature of the transistor 20 does not become excessively high.

Fourth Embodiment

A configuration of the semiconductor device 1 of a fourth embodiment will now be described with reference to FIGS. 22 and 23. The semiconductor device 1 of the present embodiment differs from the semiconductor device 1 of the first embodiment in the shape of the drain frame 11. In the following description, same reference numerals are denoted on the configuring elements same as the configuration of the semiconductor device 1 of the first embodiment, and the description thereof will be omitted.

Figure 22:
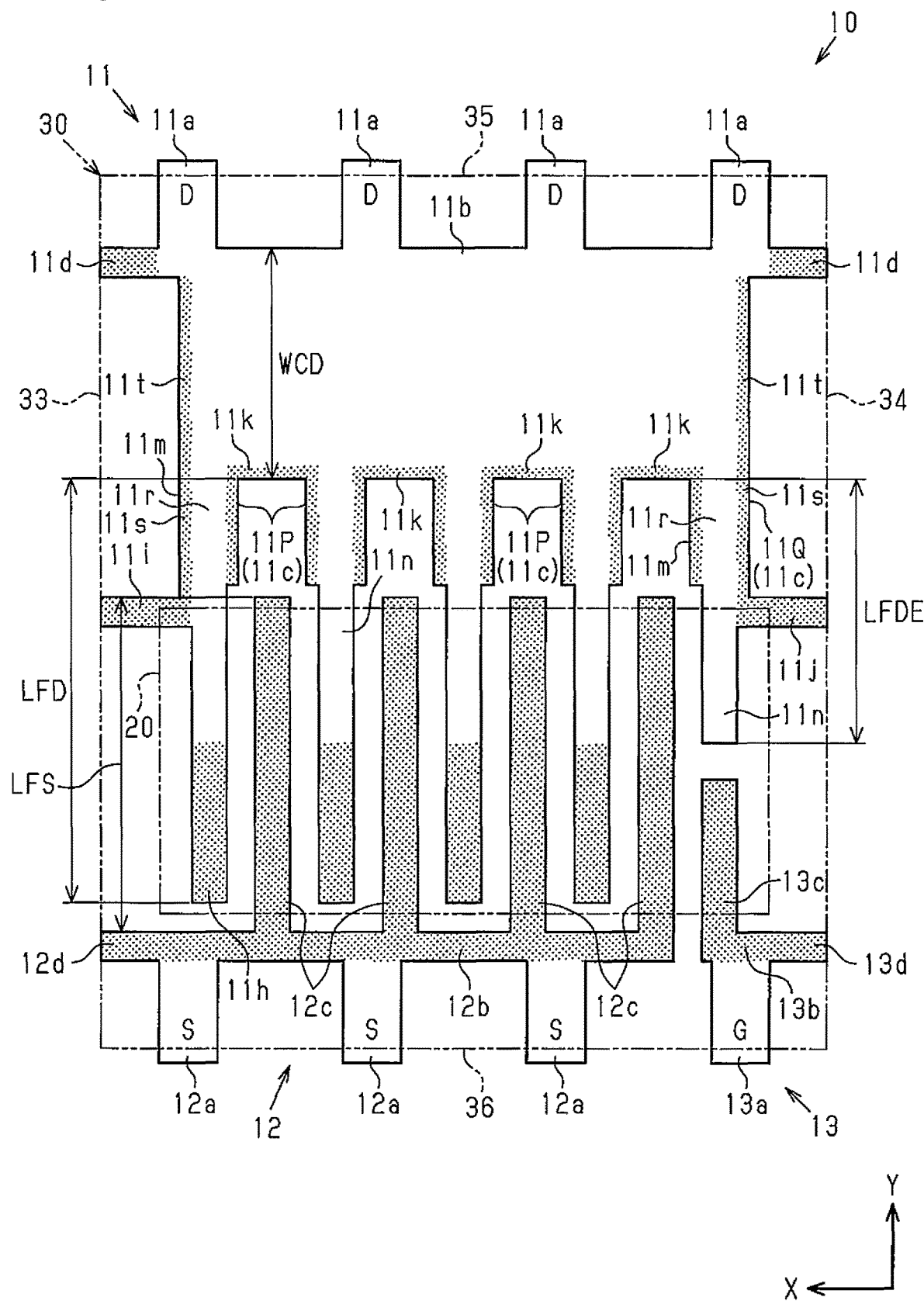
FIG. 22 is a plan view of a lead frame for a fourth embodiment of the semiconductor device.

As shown in FIG. 22, the width WCD of the drain coupling portion 11b of the drain frame 11 is greater than the width WCD of the drain coupling portion 11b of the first embodiment (see FIG. 3). In the second direction Y, a gap is formed between an edge of the drain coupling portion 11b located closer to the second longitudinal side surface 36 of the encapsulation resin 30 and an edge of the transistor 20 closer to the first longitudinal side surface 35 of the encapsulation resin 30. The size of the width WCD of the drain coupling portion 11b can be changed.

When the width WCD of the drain coupling portion 11b is increased, the length LFD of the drain frame finger 11P becomes less than the length LFD of the drain frame fingers 11P of the first embodiment (see FIG. 3), and the length LFDE of the drain frame finger 11Q becomes less than the length LFDE of the drain frame finger 11Q of the first embodiment (see FIG. 3). The length LFD of the drain frame fingers 11P in the present embodiment is greater than the length LFS of the source frame fingers 12c, and the length LFDE of the drain frame finger 11Q is shorter than the length LFS. In the present embodiment, the length of the second section 11n is not changed, and the length of the first section 11m is decreased. The length LFD can be changed. For example, the length LFD may be equal to the length LFS.

The two ends 11t of the drain coupling portion 11b in the first direction X are continuous with the flange 11s of the drain frame finger 11P that is located closest to the first lateral side surface 33 and the flange 11s of the drain frame finger 11Q. The thickness of the drain coupling portion 11b at the two ends 11t is less than the thickness of other parts excluding the end 11k and the two ends 11t of the drain coupling portion 11b and equal to the thickness TD5 of the flanges 11s. The two ends 11t of the drain coupling portion 11b are not exposed from the back surface 32 of the encapsulation resin 30.

Furthermore, the flange 11s of the drain frame finger 11P that is closes to the first lateral side surface 33 and the flange 11s of the drain frame finger 11Q are continuous with the second tie bar portions 11i and 11j. The length in the second direction Y of the two ends 11t of the drain coupling portion 11b and the length in the second direction Y of the flanges 11s can be set in any manner. For example, the length in the second direction Y of the two ends 11t of the drain coupling portion 11b and the flanges 11s may be set to form a gap extending in the second direction Y from the two ends 11t of the drain coupling portion 11b to the flanges 11s. The length of the flanges 11s in the second direction Y may be set to form a gap extending from the flanges 11s to the second tie bar portion 11i, 11j in the second direction Y.

Figure 23:
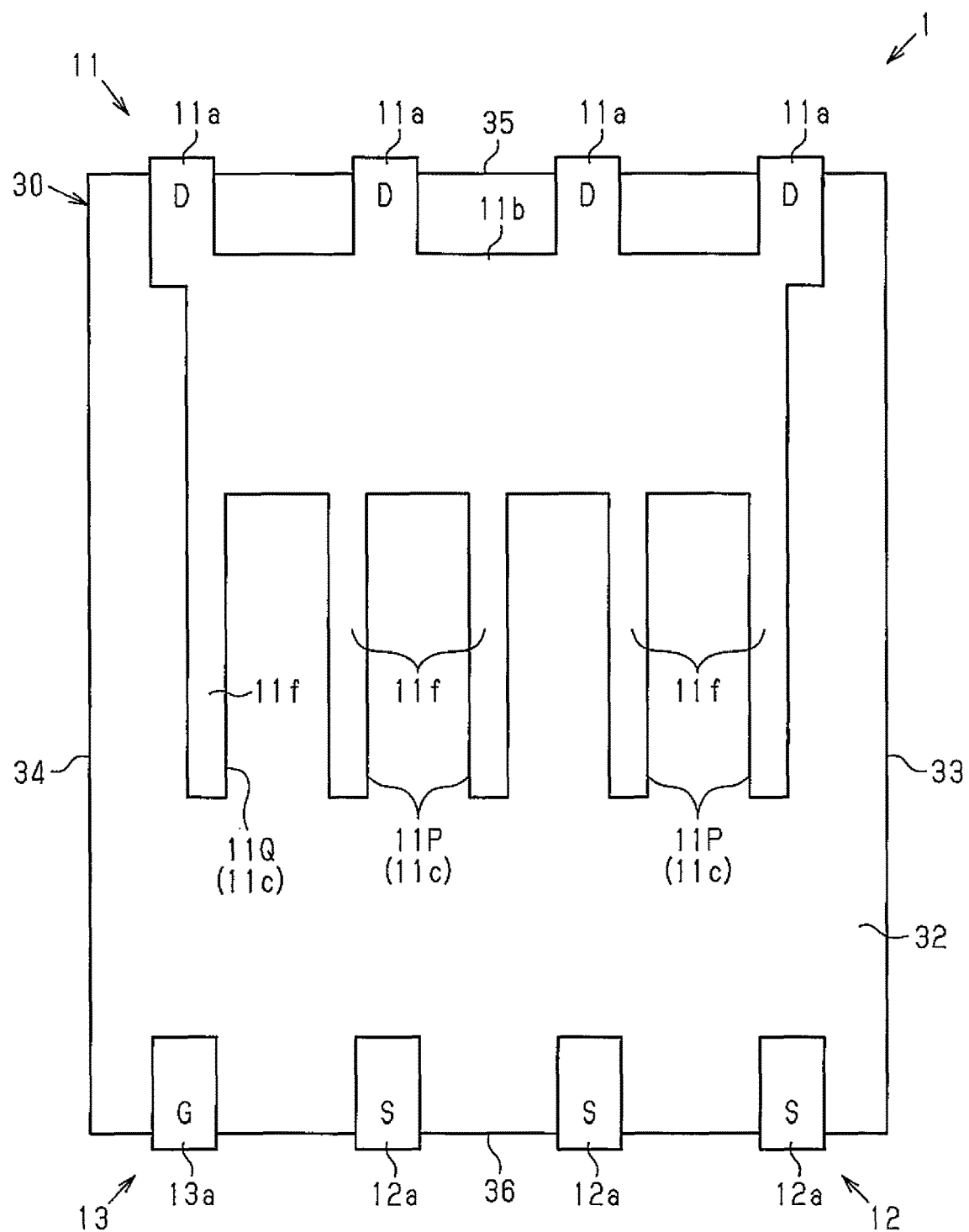
FIG. 23 is a bottom view of the semiconductor device including the lead frame of FIG. 22.

As shown in FIG. 23, the drain coupling portion 11b is exposed from the back surface 32 of the encapsulation resin 30. Thus, the area exposed from the back surface 32 of the drain coupling portion 11b becomes greater than the area (see FIG. 9) exposed from the back surface 32 of the drain coupling portion 11b of the first embodiment.

The semiconductor device 1 of the present embodiment has the following advantages.

(30) As the width WCD of the drain coupling portion 11b increases, the area of the drain coupling portion 11b exposed from the back surface 32 of the encapsulation resin 30 increases. Thus, the heat of the drain frame 11 and the heat of the transistor 20 are easily dissipated to the outside of the semiconductor device 1 through the drain frame 11. This ensures that the temperature of the semiconductor device 1 does not become excessively high.

(31) The lengths LFD and LFDE of the drain frame fingers 11P and 11Q are decreased. This limits deformation of the drain frame fingers 11P and 11Q in the height direction Z when the transistor 20 is mounted on the drain frame fingers 11P and 11Q.

(32) The two ends 11t of the drain coupling portion 11b have a thickness that is less than the thickness of parts other than the end ilk and the two ends 11t of the drain coupling portion 11b. Further, the two ends 11t are not exposed from the back surface 32 of the encapsulation resin 30. According to such a configuration, the surfaces of the two ends 11t of the drain coupling portion 11b located toward the back surface 32 face and contact the encapsulation resin 30. Thus, the two ends 11t limit movement of the drain coupling portion 11b toward the back surface 32. This further limits projection of the drain coupling portion 11b out of the back surface 32.

(33) The two ends 11t of the drain coupling portion 11b, the flanges 11s of the drain frame finger 11c, and the second tie bar portions 11i, 11j are continuously formed. According to such a configuration, the rigidity of the drain frame finger 11c can be improved. This reduces curving of the drain frame fingers 11c.

Other Embodiments

The description related to each embodiment described above is an illustration of a mode that can be taken by the semiconductor device of the present invention, and is not intended to limit the mode thereof. The semiconductor device of the present invention may adopt a mode in which, for example, a modified example of each embodiment described above and at least two modified examples that do not contradict each other are combined, as described below.

Combination of Embodiments

The heat dissipation plate 130 of the third embodiment may be applied to the semiconductor device 1 of the second embodiment and the fourth embodiment.

The drain frame 11 of the fourth embodiment may be applied to the semiconductor device 1 of the second embodiment.

Lead Frame

In each embodiment described above, the configuration of the lead frame 10 may be changed as described below.

Figure 24:
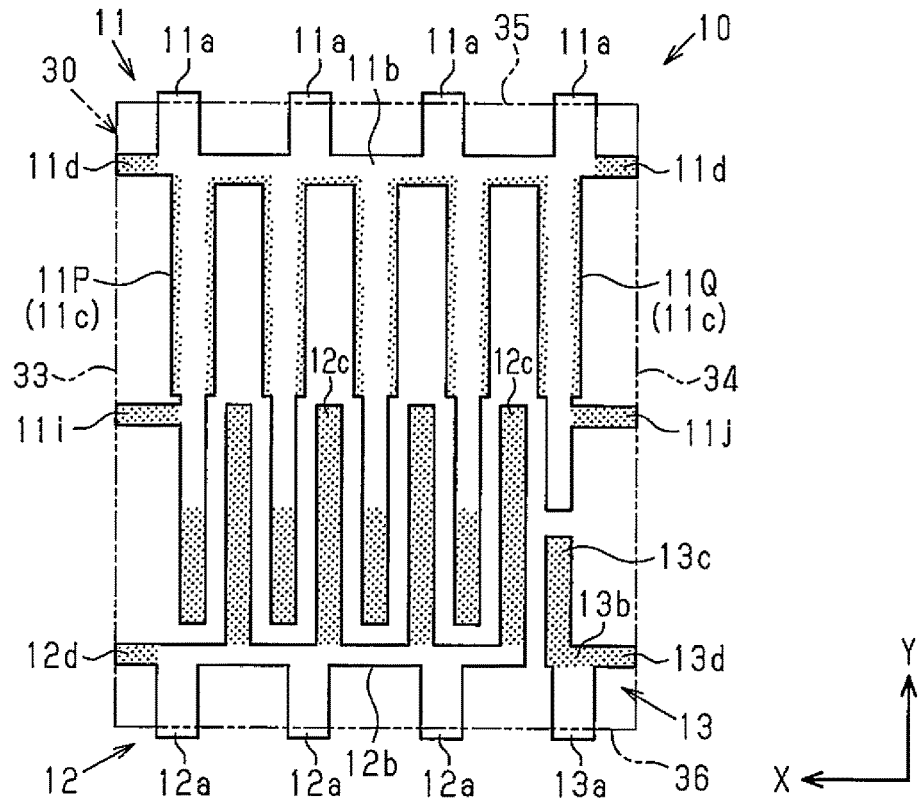
FIG. 24 is a plan view of a lead frame for a modified example of the semiconductor device.
Figure 25:
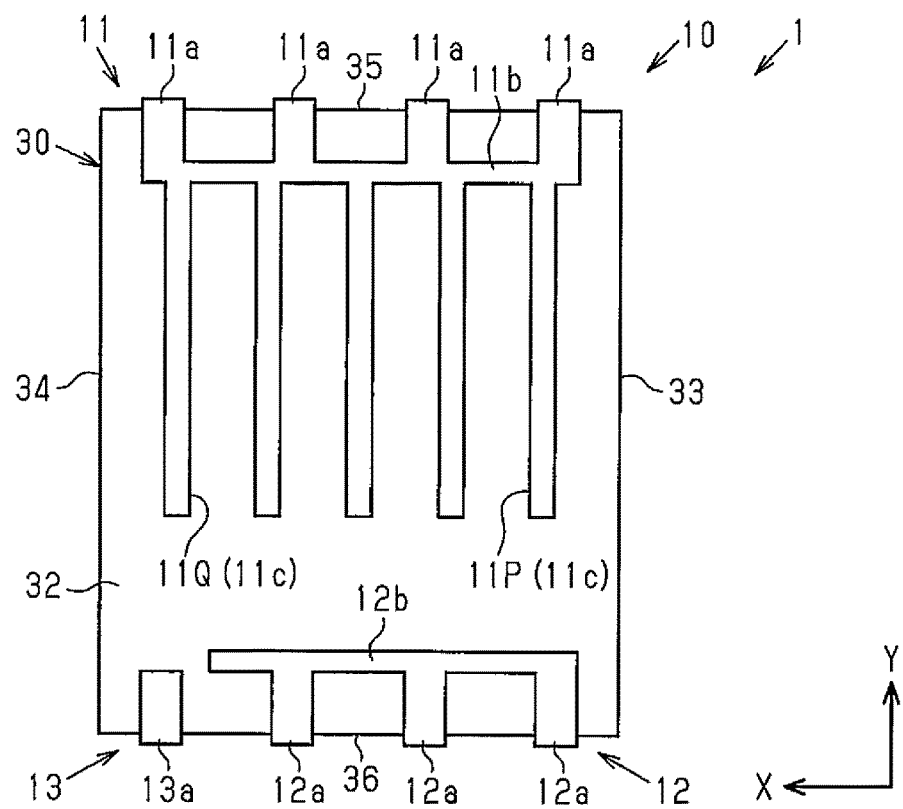
FIG. 25 is a bottom view of the semiconductor device including the lead frame of FIG. 24.

As shown in FIG. 24, the thickness of the source coupling portion 12b of the source frame 12 is equal to the thickness of the source terminal 12a. In other words, the thickness of the source coupling portion 12b is not decreased (shaded region not added). As a result, the source coupling portion 12b is exposed from the back surface 32 of the encapsulation resin 30, as shown in FIG. 25. Thus, the heat of the source frame 12 and the heat of the transistor 20 are easily dissipated to the outside of the semiconductor device 1 through the source frame 12 as the area of the source frame 12 exposed from the back surface 32 of the encapsulation resin 30 increases. This ensures that the temperature of the semiconductor device 1 does not become excessively high.

Figure 26:
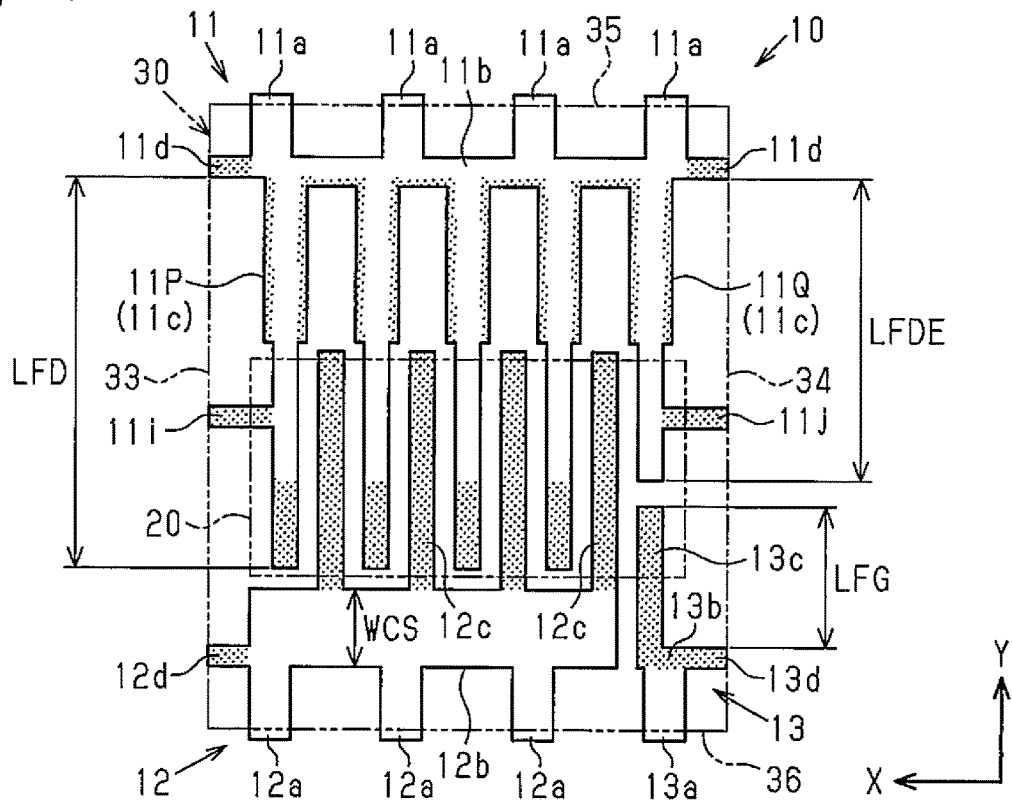
FIG. 26 is a plan view of a lead frame for a modified example of the semiconductor device.

As shown in FIG. 26, the width WCS of the source coupling portion 12b of the source frame 12 is greater than the width WCS (see e.g., FIG. 3) of the source coupling portion 12b of each embodiment. As a result, the lengths LFD and LFDE of the drain frame fingers 11P and 11Q are less than the lengths LFD and LFDE of the drain frame fingers 11P and 11Q in the above embodiments, and the length LFG of the gate frame finger 13c is greater than the length LFG of the gate frame finger 13c in the above embodiments. The transistor 20 is arranged closer to the first longitudinal side surface 35 of the encapsulation resin 30 than the transistor 20 in the above embodiments.

Figure 27:
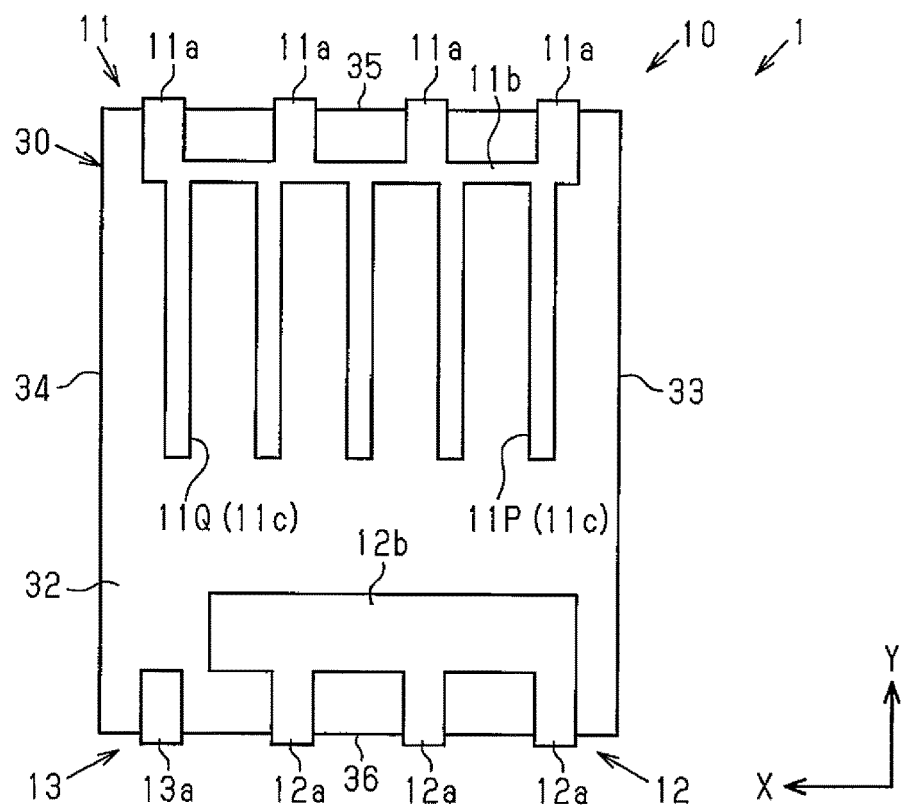
FIG. 27 is a bottom view of the semiconductor device including the lead frame of FIG. 26.

The thickness TS1 of the source coupling portion 12b is equal to the thickness TS2 of the source terminals 12a. In other words, the thickness of the source coupling portion 12b is not reduced (shaded region is not added). As a result, the source coupling portion 12b is exposed from the back surface 32 of the encapsulation resin 30, as shown in FIG. 27. Thus, the heat of the source frame 12 and the heat of the transistor 20 are more easily dissipated to the outside of the semiconductor device 1 through the source frame 12 as the area exposed from the back surface 32 increases in the source frame 12. This further ensures that the temperature of the semiconductor device 1 does not become excessively high. The thickness TS1 of the source coupling portion 12b may be less than the thickness TS2 of the source terminal 12a. Thus, the source coupling portion 12b is not exposed from the back surface 32 of the encapsulation resin 30.

Figure 28:
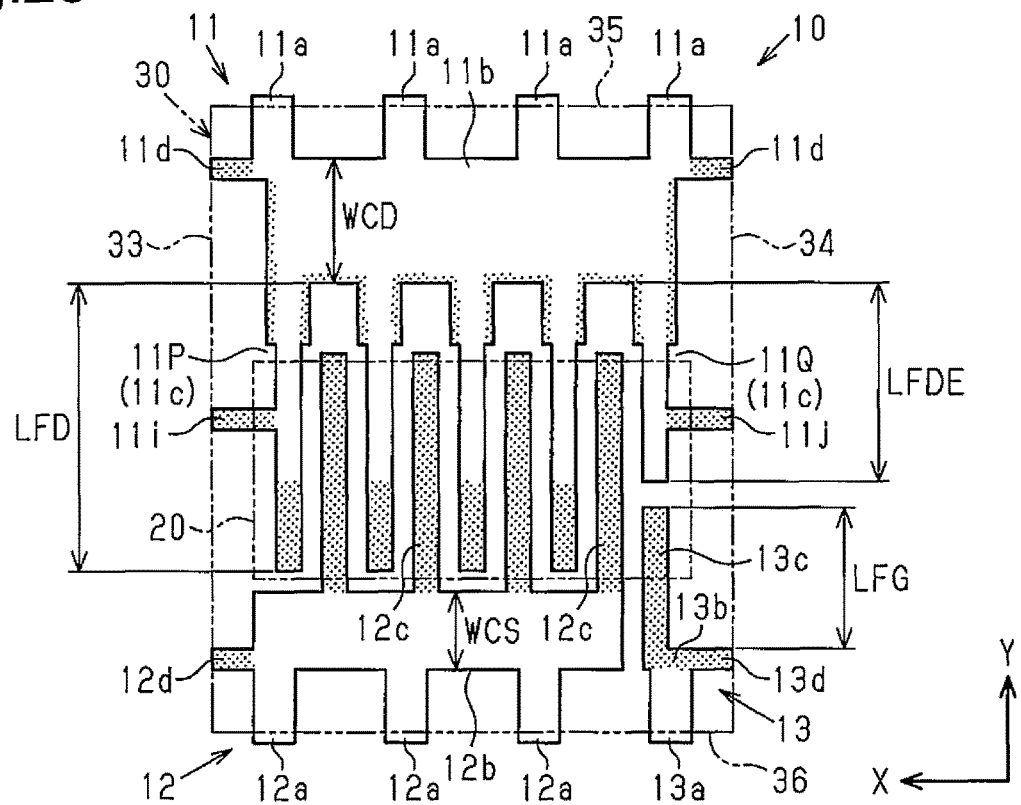
FIG. 28 is a plan view of a lead frame for a modified example of the semiconductor device.

As shown in FIG. 28, the width WCD of the drain coupling portion 11b of the drain frame 11 is greater than the width WCD (see e.g., FIG. 3) of the drain coupling portion 11b of each embodiment, and the width WCS of the source coupling portion 12b of the source frame 12 is greater than the width WCS (see e.g., FIG. 3) of the source coupling portion 12b of each embodiment. As a result, the lengths LFD and LFDE of the drain frame fingers 11P and 11Q are less than the lengths LFD and LFDE (see e.g., FIG. 3) of the drain frame fingers 11P and 11Q in the above embodiments, and the length LFG of the gate frame finger 13c is greater than the length LFG of the gate frame finger 13c in the above embodiments. The transistor 20 is arranged closer to the first longitudinal side surface 35 of the encapsulation resin 30 than the transistor 20 of the above embodiments.

Figure 29:
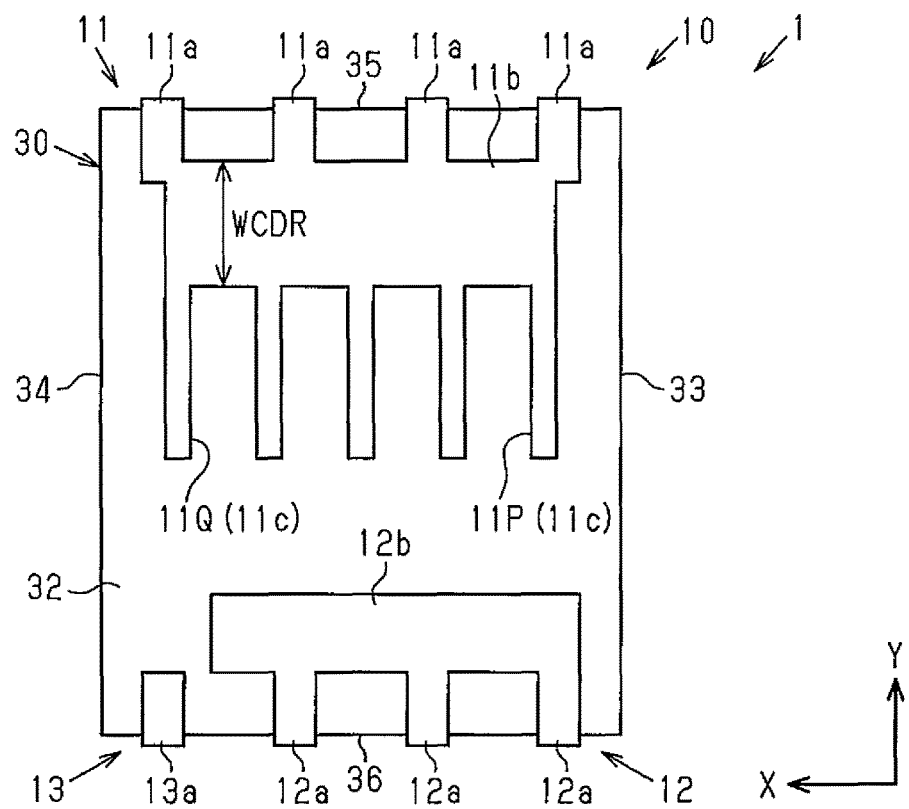
FIG. 29 is a bottom view of the semiconductor device including the lead frame of FIG. 28.

The thickness TS1 of the source coupling portion 12b is equal to the thickness TS2 of the source terminal 12a. In other words, the thickness of the source coupling portion 12b is not reduced (shaded region is not added). As a result, the source coupling portion 12b is exposed from the back surface 32 of the encapsulation resin 30, as shown in FIG. 29. Furthermore, the area in which the drain frame 11 is exposed from the back surface 32 increases as the width WCDR of the drain coupling portion 11b increases. According to such a configuration, the heat of the drain frame 11 and the source frame 12 as well as the heat of the transistor 20 are easily dissipated to the outside of the semiconductor device 1 through the drain frame 11 and the source frame 12. This further ensures that the temperature of the semiconductor device 1 does not become excessively high. The thickness TS1 of the source coupling portion 12b may be less than the thickness TS2 of the source terminal 12a. Thus, the source coupling portion 12b is not exposed from the back surface 32 of the encapsulation resin 30.

Figure 30:
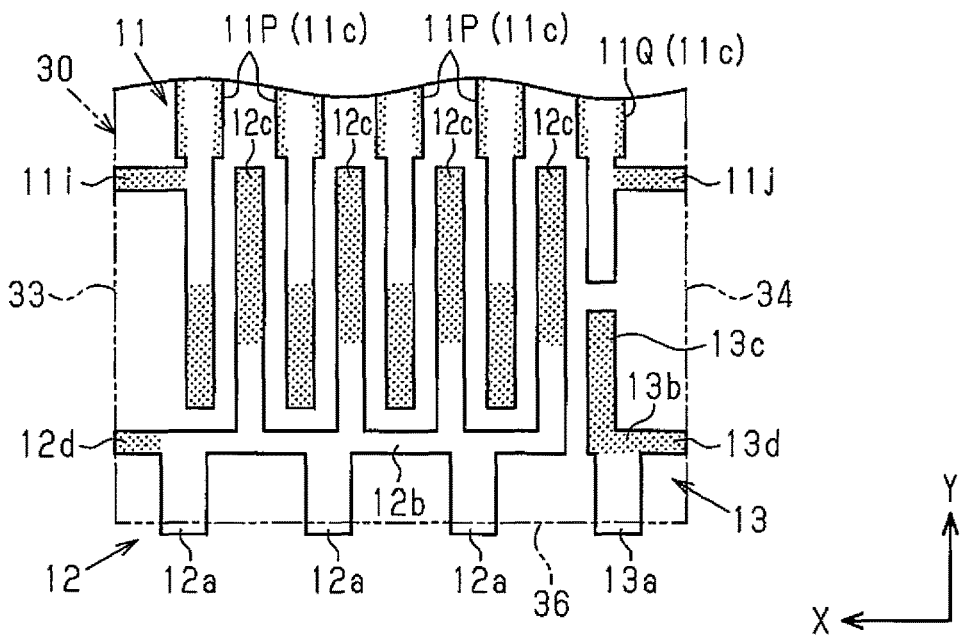
FIG. 30 is a plan view of one portion of a lead frame for a modified example of the semiconductor device.

As shown in FIG. 30, the thickness TS1 of each source frame finger 12c at the end closer to the source coupling portion 12b may be equal to the thickness TS2 of the source terminals 12a. In other words, the thickness of the portion of each source frame finger 12c that overlaps the distal portion 11h of each drain frame fingers 11c in the first direction X may be reduced.

The thickness TD5 of the flanges 11s of the first section 11m in the drain frame finger 11c can be changed. For example, the thickness TD5 of the flanges 11s may be equal to the thickness TD4 of the base 11r. In this case, the flanges 11s are exposed from the back surface 32 of the encapsulation resin 30 together with the base 11r.

At least one drain frame finger 11c may have a configuration in which the flanges 11s are omitted from the first section 11m. In this case, as shown in FIG. 31, the drain frame finger 11c has a uniform thickness WFD2.

Figure 31:
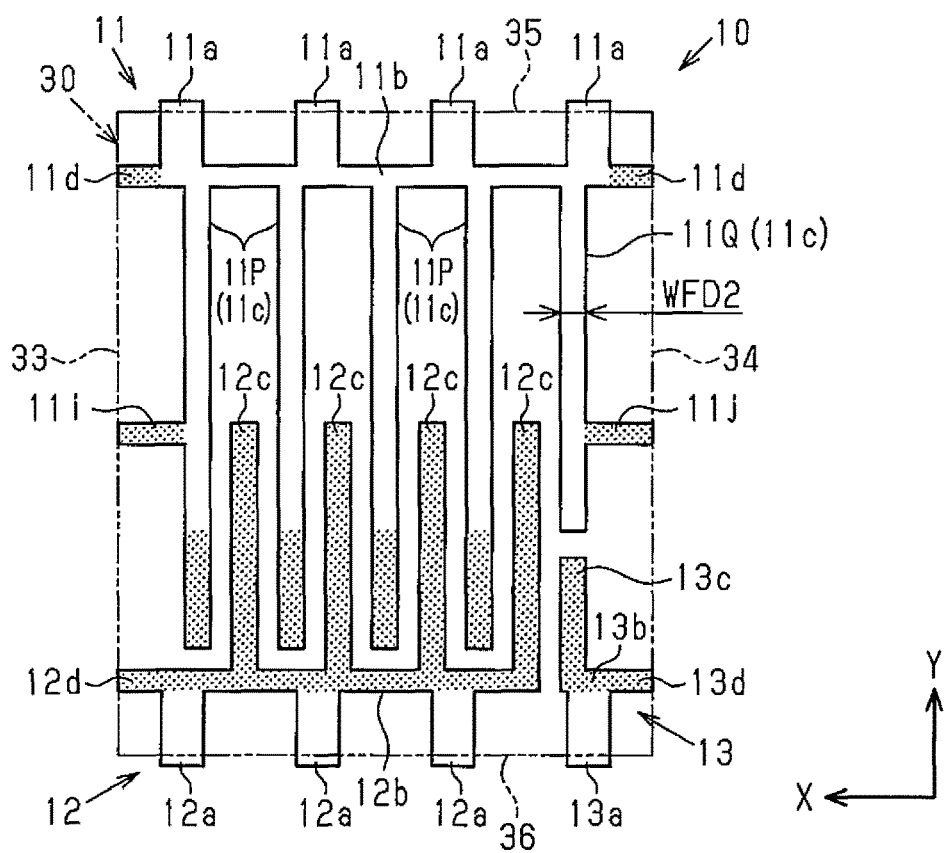
FIG. 31 is a plan view of a lead frame for a modified example of the semiconductor device.

As shown in FIG. 31, the end 11k may be omitted from the drain coupling portion 11b.

At least one of the tie bar portions 11d, 11i, 11j, 12d, and 13d may be exposed from the back surface 32 of the encapsulation resin 30. The width of each of the tie bar portions 11d, 11i, 11j, 12d, and 13d can be set in any manner. For example, the width of each of the tie bar portions 11d, 11i, 11j, 12d, and 13d may be greater than the width WFD1 or the width WFD2 of the drain frame finger 11c.

The second tie bar portions 11i and 11j may be omitted from the drain frame 11.

The entire drain frame finger 11c does not have to be exposed from the back surface 32 of the encapsulation resin 30. In this case, the thickness of the drain frame finger 11c is equal to the thickness TD1.

The entire drain frame finger 11c is not exposed from the back surface 32 of the encapsulation resin 30, and the source frame fingers 12c may be exposed from the back surface 32 of the encapsulation resin 30. In this case, the thickness TS1 of the source frame finger 12c is equal to the thickness TS2.

Transistor

In each embodiment described above, the side wall 54 may be omitted from the transistor 20. In this case, the distance DPgf between the gate electrode 80 and the source field plate 45 can be controlled based on the thickness of the gate insulating film 52.

In each embodiment described above, at least one of the floating plate 46 between the source and the gate or the source field plate 45 between the gate and the drain may be omitted from the transistor 20.

Figure 32:
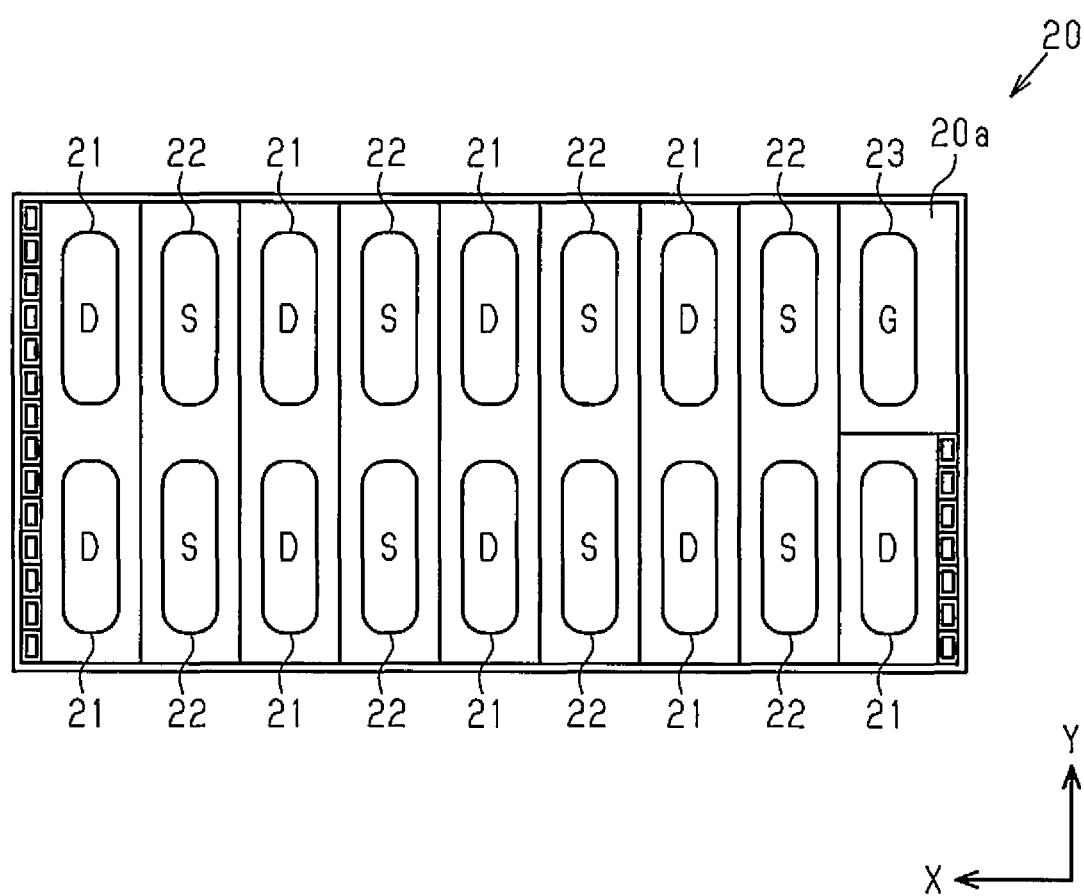
FIG. 32 is a plan view of a transistor for a modified example of the semiconductor device.

In each embodiment described above, the drain electrode pads 21P and the source electrode pads 22 on the front surface 20a of the transistor 20 may be divided into segments in the second direction Y. For example, as shown in FIG. 32, the drain electrode pads 21P and the source electrode pads 22 are each divided into two in the second direction Y. Thus, the drain electrode pads 21, the source electrode pads 22, and the gate electrodes 23 all have the same shape.

Figure 33:
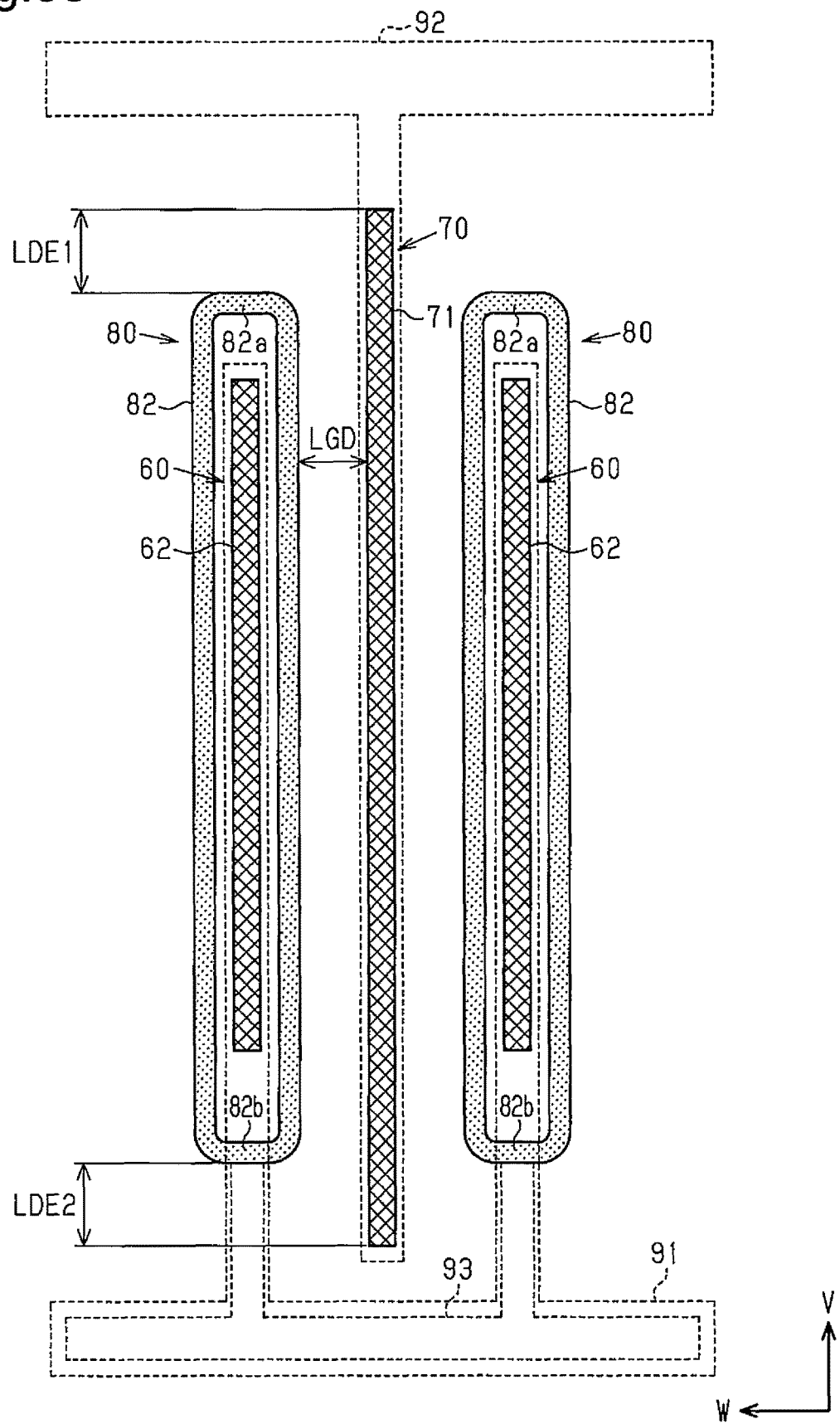
FIG. 33 is a schematic plan view showing a relationship of a drain electrode, a source electrode, and a gate electrode of a transistor for a modified example of the semiconductor device.

In each embodiment described above, the drain electrode finger 71 of the drain electrode 70 may be longer than the source electrode finger 62 of the source electrode 60. In this case, as shown in FIG. 33, one drain electrode finger 71 of the drain electrode 70 may project outward from one end 82a of the gate electrode finger 82 of the gate electrode 80 in the third direction V. Furthermore, the other drain electrode finger 71 of the drain electrode 70 may project outward from the other end 82b of the gate electrode finger 82 of the gate electrode 80 in the third direction V. In FIG. 33, a first projecting distance LDE1 with respect to the one end 82a of the gate electrode finger 82 in the drain electrode finger 71 is the same as a second projecting distance LDE2 with respect to the other end 82b of the gate electrode finger 82 in the drain electrode finger 71. The first projecting distance LDE1 and the second projecting distance LDE2 are, for example, greater than or equal to 3 μm and less than or equal to 45 μm. The first projecting distance LDE1 and the second projecting distance LDE2 may be set in any manner.

In the transistor 20 of each embodiment described above, the first projecting distance LDE1 and the second projecting distance LDE2 may be greater than or equal to a shortest distance LGD between the gate electrode finger 82 of the gate electrode 80 and the drain electrode finger 71 of the drain electrode 70. In the transistor 20 of FIG. 33, the first projecting distance LDE1 and the second projecting distance LDE2 are greater than the shortest distance LGD. For example, a ratio (LDE1/LGD, LDE2/LGD) of the first projecting distance LDE1 (second projecting distance LDE2) and the shortest distance LGD may be greater than or equal to one and less than or equal to five. The shortest distance LGD is, for example, greater than or equal to 3 μm and less than or equal to 15 μm.

According to such a configuration, the electric field intensity is decreased when the drain side of the transistor 20 is inactive. This increases the dielectric breakdown strength of the transistor 20.

In the transistor 20 of each embodiment described above, the source wire 91 may be extended on the source electrode finger 62 along the third direction V and connected to the adjacent source wire 91 on the outer side of the source electrode finger 62, as shown in FIG. 33. In the same manner as the source wire 91, the drain wire 92 may also be extended on the drain electrode finger 71 along the third direction V and connected to the adjacent drain wire 92 on the outer side of the drain electrode finger 71.

Application of Semiconductor Device

The semiconductor device 1 may be applied to a motor drive circuit such as a motor drive circuit of a single phase full wave motor, a motor drive circuit of a three-phase-drive brushless motor, and a motor drive circuit of a stepping motor.

EMBODIMENTS

Technical ideas that can be recognized from the embodiments and modified examples will now be described.

Embodiment A1

The semiconductor device according to claim 1, wherein:
the drain frame, the source frame, and the gate frame are formed through an etching process, and
parts of the drain frame, the source frame, and the gate frame that are not exposed from a back surface of the encapsulation resin is formed through a half-etching process.

Embodiment A2

The semiconductor device according to claim 1, wherein the ones of the drain frame fingers located at two ends in the first direction each include a tie bar portion extending in the second direction.

Embodiment B1

The semiconductor device according to claim 37 or 38, where a distance DPGf between the gate electrode and the conductive layer is less than or equal to 1 μm.

Embodiment B2

The semiconductor device according to claim 37 or 38, wherein a length Lfp of the conductive layer and a distance DPgd between the gate electrode and the drain electrode are in a relationship that satisfies Lfp<⅓DPgd.

Embodiment B3

The semiconductor device according to any one of claims 1 to 30, wherein the transistor includes:
  a nitride semiconductor layer obtained by stacking a buffer layer, an electron travel layer, and an electron supply layer on a substrate;
  a gate electrode finger that includes at least one end and extends along a front surface of the nitride semiconductor layer; and
  a drain electrode finger that includes one end located at a side that is the same as the at least one end of the gate electrode finger and extends along the gate electrode finger, wherein the one end of the drain electrode finger projects outward from the one end of the gate electrode finger.

Embodiment B4 The semiconductor device according to embodiment B3, wherein
  the gate electrode finger and the drain electrode finger each include another end opposite to the one end,
  the drain electrode finger is longer than the gate electrode finger, and
  the other end of the drain electrode finger is projected outward from the other end of the gate electrode finger.

Embodiment B5

The semiconductor device according to embodiment B3 or B4, wherein a projecting distance of the one end of the drain electrode finger is greater than or equal to a shortest distance between the gate electrode finger and the drain electrode finger.

DESCRIPTION OF REFERENCE CHARACTERS 1) semiconductor device, 10) lead frame, 11) drain frame, 11a) drain terminal, 11b) drain coupling portion, 11c) drain frame finger, 11P) drain frame finger, 11Q) drain frame finger, 11d) first tie bar portion, 11e) front surface, 11h) distal portion, 11i and 11j) second tie bar portions, 11k) end, 11m) first section, 11n) second section, 11r) base, 11s) flange, 12) source frame, 12a) source terminal, 12b) source coupling portion, 12c) source frame finger, 12d) tie bar portion, 12e) front surface, 13) gate frame, 13a) gate terminal, 13b) gate coupling portion, 13c) gate frame finger, 13d) tie bar portion, 13e) front surface, 20) transistor, 20a) front surface (other surface), 20b) back surface (one surface), 21) drain electrode pad, 21P) drain electrode pad, 21Q) drain electrode pad, 22) source electrode pad, 23) gate electrode pad, 30) encapsulation resin, 31) front surface, 32) back surface, 40) substrate, 41) buffer layer, 41a) first buffer layer, 41b) second buffer layer, 42) electron travel layer, 43) electron supply layer, 50) insulating layer, 52) gate insulating film, 54) side wall, 60) source electrode, 62) source electrode finger, 70) drain electrode, 71) drain electrode finger, 80) gate electrode, 82) gate electrode finger, 91) source wire, 92) drain wire, 93) gate wire, 130) heat dissipation plate

The invention claimed is:

1. A semiconductor device comprising:
  a plurality of first electrode pads electrically connected to first electrodes of a transistor through a plurality of first electrode contact holes;
  a plurality of second electrode pads electrically connected to second electrodes of the transistor through a plurality of second electrode contact holes;
  a third electrode pad electrically connected to third electrodes of the transistor through a plurality of third electrode contact holes, the third electrodes controlling switching operation between the first electrodes and the second electrodes; and
  a source field plate arranged between each of the first electrodes and each of the third electrodes, wherein
  the plurality of first electrode pads, the plurality of second electrode pads, and the third electrode pad are arranged on one surface of the transistor,
  the plurality of first electrode contact holes are divided into plural groups, the plural groups of the first electrode contact holes being spaced apart from each other in a first direction in a plan view, each group of the first electrode contact holes including a part of the plurality of first electrode contact holes arranged in a second direction that is orthogonal to the first direction in the plan view,
  the plurality of second electrode contact holes are divided into plural groups, the plural groups of the second electrode contact holes being spaced apart from each other in the first direction, each group of the second electrode contact holes including a part of the plurality of second electrode contact holes arranged in the second direction,
  the plurality of first electrode pads and the plurality of second electrode pads are alternately arranged in the first direction,
  a distance between each of the third electrodes and each of the second electrode contact holes is shorter than a distance between each of the third electrodes and each of the first electrode contact holes, and
  the source field plate includes an end portion having an arched shape.

2. The semiconductor device according to claim 1, wherein
  one of the plurality of first electrode pads and the third electrode pad are arranged in the second direction at one end of the transistor in the first direction, or
  one of the plurality of second electrode pads and the third electrode pad are arranged in the second direction at one end of the transistor in the first direction.

3. The semiconductor device according to claim 1, further comprising wires arranged in the transistor, the wires extending along the first direction to intersect with the first electrodes and the second electrodes and electrically connected to the first electrodes or the second electrodes at intersecting portions.

4. The semiconductor device according to claim 1, wherein
  each of the plurality of first electrode pads is electrically connected to the first electrode contact holes arranged in the second direction to form a single first electrode pad that extends in the second direction, and
  each of the plurality of second electrode pads is electrically connected to the second electrode contact holes arranged in the second direction to form a single second electrode pad that extends in the second direction.

5. The semiconductor device according to claim 1, further comprising a semiconductor stacked structure serving as a base, wherein
- a combination of the first electrodes, the second electrodes, and the third electrodes defines an element structure,
- a front surface of the semiconductor stacked structure is divided into an active region that includes the element structure and a non-active region that excludes the active region, and
- the third electrodes are connected to each other at the non-active region.

6. The semiconductor device according to claim 1, wherein the plurality of first electrode pads and the plurality of second electrode pads are each divided into a plurality of parts in the second direction.

7. The semiconductor device according to claim 1, wherein
- the plurality of first electrode pads are arranged in the second direction,
- the plurality of second electrode pads are arranged in the second direction, and
- respective ones of the plurality of first electrode pads and the plurality of second electrode pads are aligned in the first direction.

8. The semiconductor device according to claim 7, wherein the plurality of first electrode pads arranged in the second direction and the plurality of second electrode pads arranged in the second direction are alternately arranged in the first direction.

9. The semiconductor device according to claim 1, wherein
- the transistor is a HEMT that uses a nitride semiconductor, and
- a usage frequency range of the semiconductor device is greater than or equal to 1 MHz.

10. A semiconductor device comprising:
- a plurality of first electrode pads electrically connected to first electrodes of a transistor through a plurality of first electrode contact holes;
- a plurality of second electrode pads electrically connected to second electrodes of the transistor through a plurality of second electrode contact holes;
- a third electrode pad electrically connected to third electrodes of the transistor through a plurality of third electrode contact holes, the third electrodes controlling switching operation between the first electrodes and the second electrodes;
- an encapsulation resin that encapsulates the transistor;
- a first lead frame electrically connected to the first electrode pads, a part of the first lead frame being exposed from the encapsulation resin; and
- a second lead frame electrically connected to the second electrode pads, a part of the second lead frame being exposed from the encapsulation resin, wherein
- the plurality of first electrode pads, the plurality of second electrode pads, and the third electrode pad are arranged on one surface of the transistor,
- the plurality of first electrode contact holes are divided into plural groups, the plural groups of the first electrode contact holes being spaced apart from each other in a first direction in a plan view, each group of the first electrode contact holes including a part of the plurality of first electrode contact holes arranged in a second direction that is orthogonal to the first direction in the plan view,
- the plurality of second electrode contact holes are divided into plural groups, the plural groups of the second electrode contact holes being spaced apart from each other in the first direction, each group of the second electrode contact holes including a part of the plurality of second electrode contact holes arranged in the second direction,
- the plurality of first electrode pads and the plurality of second electrode pads are alternately arranged in the first direction,
- a distance between each of the third electrodes and each of the second electrode contact holes is shorter than a distance between each of the third electrodes and each of the first electrode contact holes,
- the first lead frame includes a plurality of first lead frame fingers,
- the second lead frame includes a plurality of second lead frame fingers,
- the plurality of first lead frame fingers and the plurality of second lead frame fingers are alternately arranged in the first direction,
- the first lead frame and the second lead frame each have comb-shape, and
- a portion of each second lead frame finger overlapped with the first lead frame fingers as viewed in the first direction has a thickness that is less than a maximum thickness of the first lead frame fingers.

11. The semiconductor device according to claim 10, further comprising:
- a first lead frame coupling portion that couples the first lead frame fingers, wherein
- the first lead frame fingers extend in the second direction from the first lead frame coupling portion.

12. The semiconductor device according to claim 10, further comprising:
- a second lead frame coupling portion that couples the second lead frame fingers, wherein
- the second lead frame fingers extend in the second direction from the second lead frame coupling portion.

* * * * *